United States Patent [19]
Yoneda et al.

[11] Patent Number: 5,999,434
[45] Date of Patent: Dec. 7, 1999

[54] HIERARCHICAL ENCODER INCLUDING TIMING AND DATA DETECTION DEVICES FOR A CONTENT ADDRESSABLE MEMORY

[75] Inventors: Masato Yoneda; Hiroshi Sasama; Naoki Kanazawa, all of Tokyo, Japan

[73] Assignee: Kawasaki Steel Corporation, Kobe, Japan

[21] Appl. No.: 08/910,028

[22] Filed: Aug. 12, 1997

Related U.S. Application Data

[60] Continuation-in-part of application No. 08/760,292, Dec. 4, 1996, Pat. No. 5,726,942, which is a division of application No. 08/001,751, Jan. 7, 1993, Pat. No. 5,619,446.

[30]     Foreign Application Priority Data

| Jan. 10, 1992 | [JP] | Japan | .................................... | 4-003405 |
| Feb. 28, 1992 | [JP] | Japan | .................................... | 4-043963 |
| Jun. 26, 1992 | [JP] | Japan | .................................... | 4-169258 |
| Jul. 1, 1992  | [JP] | Japan | .................................... | 4-174314 |
| Jul. 8, 1992  | [JP] | Japan | .................................... | 4-181194 |

[51] Int. Cl.$^6$ .................................................. G11C 15/04
[52] U.S. Cl. ................. 365/49; 365/230.03; 365/189.12; 365/189.05
[58] Field of Search ............................... 365/49, 230.03, 365/189.12, 189.05

[56]            References Cited

U.S. PATENT DOCUMENTS

| 3,846,766 | 11/1974 | Nojima et al.    | ............................ | 365/49 |
| 3,913,075 | 10/1975 | Vitaliev et al.  | ............................ | 365/49 |
| 4,622,653 | 11/1986 | McElroy          | ............................ | 365/49 |
| 4,852,059 |  7/1989 | Oates            | ............................ | 365/49 |
| 4,888,731 | 12/1989 | Chuang et al.    | ............................ | 365/49 |
| 4,890,260 | 12/1989 | Chuang et al.    | ............................ | 365/49 |
| 4,928,260 |  5/1990 | Chuang et al.    | ............................ | 365/49 |
| 4,958,377 |  9/1990 | Takahashi        | ............................ | 382/218 |
| 5,010,516 |  4/1991 | Oates            | ............................ | 365/49 |
| 5,034,919 |  7/1991 | Sasai et al.     | ............................ | 365/49 |
| 5,036,486 |  7/1991 | Noguchi et al.   | ............................ | 365/49 |
| 5,101,376 |  3/1992 | Noguchi et al.   | ............................ | 364/925.6 |
| 5,111,372 |  5/1992 | Kameyama et al.  | ............................ | 363/20 |
| 5,293,592 |  3/1994 | Fu et al.        | ............................ | 395/386 |
| 5,602,770 |  2/1997 | Ohira            | ............................ | 365/49 |

FOREIGN PATENT DOCUMENTS

| 0 341 897 | 11/1989 | European Pat. Off. . |
| 0 515 103 | 11/1992 | European Pat. Off. . |

OTHER PUBLICATIONS

"Design of CMOS VLSI", edited by Tetsuya Iizuka and supervised by Takuo Sugano, Baifukan 1989, pp. 176–177.
Patent Abstracts of Japan, vol. 14, No. 55, Jan. 31, 1990, JP–1280927, Nov. 13, 1989.
Patent Abstracts of Japan, vol. 15, No. 492, Dec. 12, 1991, JP–3212896, Sep. 18, 1991.
G. J. Lipovski, "Dynamic Systolic Associative Memory Chip", IEEE Proceedings on Application Specific Array Processors, CH2920–7/90, Sep. 7, 1990, pp. 481–492.
G. Carlstedt et al., "A Content–Addressable Memory Cell with MNOS Transistors". IEEE Journal of Solid–State Circuits, vol. SC–8, No. 5, Oct. 1973, pp. 338–343.
D. R. Malcolm, Jr., "Fundamentals of Electronics", Chapter 10, pp. 276–277, 1987 PWS Publishers.

*Primary Examiner*—Andrew Q. Tran
*Attorney, Agent, or Firm*—Oliff & Berridge, PLC

[57]            ABSTRACT

An associative memory to which an encoder is applied has a plurality of associative memory subblocks each having a plurality of memory words. A hit flag resulting from match retrieval of retrieval data and the contents of the memory word, and an empty flag indicating whether or not the contents of the memory word are valid as objects for match retrieval are output from each memory word of each associative memory subblock. The address of an invalid memory word is readily controllable since the address of the memory word corresponding to the empty flag can be output as in a case where the address of the memory word corresponding to the hit flag is output. Moreover, since the hit flag and the empty flag are allowed to share a detection line with each other for common use in this encoder, the layout area of the associative memory is reduced and it is possible to build up a high-density associative memory.

20 Claims, 29 Drawing Sheets

FIG. 6
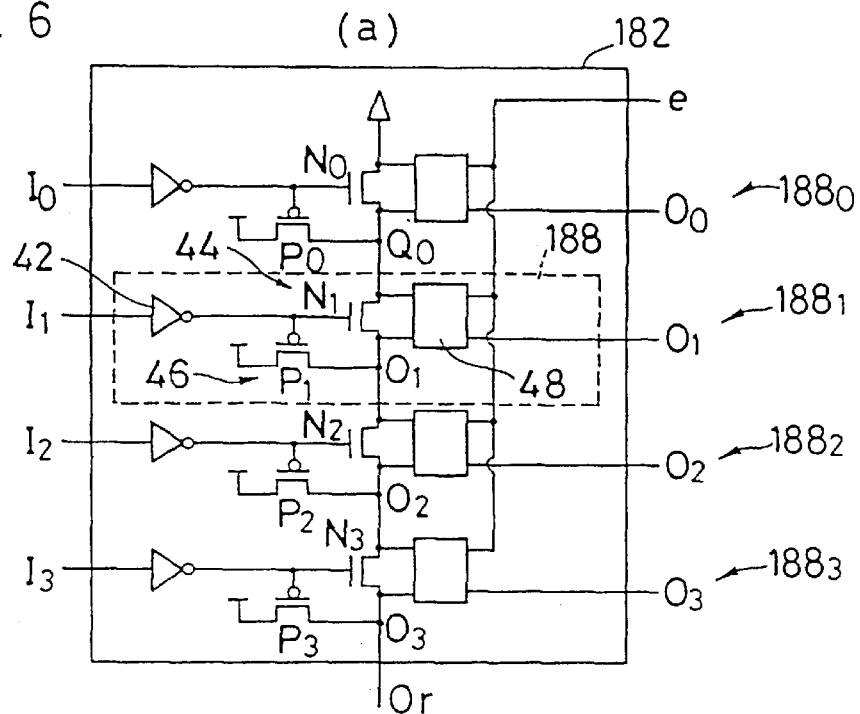
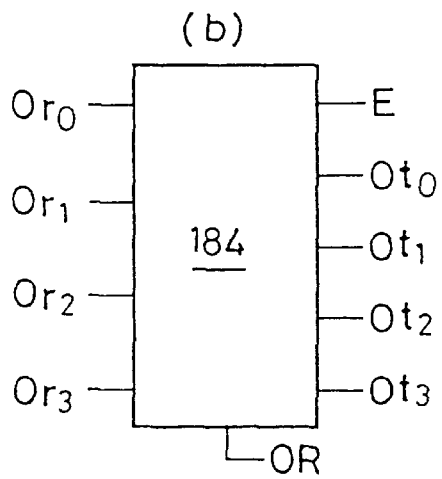
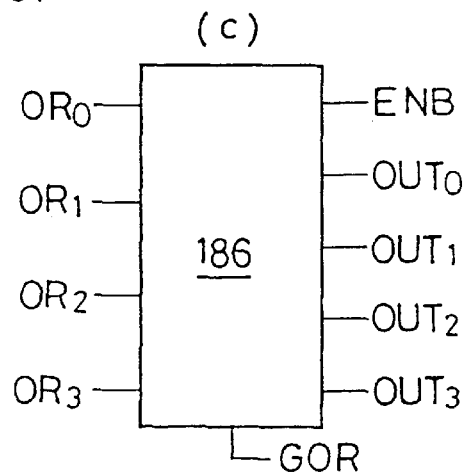
FIG. 7
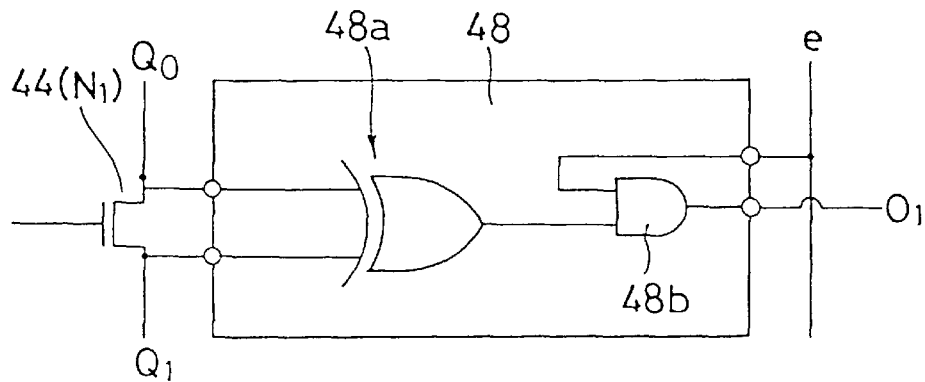

FIG. 14
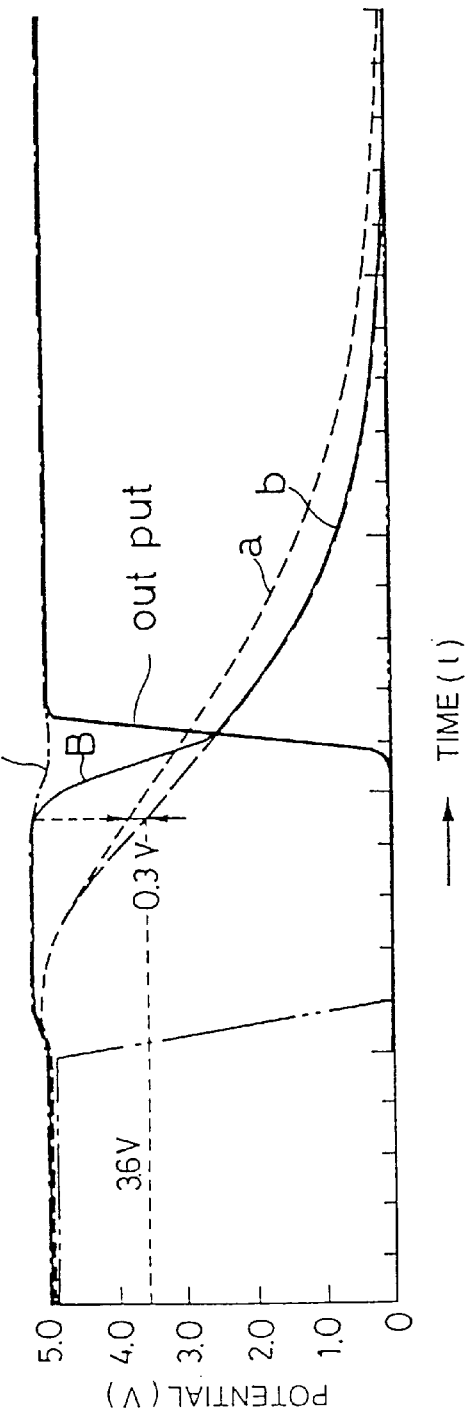 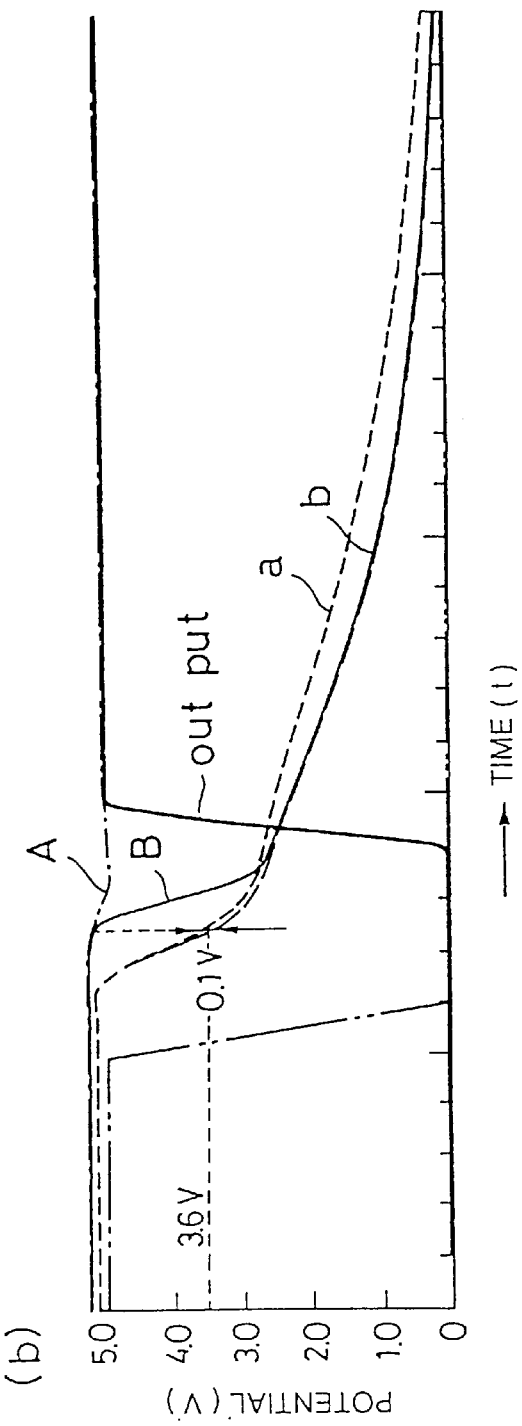

FIG.17
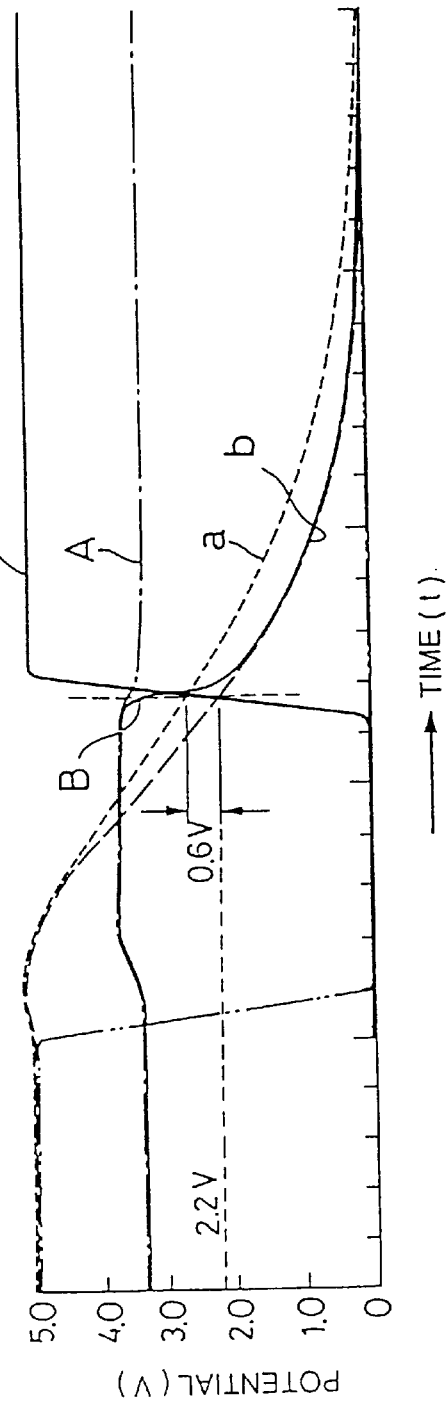
(a)
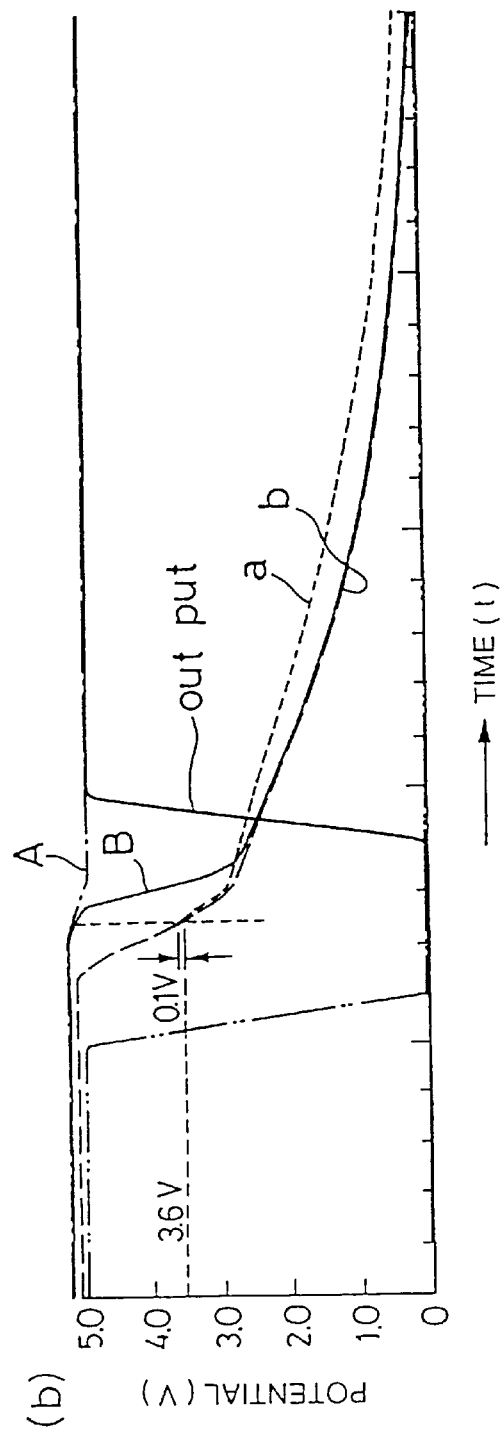
(b)

HIERARCHICAL ENCODER INCLUDING TIMING AND DATA DETECTION DEVICES FOR A CONTENT ADDRESSABLE MEMORY

This is a Continuation-in-Part of application Ser. No. 08/760,292, filed Dec. 4, 1996 now U.S. Pat. No. 5,726,942, which in turn is a Divisional of application Ser. No. 08/001,751 filed on Jan. 7, 1993 which is now U.S. Pat. No. 5,619,446.

BACKGROUND OF THE INVENTION

The present invention relates to a mass storage associative memory, which is divided into a plurality of associative memory subblocks, and an encoder, which is applied to this associative memory, for encoding addresses corresponding to hit flags as a result of match retrieval between retrieval data and the contents of each memory word or otherwise addresses corresponding to empty flags indicative of whether or not the contents of each memory word are valid as objects for match retrieval so that the addresses may efficiently be encoded in the predetermined priority order.

Heretofore, associative memories, that is, fully parallel CAMs (Content Addressable Memories), have been widely known as semiconductor storage devices having the functions of performing the match detection of retrieval data and stored data concurrently in terms of all bits and outputting the match address of stored data or stored data (see "Design of CMOS VLSI," pp 176–177, edited by Tetsuya Iizuka and supervised by Takuo Sugano, Baifukan, 1989).

Content-addressed retrieval, instead of retrieval by means of physical memory addresses, is common to content addressable memories (CAMs). Therefore, the basic function of CAM, unlike an ordinary memory, is to input retrieval data for example so as to output a word address at which data matching the retrieval data has been stored. However, only one word is not necessarily matching and there may be a plurality of them. When the plurality of match words are obtained like this, a correct encode output is unavailable with an ordinary encoder. Consequently, CAM is equipped with a priority encoder for encoding and outputting a plurality of match (hit) signals in the order of predetermined priorities.

In a bulk CAM, however, the number of words is generally very large in contrast to the word length. For this reason, a cell array is divided into a plurality of blocks and it is an important problem how priority encoders are arranged. In other words, the priority encoders will occupy a large area and power consumption will also be on the increase if the priority encoder is provided for every block of CAM. As the number of blocks increases because of the division of the array, the area thus occupied thereby and the power consumption proportionally increase further.

As a result, there has been proposed a content addressable memory in which one main priority encoder is provided for the plurality of blocks and a block priority encoder to be separately provided is used for the block in which encoding is carried out by the main priority encoder.

FIG. 30 shows such a content addressable memory (CAM). As shown in FIG. 30, the content addressable memory 200 is divided into four CAM blocks 202 and each CAM block 202 is further divided into eight CAM subblocks 204. A priority encoder 210 is structurally hierarchical in that there are installed four main priority encoders 212, each being intended for the CAM block 202 having eight of the CAM subblocks 204, and one subblock priority encoder 214 is provided every four CAM blocks 202. As shown in FIG. 31, further, the CAM subblock 204 comprises a CAM subarray 206 having a predetermined number of CAM words with predetermined word length and its control unit including a hit signal register 208 for holding a hit signal resulting from the hitting of retrieval data against a CAM word.

At the time of match retrieval in the CAM block 202, the hit signals of all words in each subblock 204 are held by the hit signal register 208 and a subblock hit signal indicating the presence of a match word in the subblock 204 is simultaneously generated by an OR circuit (not shown) of the control unit in each CAM subblock 204. On receiving the signal, the subblock priority encoder 214 subsequently generates a subblock selection signal indicating the highest priority CAM subblock 204 and the subblock priority encoder 214 also generates an encoded subblock address.

On receiving the block selection signal, a switch circuit (not shown) of the subblock thus selected is then activated to transfer the data (hit signal) held in the hit signal register 208 to the main priority encoder 212 as an output signal. Thereafter, the main priority encoder 212 generates a hit memory word address resulting from the hit signal thus transferred and encoded in the order of predetermined priorities in the CAM subblock 204. The priority encoder 210 combines the hit memory word address and the aforementioned subblock address and outputs the encoding logical address of the hit memory word of the CAM 200.

In the conventional CAM 200 shown in FIGS. 30 and 31, the priority encoder (encoder) 210 comprises the main priority encoder (priority encoder) 212 for controlling the plurality of CAM subblocks 204 and the subblock priority encoder 214 for assigning priority to the CAM subblocks 204 for performing the encoding operation. The order of priorities is first determined among the plurality of the subblocks 204 and before being encoded, the output signal of the first priority subblock 204 is applied to the main priority encoder 212. The encoder can thus be made relatively small in configuration, whereas the circuit area relative to the whole circuit scale of the CAM 200 is reduced, whereby large scale integration is made feasible.

Notwithstanding, subblock-to-subblock switch time becomes necessary until the encoding of the output signal (hit signal data (hereinafter called "flag data")) from the second priority CAM subblock 204 is started after the output signal (flag data) from the first priority subblock 204 is encoded by the main priority encoder 212 and output. In other words, it takes time to transfer the flag data from the hit signal register 208 of the second priority subblock 204 after an encoded address is output from the main priority encoder 212 and there still exists a problem arising from low encoding efficiency.

In an apparatus using an associative memory, on the other hand, the operation of updating the contents of a memory word is frequently performed by, for example, holding the contents of a plurality of memory words matching with retrieval data as a result of match retrieval and sequentially writing new data to the memory words that have been erased after the content of a memory word mismatching with retrieval data are erased in order to improve the use efficiency of each memory word of the associative memory.

In an apparatus such as a switching hub in which a plurality of computers are connected so as to build up an integrated network environment, for example, an associative memory is used to obtain additional data such as a port number corresponding to a MAC address existing in the header portion of packet data, based on which the packet data transferred from the source computer is output from a port corresponding to the port number obtained, whereby the additional data is properly transferred to a destination computer.

When a port for use in connecting a certain computer is changed from a port 1 to a port 3 in that case, unless the port number which is stored in the additional data of the memory word in which the data of a MAC address corresponding to this computer is stored, is updated from the port 1 to the port 3, packet data to be transferred to this computer is output from the port 1 to which this computer has been connected previously instead of the port 3 to which this computer is actually connected now. In order to prevent this trouble, the port number to which each computer has been connected should be updated thereon at all times.

Moreover, the number of memory words in an associative memory is generally smaller than the total number of computers on a network and only information of specific computers is selectively stored in each of the memory words. In order to improve the use efficiency of an associative memory, for example, time stamp information for managing an operating duration is stored in the additional data and the time stamp information is always updated, so that only the frequently-used computer information is registered in the memory word. Therefore, time stamp information on each memory word should be updated thereon at all times.

Thus, the operation of updating the contents of each memory word in an associative memory is frequently performed in an apparatus using an associative memory.

It is necessary to manage the address of the memory word whose contents have been erased so as to update the contents of each memory word in such an associative memory. However, the address of the memory word whose contents have been erased can't be managed in a conventional associative memory of the sort described above because the address of a memory word whose contents are to be erased occurs at random; the problem is that the address of the memory word whose contents have been erased has to be managed by something outside the associative memory, for example.

BRIEF SUMMARY OF THE INVENTION

An object of the present invention made to solve the forgoing technical problems in the prior art is to provide an encoder which is applicable to a mass storage associative memory which is required to process large capacity data at high speed and comprises a plurality of associative memory subblocks, and is also capable of not only managing an invalid memory word whose contents have been erased but also efficiently encoding its address.

Another object of the present invention in addition to the object above is to provide an encoder capable of efficiently and continuously encoding output signals from a number of associative memory subblocks in a predetermined cycle without time delay (waiting time) at the time of subblock-to-subblock switching of an associative memory.

In order to accomplish the object by the present invention, there is provided the first aspect of an associative memory having a plurality of associative memory subblocks, wherein each of the associative memory subblock comprises a plurality of memory words, a first register which is used for holding a hit flag as a result of match retrieval of retrieval data and contents of the corresponding memory word, one-to-one corresponding to each memory word, and a second register for holding an empty flag indicating whether or not the contents of the corresponding memory word are effective as objects for match retrieval, one-to-one corresponding to each memory word.

Also by the present invention, there is provided the first aspect of an encoder which is applied to the first aspect of the associative memory, comprising: a subpriority encoder for determining the priority order of the associative memory subblock corresponding to a subblock hit signal as the logical OR of the whole hit flag in each associative memory subblock or a subblock empty signal as the logical OR of the whole empty flag in each associative memory subblock; a selection circuit for selecting the associative memory subblock corresponding to the subblock hit signal or the subblock empty signal according to the priority order determined by the subpriority encoder; a switching circuit for supplying the hit flag or the empty flag that are output from the associative memory subblock selected by the selection circuit to a corresponding detection line; a sense circuit for detecting the hit flag or the empty flag supplied to the corresponding detection line; and a main priority encoder for sequentially encoding the address of the memory word corresponding to the hit flag or the empty flag detected by the sense circuit according to the priority order.

Also by the present invention, there is provided the second aspect of an associative memory, in the first aspect of the associative memory, further comprising a detection line which is provided for the same corresponding memory word in the corresponding associative memory subblock, wherein either the hit flag or the empty flag corresponding to the memory word is commonly supplied to the detection line; and a switching circuit for supplying either the hit flag or the empty flag to the corresponding each detection line.

Preferably, in the first aspect of the encoder, the main priority encoder comprising: a flag register circuit for holding the corresponding hit flag or empty flag that has been detected by the sense circuit; a main priority circuit for making active only one corresponding hit flag or empty flag according to the priority order out of the hit flags or empty flags held in the flag register circuit and sequentially outputting a corresponding active-state hit flag or empty flag; a main encoding circuit for sequentially encoding the address of the memory word corresponding to the active-state hit flag or empty flag sequentially output from the main priority circuit; reset means for sequentially resetting the hit flag or the empty flag that has been encoded in the flag register circuit after the encoding of the address of the memory word corresponding to the hit flag or the empty flag held in the flag register circuit is terminated; and termination detecting means for detecting the complete termination of the encoding of the address of the memory word corresponding to the hit flag or the empty flag held in the flag register circuit.

Preferably, in the first aspect of the encoder, the main priority encoder comprising: a flag register circuit for holding the corresponding hit flag or empty flag that has been detected by the sense circuit; a main priority circuit for making active only one corresponding hit flag or empty flag according to the priority order out of the hit flags or empty flags held in the flag register circuit and sequentially outputting a corresponding active-state hit flag or empty flag; a main encoding circuit for sequentially encoding the address of the memory word corresponding to the active-state hit flag or empty flag sequentially output from the main priority circuit; a nullifying bit flag circuit for indicating whether or not the encoding of the address of the memory word corresponding to the hit flag or the empty flag held in the flag register is terminated; and termination detecting means for detecting the complete termination of the encoding of the address of the memory word corresponding to the hit flag or the empty flag held in the flag register circuit.

Preferably, in the first aspect of the encoder, the main priority encoder comprising: a flag register circuit for holding the corresponding hit flag or empty flag that has been detected by the sense circuit; a main priority circuit for making active only one corresponding hit flag or empty flag according to the priority order out of the hit flags or empty flags held in the flag register circuit and sequentially outputting a corresponding active-state hit flag or empty flag; a main encoding circuit for sequentially encoding the address of the memory word corresponding to the active-state hit flag or empty flag sequentially output from the main priority circuit; reset means for sequentially resetting the hit flag or the empty flag that has been encoded in the flag register circuit after the encoding of the address of the memory word corresponding to the hit flag or the empty flag held in the flag register circuit is terminated; and timing control means for detecting the timing of totally terminating the encoding of the address of the memory word corresponding to the hit flag or the empty flag held in the flag register circuit beforehand and making the flag register circuit hold the hit flag or the empty flag of the next priority order which is detected by the sense circuit.

Preferably, in the first aspect of the encoder, the main priority encoder comprising: a flag register circuit for holding the corresponding hit flag or empty flag that has been detected by the sense circuit; a main priority circuit for making active only one corresponding hit flag or empty flag according to the priority order out of the hit flags or empty flags held in the flag register circuit and sequentially outputting a corresponding active-state hit flag or empty flag; a main encoding circuit for sequentially encoding the address of the memory word corresponding to the active-state hit flag or empty flag sequentially output from the main priority circuit; a nullifying bit flag circuit for indicating whether or not the encoding of the address of the memory word corresponding to the hit flag or the empty flag held in the flag register is terminated; and timing control means for detecting the timing of totally terminating the encoding of the address of the memory word corresponding to the hit flag or the empty flag held in the flag register circuit beforehand and making the flag register circuit hold the hit flag or the empty flag of the next priority order which is detected by the sense circuit.

Preferably, in the first aspect of the encoder, the main priority encoder further comprising: a main encoder for encoding the address of the memory word corresponding to only one active-state hit flag out of the hit flags detected by the sense circuit; a main priority encoder for sequentially encoding the address of the memory word corresponding to the empty flag detected by the sense circuit according to the priority order; wherein the main encoder comprising: a flag register circuit for holding the corresponding hit flag detected by the sense circuit; and a main encoding circuit for encoding the address of the memory word corresponding to only one active-state hit flag that is output from the flag register circuit.

Also by the present invention, there is provided the second aspect of an encoder which is applied to the first aspect of the associative memory, comprising: a subpriority encoder for determining the priority order of the associative memory subblock corresponding to a subblock hit signal as the logical OR of the whole hit flag in each associative memory subblock or a subblock empty signal as the logical OR of the whole empty flag in each associative memory subblock; a selection circuit for selecting the associative memory subblock corresponding to the subblock hit signal or the subblock empty signal according to the priority order determined by the subpriority encoder; a switching circuit for supplying the hit flag or the empty flag that are output from the associative memory subblock selected by the selection circuit to a corresponding detection line; and a main priority encoder for sequentially encoding the address of the memory word corresponding to the hit flag or the empty flag supplied onto the detection line according to the priority order.

Preferably, in the second aspect of the encoder, the main priority encoder further comprising: a prefetch circuit for holding the hit flag or the empty flag supplied onto the detection line in the next priority order beforehand while encoding the address of the memory word corresponding to the hit flag or the empty flag in the preceding priority order; a flag register circuit for holding the corresponding hit flag or empty flag in the preceding priority order held in the prefetch circuit; a main priority circuit for making active only one corresponding hit flag or empty flag according to the priority order out of the hit flags or empty flags held in the flag register circuit and sequentially outputting a corresponding active-state hit flag or empty flag; a main encoding circuit for sequentially encoding the address of the memory word corresponding to the active-state hit flag or empty flag sequentially output from the main priority circuit; reset means for sequentially resetting the hit flag or the empty flag that has been encoded in the flag register circuit after the encoding of the address of the memory word corresponding to the hit flag or the empty flag held in the flag register circuit is terminated; and termination detecting means for detecting the complete termination of the encoding of the address of the memory word corresponding to the hit flag or the empty flag held in the flag register circuit.

Preferably, in the second aspect of the encoder, the main priority encoder further comprising: a prefetch circuit for holding the hit flag or the empty flag supplied onto the detection line in the next priority order beforehand while encoding the address of the memory word corresponding to the hit flag or the empty flag in the preceding priority order; a flag register circuit for holding the corresponding hit flag or empty flag in the preceding priority order held in the prefetch circuit; a main priority circuit for making active only one corresponding hit flag or empty flag according to the priority order out of the hit flags or empty flags held in the flag register circuit and sequentially outputting a corresponding active-state hit flag or empty flag; a main encoding circuit for sequentially encoding the address of the memory word corresponding to the active-state hit flag or empty flag sequentially output from the main priority circuit; a nullifying bit flag circuit for indicating whether or not the encoding of the address of the memory word corresponding to the hit or the empty flag held in the flag register is terminated; and termination detecting means for detecting the complete termination of the encoding of the address of the memory word corresponding to the hit flag or the empty flag held in the flag register circuit.

Preferably, in the second aspect of the encoder, the main priority encoder further comprising: a prefetch circuit for holding the hit flag or the empty flag supplied onto the detection line in the next priority order beforehand while encoding the address of the memory word corresponding to the hit flag or the empty flag in the preceding priority order; a flag register circuit for holding the corresponding hit flag or empty flag in the preceding priority order held in the prefetch circuit; a main priority circuit for making active only one corresponding hit flag or empty flag according to the priority order out of the hit flags or empty flags held in the flag register circuit and sequentially outputting a corresponding active-state hit flag or empty flag; a main encoding circuit for sequentially encoding the address of the memory word corresponding to the active-state hit flag or empty flag sequentially output from the main priority circuit; reset means for sequentially resetting the hit flag or the empty flag that has been encoded in the flag register circuit after the encoding of the address of the memory word corresponding to the hit flag or the empty flag held in the flag register circuit is terminated; and timing control means for detecting the timing of totally terminating the encoding of the address of the memory word corresponding to the hit flag or the empty flag held in the flag register circuit beforehand and making the flag register circuit hold the hit flag or the empty flag of the next priority order which is pre-held in the prefetch circuit.

Preferably, in the second aspect of the encoder, the main priority encoder further comprising: a prefetch circuit for holding the hit flag or the empty flag supplied onto the detection line in the next priority order beforehand while encoding the address of the memory word corresponding to the hit flag or the empty flag in the preceding priority order; a flag register circuit for holding the corresponding hit flag or empty flag in the preceding priority order held in the prefetch circuit; a main priority circuit for making active only one corresponding hit flag or empty flag according to the priority order out of the hit flags or empty flags held in the flag register circuit and sequentially outputting a corresponding active-state hit flag or empty flag; a main encoding circuit for sequentially encoding the address of the memory word corresponding to the active-state hit flag or empty flag sequentially output from the main priority circuit; a nullifying bit flag circuit for indicating whether or not the encoding of the address of the memory word corresponding to the hit or the empty flag held in the flag register is terminated; and timing control means for detecting the timing of totally terminating the encoding of the address of the memory word corresponding to the hit flag or the empty flag held in the flag register circuit beforehand and making the flag register circuit hold the hit flag or the empty flag of the next priority order which is pre-held in the prefetch circuit.

Preferably, in the second aspect of the encoder, the main priority encoder further comprising: a main encoder for encoding the address of the memory word corresponding to only one active-state hit flag out of the hit flags supplied onto the detection line; a main priority encoder for sequentially encoding the address of the memory word corresponding to the empty flag supplied onto the detection line according to the priority order; wherein the main encoder comprising: a flag register circuit for holding the corresponding hit flag supplied onto the detection line; and a main encoding circuit for encoding the address of the memory word corresponding to only one active-state hit flag that is output from the flag register circuit.

Preferably, in the first and second aspect of the encoder, the hit flag and the empty flag share the detection line with each other for common use.

Preferably, in the first and second aspect of the encoder, the main priority encoder further comprising: a selection circuit for selectively supplying either the hit flag held in the flag register circuit or the hit flag that is output from the main priority circuit to the main encoding circuit, wherein the hit flag is directly input from the flag register circuit to the main encoding circuit not via the main priority circuit and encoded therein; and the empty flag is input from the flag register circuit via the main priority circuit to the main encoding circuit and encoded therein.

Preferably, in the above encoder, the main priority encoder further comprising: selection means for determining the encoding of the hit flag by directly inputting the hit flag from the flag register circuit not via the main priority circuit to the main encoding circuit or the encoding of the hit flag by inputting the hit flag from the flag register circuit via the main priority circuit to the main encoding circuit.

Preferably, in the first and second aspect of the encoder, the subpriority encoder comprising: a data latch circuit for holding the subblock hit signal or the subblock empty signal that is output from the corresponding associative memory subblock; a subpriority circuit for making only one subblock hit signal or subblock empty signal active according to the priority order out of the corresponding subblock hit signal or subblock empty signal held in the data latch circuit and outputting a active-state subblock hit signal or a subblock empty signal; and a subencoding circuit for sequentially encoding the address of the associative memory subblock corresponding to the active-state subblock hit signal or subblock empty signal sequentially output from the subpriority circuit.

Preferably, in the first and second aspect of the encoder, the subpriority encoder comprising a data latch circuit for holding only one active-state subblock hit signal that is output from the corresponding associative memory subblock and a subencoding circuit for encoding the address of the associative memory subblock corresponding to only one active-state subblock hit signal that is output from the data latch circuit.

Also by the present invention, there is provided the third aspect of an associative memory having a plurality of associative memory subblocks, wherein each of the associative memory subblock comprises a plurality of memory words, and a register for holding an empty flag indicating whether or not the contents of the corresponding memory word are effective as objects for match retrieval, one-to-one corresponding to each memory word.

Also by the present invention, there is provided the third aspect of an encoder which is applied to the third aspect of the associative memory, comprising: a subpriority encoder for determining the priority order of the associative memory subblock corresponding to a subblock empty signal as the logical OR of the whole empty flag in each associative memory subblock; a selection circuit for selecting the associative memory subblock corresponding to the subblock empty signal according to the priority order determined by the subpriority encoder; a switching circuit for supplying the empty flag that are output from the associative memory subblock selected by the selection circuit to a corresponding detection line; a sense circuit for detecting the empty flag supplied to the corresponding detection line; and a main priority encoder for sequentially encoding the address of the memory word corresponding to the empty flag detected by the sense circuit according to the priority order.

Preferably, in the third aspect of the encoder, the main priority encoder comprising: a flag register circuit for holding the corresponding empty flag that has been detected by the sense circuit; a main priority circuit for making active only one corresponding empty flag according to the priority order out of the empty flags held in the flag register circuit and sequentially outputting a corresponding active-state empty flag; a main encoding circuit for sequentially encoding the address of the memory word corresponding to the active-state empty flag sequentially output from the main priority circuit; reset means for sequentially resetting the empty flag that has been encoded in the flag register circuit after the encoding of the address of the memory word corresponding to the empty flag held in the flag register circuit is terminated; and termination detecting means for detecting the complete termination of the encoding of the address of the memory word corresponding to the empty flag held in the flag register circuit.

Preferably, in the third aspect of the encoder, the main priority encoder comprising: a flag register circuit for holding the corresponding empty flag that has been detected by the sense circuit; a main priority circuit for making active only one corresponding empty flag according to the priority order out of the empty flags held in the flag register circuit and sequentially outputting a corresponding active-state empty flag; a main encoding circuit for sequentially encoding the address of the memory word corresponding to the active-state empty flag sequentially output from the main priority circuit; a nullifying bit flag circuit for indicating whether or not the encoding of the address of the memory word corresponding to the empty flag held in the flag register is terminated; and termination detecting means for detecting the complete termination of the encoding of the address of the memory word corresponding to the empty flag held in the flag register circuit.

Preferably, in the third aspect of the encoder, the main priority encoder comprising: a flag register circuit for holding the corresponding empty flag that has been detected by the sense circuit; a main priority circuit for making active only one corresponding empty flag according to the priority order out of the empty flags held in the flag register circuit and sequentially outputting a corresponding active-state empty flag; a main encoding circuit for sequentially encoding the address of the memory word corresponding to the active-state empty flag sequentially output from the main priority circuit; reset means for sequentially resetting the empty flag that has been encoded in the flag register circuit after the encoding of the address of the memory word corresponding to the empty flag held in the flag register circuit is terminated; and timing control means for detecting the timing of totally terminating the encoding of the address of the memory word corresponding to the empty flag held in the flag register circuit beforehand and making the flag register circuit hold the empty flag of the next priority order which is detected by the sense circuit.

Preferably, in the third aspect of the encoder, the main priority encoder comprising: a flag register circuit for holding the corresponding empty flag that has been detected by the sense circuit; a main priority circuit for making active only one corresponding empty flag according to the priority order out of the empty flags held in the flag register circuit and sequentially outputting a corresponding active-state empty flag; a main encoding circuit for sequentially encoding the address of the memory word corresponding to the active-state empty flag sequentially output from the main priority circuit; a nullifying bit flag circuit for indicating whether or not the encoding of the address of the memory word corresponding to the empty flag held in the flag register is terminated; and timing control means for detecting the timing of totally terminating the encoding of the address of the memory word corresponding to the empty flag held in the flag register circuit beforehand and making the flag register circuit hold the empty flag of the next priority order which is detected by the sense circuit.

Also by the present invention, there is provided the fourth aspect of an encoder which is applied to the associative memory as claimed in claim 25, comprising: a subpriority encoder for determining the priority order of the associative memory subblock corresponding to a subblock empty signal as the logical OR of the whole empty flag in each associative memory subblock; a selection circuit for selecting the associative memory subblock corresponding to the subblock empty signal according to the priority order determined by the subpriority encoder; a switching circuit for supplying the empty flag that are output from the associative memory subblock selected by the selection circuit to a corresponding detection line; and a main priority encoder for sequentially encoding the address of the memory word corresponding to the empty flag supplied onto the detection line according to the priority order.

Preferably, in the fourth aspect of the encoder, the main priority encoder further comprising: a prefetch circuit for holding the empty flag supplied onto the detection line in the next priority order beforehand while encoding the address of the memory word corresponding to the empty flag in the preceding priority order; a flag register circuit for holding the corresponding empty flag in the preceding priority order held in the prefetch circuit; a main priority circuit for making active only one corresponding empty flag according to the priority order out of the empty flags held in the flag register circuit and sequentially outputting a corresponding active-state empty flag; a main encoding circuit for sequentially encoding the address of the memory word corresponding to the active-state empty flag sequentially output from the main priority circuit; reset means for sequentially resetting the empty flag that has been encoded in the flag register circuit after the encoding of the address of the memory word corresponding to the empty flag held in the flag register circuit is terminated; and termination detecting means for detecting the complete termination of the encoding of the address of the memory word corresponding to the empty flag held in the flag register circuit.

Preferably, in the fourth aspect of the encoder, the main priority encoder further comprising: a prefetch circuit for holding the empty flag supplied onto the detection line in the next priority order beforehand while encoding the address of the memory word corresponding to the empty flag in the preceding priority order; a flag register circuit for holding the corresponding empty flag in the preceding priority order held in the prefetch circuit; a main priority circuit for making active only one corresponding empty flag according to the priority order out of the empty flags held in the flag register circuit and sequentially outputting a corresponding active-state empty flag; a main encoding circuit for sequentially encoding the address of the memory word corresponding to the active-state empty flag sequentially output from the main priority circuit; a nullifying bit flag circuit for indicating whether or not the encoding of the address of the memory word corresponding to the empty flag held in the flag register is terminated; and termination detecting means for detecting the complete termination of the encoding of the address of the memory word corresponding to the empty flag held in the flag register circuit.

Preferably, in the fourth aspect of the encoder, the main priority encoder further comprising: a prefetch circuit for holding the empty flag supplied onto the detection line in the next priority order beforehand while encoding the address of the memory word corresponding to the empty flag in the preceding priority order; a flag register circuit for holding the corresponding empty flag in the preceding priority order held in the prefetch circuit; a main priority circuit for making active only one corresponding empty flag according to the priority order out of the empty flags held in the flag register circuit and sequentially outputting a corresponding active-state empty flag; a main encoding circuit for sequentially encoding the address of the memory word corresponding to the active-state empty flag sequentially output from the main priority circuit; reset means for sequentially resetting the empty flag that has been encoded in the flag register circuit after the encoding of the address of the memory word corresponding to the empty flag held in the flag register circuit is terminated; and timing control means for detecting the timing of totally terminating the encoding of the address of the memory word corresponding to the empty flag held in the flag register circuit beforehand and making the flag register circuit hold the empty flag of the next priority order which is pre-held in the prefetch circuit.

Preferably, in the fourth aspect of the encoder, the main priority encoder further comprising: a prefetch circuit for holding the empty flag supplied onto the detection line in the next priority order beforehand while encoding the address of the memory word corresponding to the empty flag in the preceding priority order; a flag register circuit for holding the corresponding empty flag in the preceding priority order held in the prefetch circuit; a main priority circuit for making active only one corresponding empty flag according to the priority order out of the empty flags held in the flag register circuit and sequentially outputting a corresponding active-state empty flag; a main encoding circuit for sequentially encoding the address of the memory word corresponding to the active-state empty flag sequentially output from the main priority circuit; a nullifying bit flag circuit for indicating whether or not the encoding of the address of the memory word corresponding to the empty flag held in the flag register is terminated; and timing control means for detecting the timing of totally terminating the encoding of the address of the memory word corresponding to the empty flag held in the flag register circuit beforehand and making the flag register circuit hold the empty flag of the next priority order which is pre-held in the prefetch circuit.

BRIEF DESCRIPTION OF THE DRAWINGS

FIGS. 6(a), (b) and (c) are schematic block diagrams of small unit priority circuits for use in the priority circuit of FIG. 5.

FIG. 7 is a block diagram of a logical arithmetic circuit for use in the small unit priority circuit of FIG. 5.

FIGS. 14(a) and (b) are graphs showing the results detected by the timing control circuits of FIGS. 12 and 10, respectively.

FIGS. 17(a) and (b) are graphs showing the results detected by the timing control circuits of FIGS. 15 and 10, respectively.

DETAILED DESCRIPTION OF THE INVENTION

In the following, firstly an encoder applicable to a content addressable memory, which provides a basis for understanding an associative memory and an encoder according to the present invention, will be explained in detail, and finally an associative memory and an encoder applied to this associative memory of this invention will be explained in detail.

Referring to FIGS. 1–7, a detailed description will first be given of an encoder which provides a basis for understanding an associative memory and an encoder according to the present invention.

In the content addressable memory shown in these Figs., when retrieval data is fed to CAM blocks constituting the content addressable memory at the time of match retrieval, the match retrieval is made sequentially from the first one of a plurality of CAM subblocks. At this time, the result, that is, a signal (hit signal) matching the retrieval data is held in the plurality of CAM words on a CAM subblock basis. The highest priority CAM subblock is selected by a priority subblock encoder and then the hit signal is transferred to the priority encoder. The priority encoder encodes the hit signal and outputs a hit address. While the operation of encoding the hit signal is being performed, on the other hand, a hit signal in the second priority CAM subblock selected by the priority subblock encoder is applied to a prefetch circuit. The priority encoder starts to encode the hit signal in the second priority CAM subblock applied to the prefetch circuit immediately after the hit signal in the first priority CAM subblock has been encoded completely. Then a hit signal in the third priority CAM subblock is prefetched to the prefetch circuit having a free space. These steps are repeated successively to encode all hit signals in the whole CAM block, that is, to output addresses.

Since a hit signal to be subsequently encoded in the CAM subblock is applied to the prefetch circuit while the hit signal in the preceding CAM subblock is being encoded in the encoder as stated above, it is unnecessary to secure the time required to transfer the hit signal from the CAM subblock up to the priority encoder other than the encoding time. The encoding time to be taken by not only the whole CAM block but also the whole content addressable memory can thus be shortened, whereby the match retrieval operation can be performed by the content addressable memory at high speed.

Referring to the accompanying drawings, the encoder as a preferred embodiment, which provides a basis for understanding an associative memory and an encoder according to the present invention, will subsequently be described.

Figure 1:
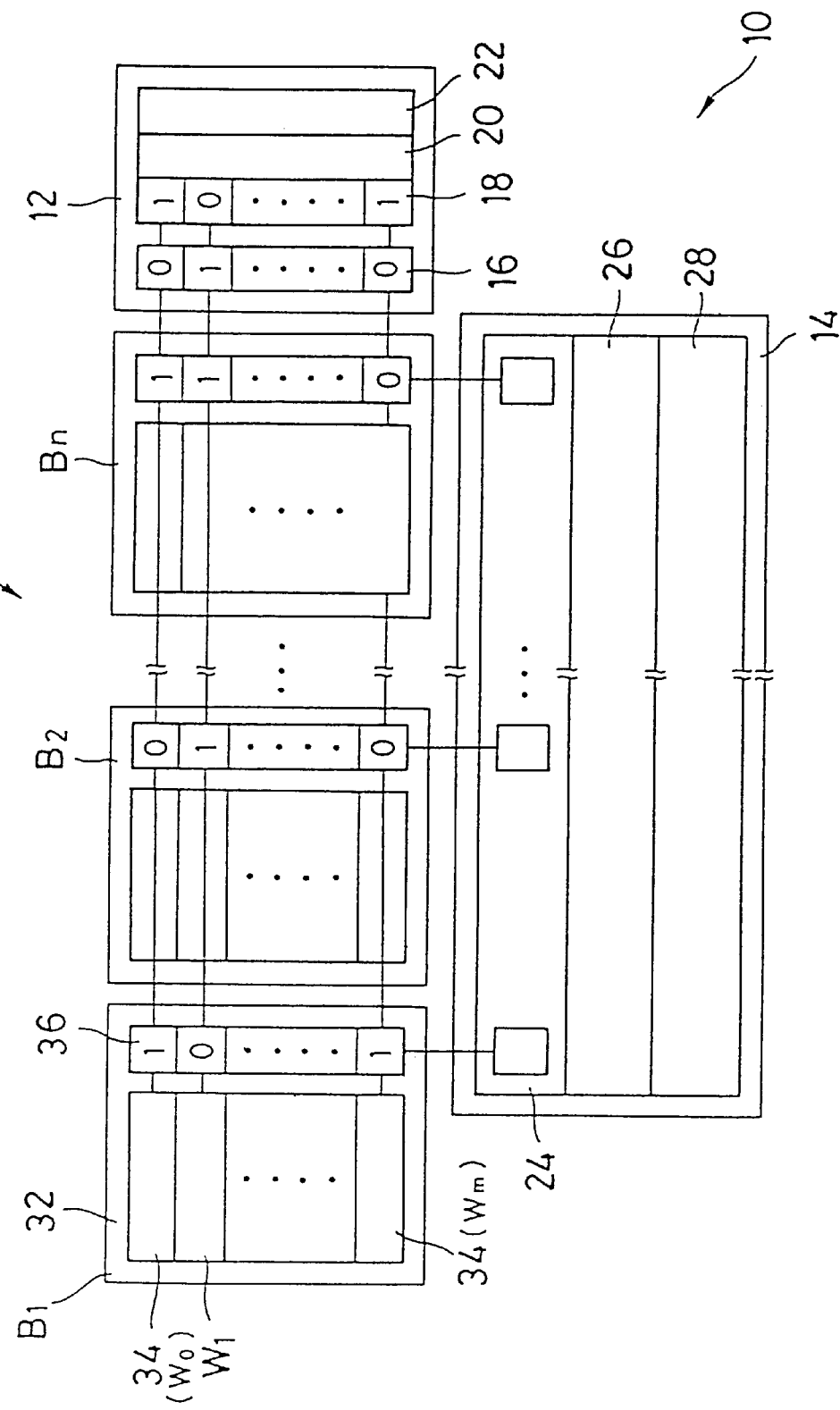
FIG. 1 is a block diagram of an encoder applicable to a content addressable memory, which provides a basis for understanding an associative memory and an encoder according to the present invention.

FIG. 1 is a schematic diagram of the encoder applied to a CAM block, which provides a basis for understanding an associative memory and an encoder according to the present invention. As shown in FIG. 1, an encoder 10 comprises a priority encoder with a prefetch circuit (hereinafter called "main priority encoder" or "main encoder") 12, and a priority subblock encoder (hereinafter called "subblock priority encoder" or "subblock encoder") 14. The main encoder 12 comprises a prefetch circuit 16, a flag register circuit (or data latch circuit) 18, a priority circuit 20, and an encode circuit 22. The subblock encoder 14 comprises a latch circuit 24, a priority circuit 26, and an encode circuit 28.

The main encoder 12 is provided for a CAM block (hereinafter called "memory block") 30. The memory block 30 comprises a plurality (n pieces in FIG. 1) of CAM subblocks (hereinafter called "subblock") 32 $B_1, B_2 \ldots, B_n$). The subblock 32 comprises a subarray (CAM cell subarray) unit having a plurality m+1 pieces in FIG. 1) of CAM words (hereinafter called "word") 34 ($W_0, W_1, \ldots, W_m$) where a predetermined number of CAM memory cells are arranged in array, that is, where logical addresses with continuous predetermined word length are provided, registers 36 ($R_0, R_1, R_2, \ldots, R_m$) for holding the result of match data retrieval in each word 34, for example, a match "1" signal (hit signal), a mismatch "0" signal in each word 34, and OR circuits for ORing the result of match retrieval (hereinafter called "flag data" or "hit signal data") in each word 34. The output of the OR circuit is held in the latch circuit 24 of the subblock encoder 14 to be described below on a subblock basis.

Figure 2:
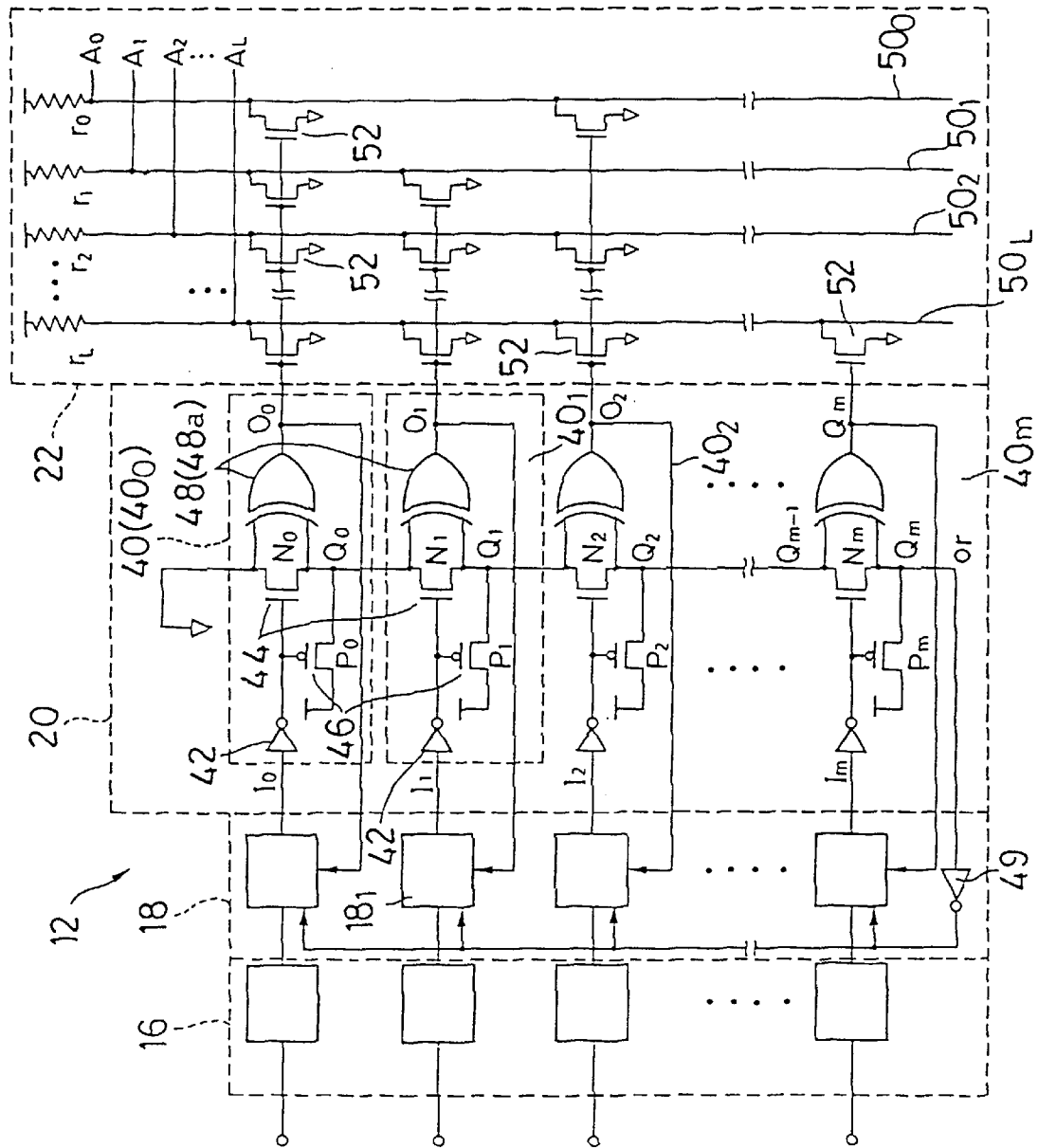
FIG. 2 is a block diagram of a priority encoder with a prefetch circuit for use in the encoder which provides a basis for understanding an associative memory and an encoder according to the present invention.

FIG. 2 is a block diagram of the main encoder 12. In FIG. 2, the prefetch circuit 16 of the main encoder 12 stores the hit signal data held in the register 36 of the second priority subblock 32 on a word 34 basis ($W_0, W_1, \ldots, W_m$) while the priority circuit 20 and the encoder circuit 22 of the main encoder 12 are encoding the hit signal in the flag data in the first priority subblock 32 and the address of the match word 34 in the order of predetermined priorities. In this case, the prefetch circuit 16 may be any apparatus such as a data latch circuit or a data register as long as it is capable of temporarily holding m+1 of 1-bit data "0" or "1". After feeding the latch-held hit signal data of each word 34 to the data latch circuit 18 in parallel by means of the encode output (encode address output) of the main encoder 12, the prefetch circuit 16 fetches the hit signal data in the second priority subblock 32 selected by the subblock encoder 14 while the hit signal data is being encoded by the main encoder 12.

The data latch circuit 18 is used to latch-hold m+1 of 1-bit data like the prefetch circuit 16. While the priority circuit 20 selects data having the hit signal ("1") at one word address from the hit signal data of each word 34 ($W_0, W_1, \ldots, W_m$), particularly what has a plurality of hit signals in the order of predetermined priorities, whereas the encode circuit 22 repeats the encoding operation, the data latch circuit 18 holds the hit signal data until all hit signals ("1") have been encoded. This data latch circuit 18 is so arranged that each time the hit signal ("1") at a high priority word address is encoded, the hit signal ("1") at that word address is reset. The flag register circuit 18 may be any apparatus as long as it can temporarily hold 1-bit data and therefore may be formed with a data latch circuit as previously noted, a data register or the like.

When hit signal data having a plurality of hit signals is applied as shown in FIG. 2, that is, on receiving m+1 of input signals of the whole word 34 having a plurality of match signals, the priority circuit 20 sequentially outputs an output signal including only one priority-ordered hit signal as designated in the order of predetermined priorities, thus including m+1 of priority circuit elements 40 ($40_0$, $40_1$, ..., $40_m$). In this case, the second circuit element (hereinafter simply called "circuit element") 401 will be described as what represents the priority circuit elements 40 by way of example. The circuit element comprises an inverter 42 for inverting the input signal applied to the input terminal $I_1$, an N-channel MOS transistor 44 ($N_1$), a P-channel MOS transistor 46 ($P_1$), the output of the inverter 42 being connected to the gate electrodes of both transistors 44, 46 which are mutually exclusively controlled by the input signal, and a logical arithmetic circuit 48 with the source and drain electrodes of the NMOS transistor 44 as inputs and with the output terminal $0_1$ as an output.

One electrode (e.g., the source electrode) of the NMOS transistor $N_1$ is connected to the other electrode (e.g., the drain electrode) of the NMOS transistor $N_0$ of the high order circuit element $40_0$ at a node $Q_0$, whereas the other electrode (e.g., the drain electrode) of the NMOS transistor $N_1$ is connected to one electrode (e.g., the source electrode) of the MOS transistor $N_2$ of the low order circuit element $40_2$ at a node $Q_1$. The NMOS transistors $N_0, N_1, N_2, ..., N_m$ are thus connected serially at nodes $Q_0, Q_1, Q_2, ..., Q_{m-1}$. A node $Q_m$ under the NMOS transistor $N_m$ is connected to the OR output terminal or and this OR output terminal or is connected via an inverter 49 to each circuit of the data latch circuit 18. Moreover, the electrode (e.g., the source electrode) above (on one side of) the uppermost stage NMOS transistor N0 is fixed to the potential (the signal state) indicating "0" or grounded. On the other hand, one electrodes (e.g., the source electrodes) of the respective PMOS transistors $P_0, P_1, P_2, ..., P_m$ are fixed to the potential (the signal state) indication "1" or connected to a power supply $V_{pp}$, whereas the other electrodes thereof (e.g., the drain electrodes) are connected to the respective nodes $Q_0, Q_1, Q_2, ..., Q_m$. In this case, the direction of the connection of the electrodes (the source and drain electrodes) between the NMOS transistors may be reversed on condition that the NMOS transistors $N_0, N_1, N_2, ..., N_m$ are connected in series; the same will apply to the PMOS transistors $P_0$-$P_m$. The priority circuit 20 having m+1 inputs and m+1 outputs is formed in this way.

A description will subsequently be given of the operation of assigning priority in the priority circuit 20, that is, the operation of outputting a priority-ordered output signal with only the first priority address as a match signal "1" even though a plurality of hit signals (match signals) "1" are applied from $I_0$-$I_m$. When attention is directed to the circuit element $40_1$ of the priority circuit 20, the $N_1$ transistor 44 is turned off and the $P_1$ transistor 46 is turned on if an $I_1$ input is "1". Therefore, the $Q_1$ node is set at "1" by the $P_1$ transistor 46. If an $I_1$ input is "0", the $N_1$ transistor 44 is turned on and the $P_1$ transistor 46 is turned off. Therefore, the $Q_1$ node becomes equal to the logical value of the $Q_0$ node higher by one level. If an $I_k$ input is "1", $Q_k$ becomes "1" and consequently $Q_j (j \geq k+1)$ can be exclusively "1", irrespective of whether $I_j$ is "1" or "0". In other words, (the signal state of) a node $Q_{k+1}$ is "1" if $I_{k+1}$="1" and $Q_{k+1}=Q_k$ if $I_{k+1}$="0" and further $Q_{k+1}$="1" from $Q_k$="1".

As a result, with a plurality of I inputs being "1" in FIG. 2, "0" representing a propagation control signal is transmitted up to the NMOS transistor 44 located on the uppermost side while the corresponding serially-connected NMOS transistors 44 (N) remain off. However, the propagation control signal "0" is not transmitted to each lower Q node and 1 is retained in all the lower Q node. Consequently, the logical arithmetic circuit 48 may be used to detect the extent to which the control signal "0" has been transmitted. When all m+1 inputs of $I_0$–$I_m$ of the priority circuit 20 become "0", the control signal "0" is transmitted up to the OR output terminal or and the absence of "1" in all m+1 input signals is made known. The termination of assigning priority to all the hit signals of the hit signal data in this subblock makes it known that the second priority hit signal data latch-held in the prefetch circuit 16 can be fed to the data latch circuit 18 and that the third priority hit signal data selected by the subblock encoder 14 can be written to the prefetch circuit 16 then.

As shown in FIG. 2, the logical arithmetic circuit 48 comprises an exclusive OR gate (mismatch circuit) 48a for exclusively ORing the signal state between the drain and source of the serially-connected NMOS transistor 44 ($N_1$), that is, the logical value between the nodes $Q_0$ and $Q_1$. In this logical arithmetic circuit 48, the propagation control signal "0" is propagated when the nodes $Q_0$ and $Q_1$ mismatch, that is, up to the node $Q_0$ of the NMOS transistor 44 ($N_1$) of the circuit element $40_1$. When the propagation control signal "0" has not been propagated up to the node $Q_1$, however, the exclusive OR gate 48a outputs "1". When the nodes $Q_0$ and $Q_1$ match ("0"), the output of the output terminal $O_1$ is "0". The logical arithmetic circuit 48 is not limited in configuration to the example shown in FIG. 2 but may be so arranged as to perform desired logical operations with a combination of various gates. Moreover, the input of the logical arithmetic circuit 48 need not necessarily be applied between the nodes $Q_0$ and $Q_1$ but may be either one of them and an input signal or its inverted value and besides the contents of the logical operation may be selected properly in accordance with the signal value.

When the first priority-ordered output signal (O) having one hit signal is output from an input signal (I) having a plurality of hit signals, the first priority output signal should be used to reset the input side in a case where the address of the second priority match signal exists in the identical subblock 32. In other words, assuming $I_1$="1", $I_2$="1" in the priority circuit 20 of FIG. 2, for example, output $O_1$="1" and output $O_0=O_1=O_2=...=O_m$="0" since node $Q_0$="0", node $Q_1=Q_2=...=Q_m$="1". If the $O_1$ output value is input to the reset terminal of the data latch circuit 18, $I_1$="0" and therefore the N transistor 44 ($N_1$) is turned on, whereas the P transistor 46 ($P_1$) is turned off, and node $Q_1=Q$="0". Since the N transistor $N_2$ is held OFF, node $Q_0=Q_1$="0", node $Q_2=...=Q_m$="1". The second priority $I_2$="1" is then selected as the next output signal.

The plurality of hit signals within the hit signal data in the identical subblock 32 are applied to the main encoder 12 at a time and the hit signals are sequentially applied to the encode circuit 22 by the priority circuit 20 as an output signal having only one hit signal in the order of predetermined priorities. Then "1" is applied to the reset terminal of the data latch circuit 18 of the word address corresponding to the "1" output and the hit signals ("1") latch-held in the data latch circuit 18 are sequentially reset. When the last priority-ordered hit signal is applied to the encode circuit 22 and applied to the encode circuit 22 before being reset, data "0" is transmitted to the lowermost node $Q_m$ of FIG. 2 before being output from the OR output terminal or. Further, the data "0" is inverted by the inverter 49 and its inverted value "1" is applied to the whole data latch circuit 18. The hit signal data of the second priority subblock 32 latch-held in the prefetch circuit 16 is applied (shifted) to each corresponding circuit of the data latch circuit 18 and held therein. Moreover, the hit signal data in the third priority subblock 32 preselected by the subblock encoder 14 is read from the register 36 to the prefetch circuit 16 having a free space and latch-held. The priority circuit 20 thus terminates the processing of the hit signal data in the first priority subblock and since it need not wait for the hit signal data in the second priority subblock transferred from the register 36 of the subblock 32, it can perform the encoding operation with efficiency.

The encode circuit 22 is used to encode only one match signal address existing in the output signals sequentially output from the priority circuit 20 and to encode each word address at the output terminal $O_0, O_1, O_2, \ldots, O_m$ corresponding to each of the words 34 ($W_0, W_1, W_2, \ldots, W_m$). The encode circuit 20 comprises L+1 of address lines 50 ($50_0, 50_1, 50_2, \ldots, 50_L$) for encoding L+1 bits with respect of the smallest natural number L+1 which comes up to $m+1 \leq 2^L$, and a grounded transistor 52 affixed to each address line 50, whereas its gate electrode is connected to the output line from each of the output terminals $O_0, O_1, O_2, \ldots, O_m$. In this case, one ends of the respective L+1 address lines $50_0, 50_1, 50_2, \ldots, 50_L$ are connected via respective resistors $r_0, r_1, r_2, \ldots, r_L$ to a power supply (or fixed to "1" potential) and the transistor 52 is so installed as to make L+1 bit code outputs of $A_L \ldots A_2 A_1 A_0$ available.

The output line from the output terminal $O_0$, for example, is connected to all the gate electrodes of L+1 of grounded transistors 52 connected to all L+1 address lines $50_0$–$50_L$. When the output of the output terminal $O_0$ is, for example, "1" (match signal) and when the remainder is all "0", $A_L = \ldots = A_2 = A_1 = A_0 = 0$, thus indicating $(A_L \ldots A_2 A_1 A_0) = (0 \ldots 0\ 0\ 0)$. Subsequently, the output terminals $O_1$ and $O_2$ corresponding to the second and third word addresses $W_1, W_2$ are respectively connected to the gate electrodes of L pieces of the grounded transistors 52 connected to L pieces of address lines $50_1$–$50_L$ and $50_0, 50_2$–$50_L$ excluding the address lines $50_0$ and $50_0$. Only when the output terminals $O_1$ and $O_2$ become "1", they respectively represent $(A_L \ldots A_2 A_1 A_0) = (0 \ldots 0\ 0\ 1)$ and $(0 \ldots 0\ 1\ 0)$. Thereafter, the grounded transistor 52 is connected to each address line 50 in such a way as to represent each code address likewise. When $m+1=2^L$, for example, the output line of the last output terminal $O_m$ is connected only the grounded transistor 52 fitted to the address line $50_L$ and only when the output terminal $O_m$ is "1", it represents $(A_L \ldots A_2 A_1 A_0) = (01 \ldots 1\ 1\ 1)$ (the initial L+1 digit represents "0" and the remainder L all "1"). When all output terminals $O_0, O_2, \ldots, O_m$ is "0", it represents $(A_L \ldots A_2 A_1 A_0) = (1 \ldots 1\ 1\ 1)$ (all 1). The encode circuit 22 is basically thus arranged. The encode circuit 22 is limited to what has been illustrated but may be any other known circuit of the sort that is capable of encoding and outputting the "1" output address on receiving an input signal having the "1" output at only one word address. The main encoder 12 is basically thus configured.

Figure 3:
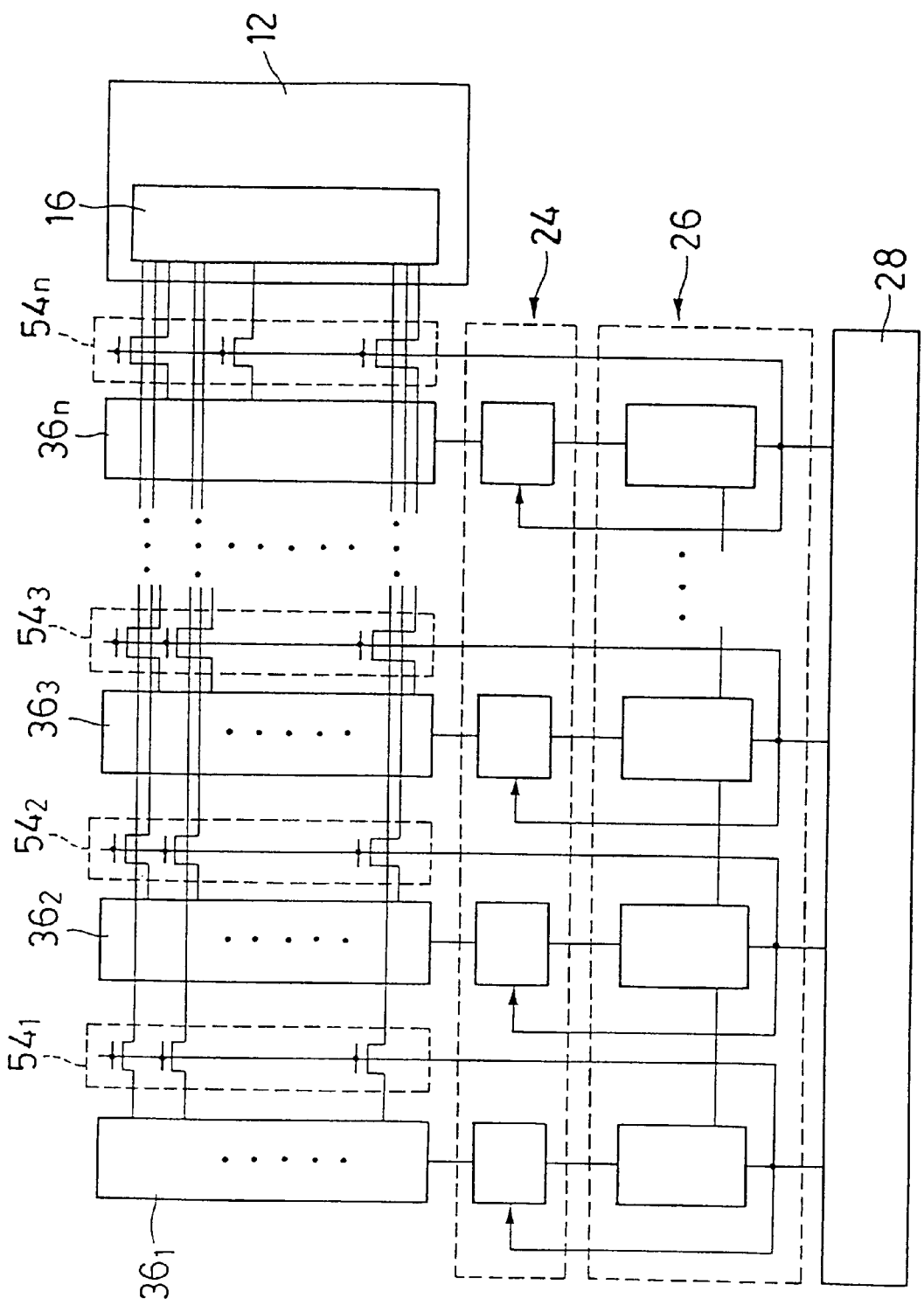
FIG. 3 is a block diagram of a priority subblock encoder for use in the encoder which provides a basis for understanding an associative memory and an encoder according to the present invention.

FIG. 3 is a block diagram of the subblock encoder 14. As the data latch circuit 24, the priority circuit 26 and the encode circuit 28 shown in FIG. 3 are substantially similar in structure to the data latch circuit 18, the priority circuit 20 and the encode circuit 22 shown in FIG. 2 except that the number of units constituting each of them is n instead of m+1, a detailed description of their circuit arrangements will be omitted. The result of match retrieval in each memory subblock 32, that is, hit signal data is held in the register 36 in the subblock encoder 14 at the time of match retrieval carried out in each CAM memory subblock 32 ($B_1, B_2, \ldots, B_n$). Moreover, an OR circuit (not shown) in the subblock 32 causes a subblock hit signal indicating the presence or absence of the word 34 (hit word or match word) showing match retrieval data to be generated and held in the data latch circuit 24 of the corresponding subblock 32. Match retrieval is sequentially carried out in the subblock 32 and the block hit signal is latch-held in the data latch circuit 24 when the hit signal data is held in the register 36 of the relevant subblock 32.

On the other hand, the subblock 32 whose block hit signal latch-held in the data latch circuit 24 is the hit signal ("1") is selected in the order of predetermined priorities, from left to right in FIG. 3, in the priority circuit 26 of the subblock encoder 14 and the priority-ordered output signal having "1" at that block address is produced. The output signal is encoded and output by the following stage encode circuit 28 before being returned to the control unit of the relevant subblock 32. The gate circuit 54 in the control unit is then turned on and the hit signal data in the register 36 is fed to the fetch circuit 16 of the main encoder 12 after the fetch circuit 16 affords a free space. The subblock encoder 14 selects the priority subblock 32 to be encoded next in the order of predetermined priorities in this way and while the main encoder 12 is encoding the word address of the hit signal from the hit signal data in the first priority subblock 32, transfers the hit signal data in the second priority subblock 32 to the prefetch circuit 16 having a free space and has the data latch-held.

Figure 30:
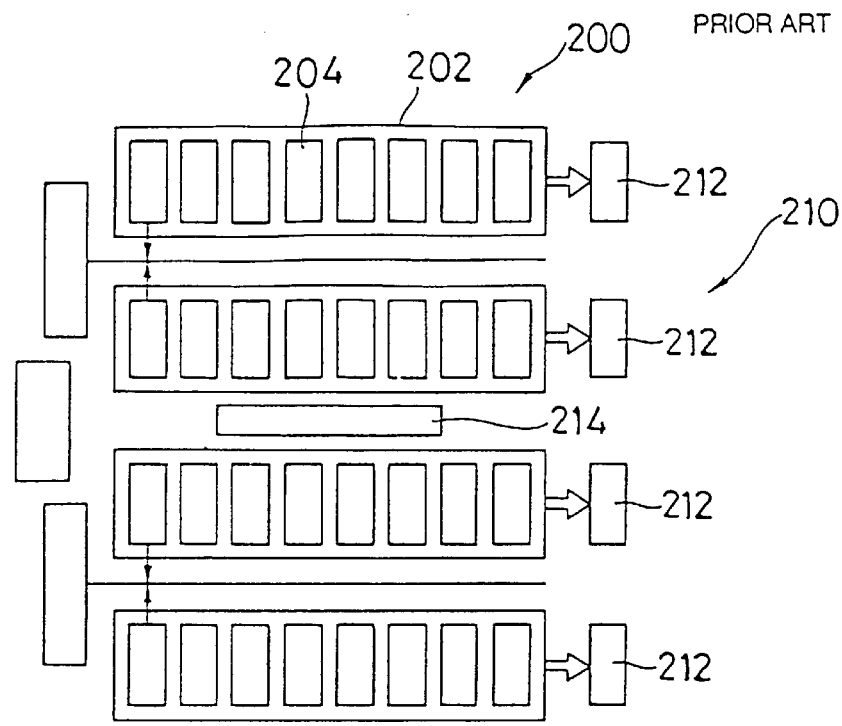
FIG. 30 is an overall block diagram of a content addressable memory employing a conventional encoder.
Figure 31:
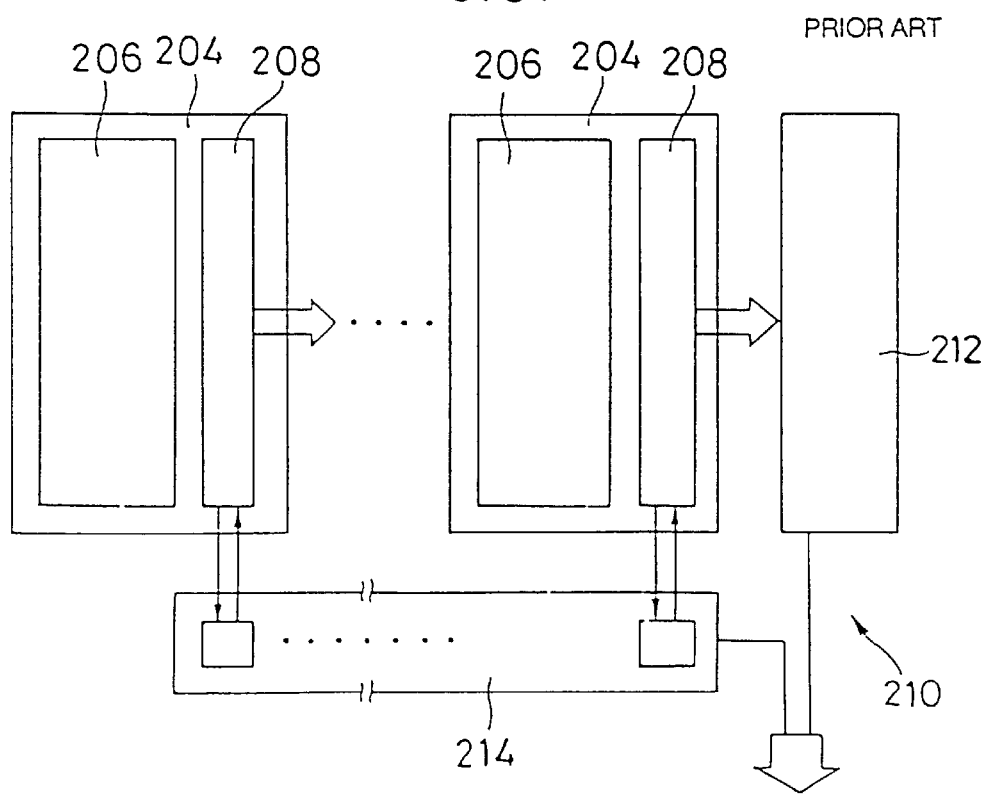
FIG. 31 is an overall block diagram of the content addressable memory employing the conventional encoder.

The encoder 10 shown in FIG. 1 combines the encoded block address output from the encode circuit 28 of the subblock encoder 14 and the encoded word address output from the encode circuit 22 of the main encoder 12 into an encoding logical address and sequentially output the result. When the last subblock 32 or the lowest priority subblock 32 is selected, the process in the subblock encoder 14 is terminated and when the operation of encoding whole hit signal by the main encoder is terminated, the encoder 10 outputs the hit signals of all memory words in the CAM subblock 30 as logical addresses and terminates the match retrieval operation. Although the encoder 10 having one main encoder 12 and one subblock encoder 14 with respect to the CAM block 30 having the plurality of CAM subblocks 32 has been referred to by way of example, it is not limited to this example but may be so arranged as to have one subblock encoder 14 with respect to a plurality of CAM blocks 30 like a conventional encoder 210 applicable to the CAM 200 shown in FIG. 30.

Figure 4:
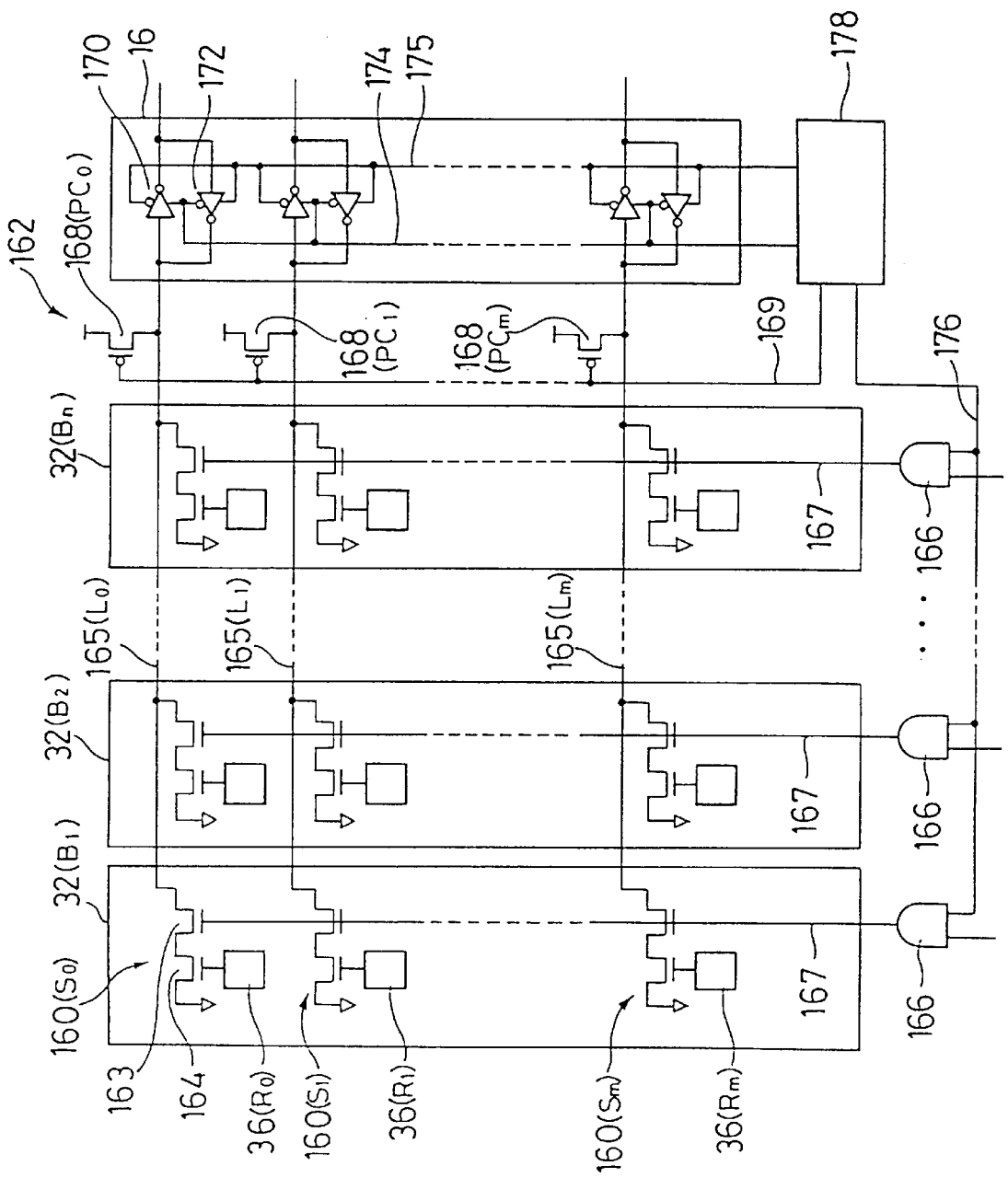
FIG. 4 is a block diagram of a prefetch circuit for use in the encoder which provides a basis for understanding an associative memory and an encoder according to the present invention.

FIG. 4 shows a specific circuit arrangement of the prefetch circuit 16 used in the encoder 10 shown in FIG. 1 together with a switch circuit 160 for controlling each subblock 32 required for the operation thereof and a precharge circuit 162.

A description will be given of one switch circuit 160 ($S_0$) connected to the register 36 ($R_0$) of a subblock 32 ($B_1$) by way of example. The switch circuit 160 ($S_0$) comprises two NMOS transistors 163, 164 connected in series. The electrode (e.g., the drain electrode) of one transistor 163 of each switch circuit 160 ($S_0, S_1, \ldots, S_m$) is connected in parallel to a corresponding detection line 165 ($L_0, L_1, \ldots, L_m$) in each subblock 32 $B_1, B_2, \ldots B_n$), whereas a detection line L is connected to the prefetch circuit 16. The gate electrode of the transistor 163 of each switch circuit 160 ($S_0, S_2, \ldots S_m$) is connected in parallel to a block selection line 167 and to an AND circuit 166. Moreover, the gate electrode of the other transistor 164 of each switch circuit 160 ($S_0, S_1, \ldots, S_m$) is connected to the output terminal of the corresponding register 36 ($R_0, R_1, \ldots, R_m$), whereas the other electrode (e.g., the source electrode) of the transistor 164 is grounded. Further, the precharge circuit 162 comprises a PMOS transistor 168 ($PC_0, PC_1, \ldots PC_m$) as a precharge transistor for precharging the detection line 165 ($L_0, L_1, \ldots, L_m$) at a predetermined potential (e.g., power supply potential). One electrode of each PMOS 168 ($PC_0, PC_1, \ldots PC_m$) is connected to a fixed potential source (power supply), the other electrode to the detection line 165 ($L_0, L_1, \ldots, L_m$) and the gate electrode to a precharge signal line 169.

The prefetch circuit 16 has (m+1) of data latch circuits, each comprising two inverters 170, 172 connected reversely in parallel and latch signal lines 174, 175 for receiving a control signal for controlling the output state of the inverters 170, 172. The input side ends of the inverters 170, 172 connected in parallel are connected to the input line 165 ($L_i$), whereas the out side ends thereof are connected to circuit elements corresponding to the data latch circuit 18. Moreover, the latch signal line 174 is connected to the control signal terminal of the inverter 170 and the inverted control signal terminal of the inverter 172, whereas the latch signal line 175 is connected to the control signal terminal of the inverter 172 and the inverted control signal terminal of the inverter 170.

One input terminal of the AND circuit 166 is connected to a circuit element corresponding to the data latch circuit 24 (or the priority circuit 26) of the subblock encoder 14, whereas the other input terminal thereof is connected to a control signal line 176 for controlling the selection timing of the block selection line 167. The control signal line 176, the precharge signal line 169, the latch signal lines 174, 175 are connected to a timing control circuit 178 for controlling the operative timing of each circuit.

The prefetch operation of the prefetch circuit 16 will subsequently be described.

First, all PMOS 168 ($PC_0, PC_1, \ldots, PC_m$) are turned on with the precharge signal line 169 as L(low) and (m+1) of detection lines 165 ($L_0, L_1, \ldots, L_m$) of the prefetch circuit 16 are precharged at a predetermined potential. Subsequently, the timing control circuit 178 is operated to turn off (m+1) of PMOS 168 with the precharge signal line 169 as H. With the control line 176 as "1" (H) further, the block hit signal "1" of the second priority (the next priority of the subblock in which the main encoder 12 is performing the encoding operation) subblock 32 ($B_i$) with the block hit signal "1" latch-held in the data latch circuit 24 of the subblock encoder 14 is applied to the AND circuit 166. Then the block selection line 167 of the relevant subblock 32 ($B_i$) is turned on.

When the second priority subblock 32 ($B_i$) is selected so as to make the corresponding AND circuit 166 set the block selection line 167 at H (high level), the transistor 164 whose gate electrode has been connected to the register 36 ($R_i$) holding the hit signal ("1") out of the registers 36 and the transistor 163 connected thereto are turned on. These transistors 164, 163 operate to ground the detection line 165 ($L_i$) and lower the potential of the detection line by pulling out the precharged charge of the detection line 165 ($L_i$). On the other hand, the transistor 164 whose gate has been connected to the register 36 ($R_j$) holding data of "0" (mismatch) is not turned on but remains off, whereby the potential of the corresponding detection line 165 ($L_j$) is left unchanged even though the block selection line is set at H. The precharged potential is thus maintained.

Consequently, the potential of the detection line 165 ($L_0, L_1, \ldots, L_m$) varies with the value ("1": hit signal, "0": mishit signal) stored in the register 36 of the selected subblock 32 ($B_i$), thus inverting the polarity.

By giving the latch signal lines 174, 175 of the prefetch circuit 16 latch signals, the parallel-connected inverters 170, 172 of the prefetch circuit 16 are made to latch the signal. In this case, the detection lines on the input side of the inverters 170, 172 become equal in polarity because their output sides are inverted, though these lines are opposite in polarity to the register 36. Consequently, the hit signal data in the next subblock 32 latched by the prefetch circuit 16 is fed to the data latch circuit 18 simultaneously when the encoding operation in the first priority subblock 32 of the main encoder 12 is terminated. Then the prefetch circuit 16 repeats the aforementioned operation in order to prefetch the hit signal data in the storage register 36 of the second priority subblock 32.

The encoder 10 is basically arranged like this.

Figure 5:
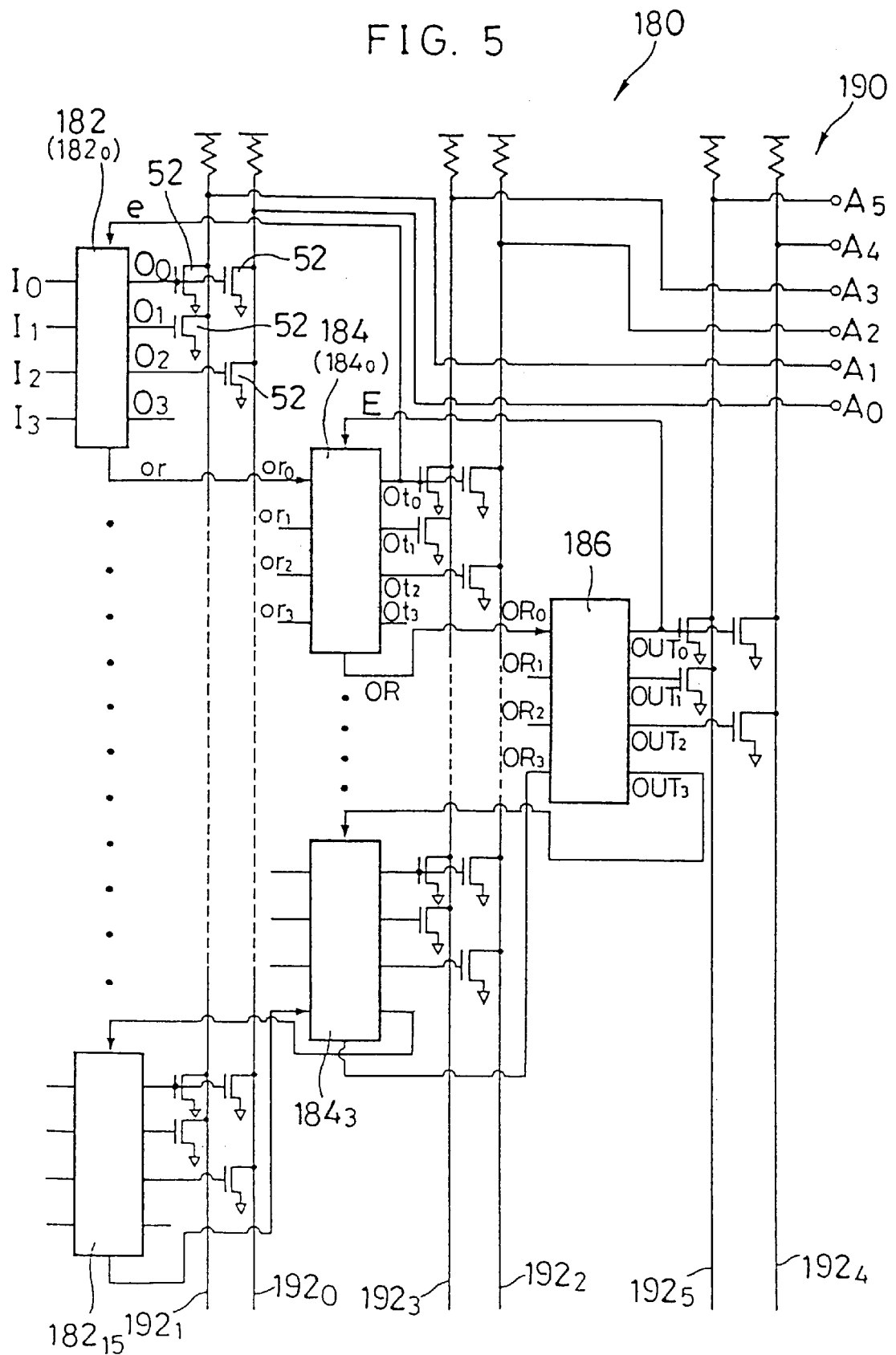
FIG. 5 is a block diagram of another priority circuit with encode circuits for use in the encoder which provides a basis for understanding an associative memory and an encoder according to the present invention.

The encoder 10 is not limited to what comprises the priority circuits 20, 26 and the encode circuit 22, 28 shown in FIGS. 2, 3 but may employ heretofore known priority circuits and encode circuits or the priority circuit 180 and the encode circuit 190 shown in FIGS. 4, 5 and 6 to speed up the operation of assigning priority and the encoding operation itself. Needless to say, the combination of the priority circuit 180 and the encode circuit 22 of FIG. 2 may be used in this case.

The priority circuit 180 shown in FIG. 5 has a ternary hierarchical structure: the lowest tier comprises sixteen 4-input small unit priority circuits (hereinafter called "unit circuits") 182; the intermediate tier comprises four similar 4-input small unit priority circuits 184; and the highest tier comprises one similar 4-input small unit priority circuit 186. Therefore, the priority circuit 180 is allowed to have 64 inputs because of sixteen unit circuits 182 in the lowest tier. In other words, 64 inputs of the priority circuit 180 are formed into 16 groups, each having four inputs. The small unit priority circuit 182 is formed with a group of four inputs and there are employed 16 small unit priority circuits. The 16 small unit priority circuits 182 are formed into four groups, one group comprising four unit circuits 182. The four unit circuits 182 constituting the one group are connected to one small unit priority circuit 184 forming the intermediate tier. Moreover, four of the unit circuits 184 are formed into a group and connected to the small unit priority circuits 186 in the highest tier.

The priority circuit 180 shown in FIG. 5 has 64 inputs and the ternary hierarchical structure with the 4-input unit circuits 182, 184 and 186 as component units. However, it is not limited to this arrangement and there may be a hierarchical structure in which the number of elements in the respective unit circuits and that of hierarchical tiers are to be selected properly in proportion to the total number of inputs and the number of inputs in the respective unit circuits for use. Although the unit circuits 182, 184 and 186 constituting the respective hierarchical tiers have been defined as those having the same number of inputs, it is not limited to this arrangement but the number of inputs may vary. The smaller the number of inputs of the unit circuit, the more it is convenient to increase the priority variation rate. Nevertheless, an increase in the number of unit circuits required will result in an increase in the number of hierarchical tiers if the number of inputs of the unit circuit is too small and will further cause the number of accompanying elements and peripheral circuits to increase, which will be undesirable. Accordingly, it suggests a multi-hierarchy structure in which the number of tiers should be determined properly by making selective the total number of inputs and the number of inputs of the unit circuit (either exclusive or multi-kind) usable in each hierarchical tier.

As shown in FIG. 6(a), the small unit priority circuit 182 is arranged in the order of ascending priorities and has four input terminals $I_0$, $I_1$, $I_2$ and $I_3$, four output terminals $O_0$, $O_1$, $O_2$ and $O_3$, an enable signal input terminal e, an OR output terminal or, and four priority circuit elements 188 (188$_0$, 188$_1$, 188$_2$ and 188$_3$). In this case, since the circuit element 188 is identical in configuration as the circuit element 40 of FIG. 2 except that the logical arithmetic circuit 48 used in the former has the enable signal input terminal e and is activated by the enable signal received therefrom, like component elements are designated by like reference characters and the description of them will be omitted.

FIG. 7 shows a specific exemplary configuration of the logical arithmetic circuit 48 of FIG. 6(a). The logical arithmetic circuit 48 shown in FIG. 7 comprises an exclusive OR gate 48a and an AND gate 48b for ANDing the output of the exclusive OR gate 48 and the enable signal e. The exclusive OR gate 48a of the logical arithmetic unit 48 output "1" when input signals mismatch, that is, when nodes $Q_{i-1}$ and $Q_i$ mismatch, whereas the AND gate 48b simultaneously applies "1" to the output terminal $O_i$ when the enable signal e is "1" (active). The output terminal $O_i$ is "0" when the input signals match or when the enable signal e is "0".

FIGS. 6(b) and 6(c) are schematic diagrams of unit circuits 184 and 186 in the intermediate hierarchical tier and the highest hierarchical tier, respectively. As the unit circuits 184 and 186 shown in FIGS. 6(b) and 6(c) have the same structure as that of the unit circuit 182 in the lowest tier shown in FIG. 6(a) except for the signals input to and output from the input/output signal terminals, the illustration of the arrangement thereof will be omitted. Input terminals or$_0$, or$_1$, or$_2$, or$_3$ of the unit circuit 184 shown in FIG. 6(b) are respective OR outputs or of the four unit circuits 182 forming the lowest hierarchical tier of FIG. 5. If the outputs $O_{tk}$ (k=0, 1, 2, 3) of the unit circuit 184 are connected to enable terminals e/k of the unit circuit 182$_k$ corresponding to input signals or$_k$, No. k circuit 182$_k$ can be activated selectively only when $O_{tk}$="1". Therefore, the OR output may be used to see whether "1" exists in the or input of the unit circuit 184 and the OR outputs ultimately indicate under the control of the circuit 184 that any one of the I input signals of the plurality of unit circuits 182 is "1".

FIG. 6(c) shows another unit circuit 186 in the high tier with the OR output of the circuit 184 as an input and as stated above, the unit circuit 186 can be exactly the same in structure as the unit circuits 182 and 184 respectively shown in FIGS. 6(a) and 6(b). The unit circuit 186 shown in FIG. 6(c) uses the OR outputs of all the four unit circuits 184 forming the intermediate tier as OR inputs OR$_k$ (k=0, 1, 2, 3) and outputs OUT$_0$, OUT$_1$, OUT$_2$, OUT$_3$ corresponding to the OR inputs OR$_k$ (k=0, 1, 2, 3) are applied to respective enable signal inputs E as respective enable signals of all the four unit circuits 184 in the intermediate tier. Therefore, the OR output GOR of the unit circuit 186 may be used to see whether "1" exists in the OR input OR$_k$ of the unit circuit 186. The enable signal ENB of the unit circuit 186 itself is supplied with a predetermined clock signal separately until all of OUT$_k$ output "0", that is, the OR output GOR becomes "0". While the output OUT$_k$ of the unit circuit 186 is outputting "1", the small unit priority circuit having "1" (match signal) conversely exists in a low order group equivalent to the address at which "1" is output as only one signal having "1" (hereinafter called "priority-ordered output signal") selected from among the input signals of the priority circuit 180 has not yet been output completely.

The arrangement of the circuit for effecting hierarchical priority selection by employing the small unit priority circuits 182, 184 and 186 contributes to high-speed operation as compared with a case where all N-channel transistors 44 are serially connected in the form of the single-hierarchical priority circuit 20 as shown in FIG. 2. In this case, the signal state (logical value) of the node $Q_3$ of the lowest-order circuit element 188$_3$ of the priority circuit 182 shown in FIG. 6 may be used as the or or OR output. What uses the logical value of the node $Q_3$ like this is extremely advantageous in that no special circuit is required to obtain the OR output. However, it is not limited to this application but may be practiced in such a way as to increase the operating speed by employing an ordinary OR gate to directly obtain the OR output from the input signal.

Even if there exist hit signals having continuous priorities in different small unit priority circuits 182, the high priority hit signal is output as a priority-ordered output signal by using the or and OR outputs. Even though "1" output from the unit circuit 182 in which a hit signal at a low priority word address exits is possible, the output signal in the unit circuit 184 in the high tier is not allowed to become "1" output until the OR output becomes "0". Consequently, the enable signal in the unit circuit 182 will never become "1" (i.e., active) and the unit circuit 182 is not allowed to output "1". However, the high tier unit circuit 184 outputs "1" when the OR output of the first priority unit circuit 182 becomes "0" since the OR output of the second priority unit circuit 182 is "1". Therefore, the enable signal in the second priority unit circuit 182 becomes "1," and this unit circuit 182 can output "1". In this way, quick switching is possible even when a hit signal exists between different unit circuits 182.

As the priority circuit 180 of FIG. 5 has 64 inputs, 6 bits and consequently six address lines are needed for address code conversion. When the conventional encode circuit 22 of FIG. 2 is used as an address encoder, a 6-bit address encoder may be formed by connecting the six address lines and the respective four output lines of 16 priority circuits 182 in the lowest hierarchical tier, that is, 64 output lines in total via grounded transistors 52 in the aforementioned predetermined method. Although the priority circuit 180 of FIG. 5 is applicable to the conventional encode circuit, the number of transistors for connecting the output lines and the address lines increases as the number of inputs increases.

The encode circuit 190 of FIG. 5 has an address encoder for encoding two bits in each hierarchical tier of the aforementioned priority circuit 180 of tertiary structure. A priority-ordered output signal is then output when a match signal (hit signal) is contained. However, there exists one output terminal for outputting "1" H (high) in each hierarchical tier out of those forming small unit priority circuits 182, 184, 186 of the priority circuit 180. Therefore, sixteen small unit priority circuits 182 in the lowest tier are connected to two address lines 192$_1$, 192$_0$ for determining $A_1$, $A_0$ of low order two bits. Four of the priority circuits 184 in the intermediate tier are connected to two address lines 192$_3$, 192$_2$ for determining $A_3$, $A_2$ of intermediate two bits. One priority circuit 186 in the highest tier is connected to two address lines 192$_5$, 192$_4$ for determining $A_5$, $A_4$ of high order two bits.

As one priority circuit and two address lines are connected in the same manner in each hierarchical tier, the connection between the lowest tier priority circuit 182$_0$ and the address lines $192_1$, $192_0$ will subsequently be described as a representative example. The first output line $O_0$ of the priority circuit $182_0$ is connected to the gate electrodes of two transistors 52 for respectively grounding (or fixing to "0" potential) the address lines $192_1$, $192_0$. When only the output of the first output line $O_0$ is "1" [$(O_0, O_1, O_2, O_3)$ (1, 0, 0, 0)], the two grounded transistors 52 are turned on, which results in $A_0=A_1=0$. Then the second output line $O_1$ of the priority circuit $182_0$ is connected to the gate electrode of the grounded transistor 52 for grounding (or fixing to "0" potential) the address line $192_1$. Consequently, the transistor 52 is turned on when only the second output line $O_1$ is "1" [$(O_0, O_1, O_2, O_3)=(0, 1, 0, 0)$], which results in $(A_1, A_0)=(0, 1)$. Further, the third output line $O_2$ of the priority circuit $182_0$ is connected to the gate electrode of the transistor 52 for grounding (or fixing to "0" potential) the address line $192_0$. Consequently, the grounded transistor 52 is turned on when only the third output line $O_2$ is "1" [$(O_0, O_1, O_2, O_3)=(0, 0, 1, 0)$], which results in $(A_1, A_0)=(1, 0)$. In this case, $(A_1, A_0)=(1, 1)$ when only the fourth output line $O_3$ is "1" [$(O_0, O_1, O_2, O_3)=(0, 0, 0, 1)$].

The encode circuit 190 can be fabricated by carrying out the above-noted connections with the two address lines tier-to-tier in each priority circuit. Since the number of transistors used to connect the address lines $192_0$–$192_5$ and the respective priority circuits 182, 184, 186 in this encode circuit 190 is four per priority circuit, there are 84 transistors in total, namely 64 in the lowest tier, 16 in the intermediate tier and four in the highest tier. On the contrary, 192 transistors are needed in the case of an address encoder of FIG. 2 in which all of six address lines are connected to 16 priority circuits 20 in the lowest tier. Consequently, the encode circuit 190 of FIG. 5 has the effect of high encoding speed.

A description has been given, by way of example, of an arrangement of N-channel transistors connected serially as priority circuits constituting the main encoder and the subblock encoder of the encoder which provides a basis for understanding an associative memory and an encoder according to the present invention as shown in FIGS. 2 and 6(a). However, it is not limited to such an arrangement but includes using a priority circuit formed of serially-connected P-channel transistors, arranging to make bidirectional priority possible, and utilizing any known main encoder or subblock encoder on condition that a prefetch circuit is provided for the main encoder.

Although the various examples of encoders which provides a basis for understanding an associative memory and an encoder according to the present invention has been described, it is not restricted to shown Figs. but may needless to say be modified in design and improved in numerous ways in connection with the number of inputs and arrangements of prefetch circuits, data latch circuits, priority circuits and encode circuits constituting the main encoder and the subblock encoder.

As set forth above in detail, when the match retrieval data in the CAM memory block is obtained by means of the encoder which provides a basis for understanding an associative memory and an encoder according to the present invention, the result of match retrieval in the first CAM subblock among the plurality of CAM subblocks constituting the CAM block, for example, a match signal (hit signal) matching the retrieval data in the plurality of CAM words is held in the holding means such as a register and the block hit signal indicating the presence of the CAM word matching the retrieval data is generated in the CAM subblock. On receiving a block hit signal, the priority subblock encoder subsequently selects the first priority CAM subblock and generates a subblock address. The hit signal (simultaneously over the whole word) in the first priority subblock thus selected is transferred to the priority encoder. Then the priority encoder encodes the hit signal in the order of predetermined priorities and outputs a word address. The priority subblock encoder selects the second priority CAM subblock during the encoding operation above and applies the hit signal data held in the holding means such as the register of the subblock to the prefetch circuit provided in the main priority encoder. Accordingly, the main priority encoder starts encoding the hit signal data in the second priority subblock stored in the prefetch circuit immediately after the hit signal has been encoded completely and outputs the word address. Then the encoder combines the word address output with the subblock address output and outputs a logical address.

In this encoder, output signals from a number of CAM subblocks can be encoded efficiently without delay (switch time) at the time of subblock-to-subblock switching even when the plurality of subblocks constitute a CAM block. As a result, the encoder of FIGS. 1–7 is applicable to a content addressable bulk memory which has the CAM block comprising the plurality of CAM subblocks and is required to process mass data at high speed.

Referring to FIGS. 8–11, an encoder and a semiconductor integrated circuit as a number detection circuit applicable to the encoder which provides a basis for understanding an associative memory and an encoder according to the present invention will be described in detail.

In CAM shown in FIGS. 8–11., when retrieval data is fed to CAM blocks constituting CAM at the time of match retrieval, the match retrieval is made in a plurality of CAM subblocks. At this time, the result, that is, flag data including a signal (hit signal) matching the retrieval data is held in the plurality of CAM words on a CAM subblock basis. Then the highest priority CAM subblock is selected by a priority subblock encoder and its flag data is transferred to and held in the flag register of a priority main encoder. The priority main encoder encodes the hit signal in the flag data stored in the flag register in the order of predetermined priorities and outputs a hit address. While the flag data is being encoded, on the other hand, the flag data in the second priority CAM subblock selected by the priority subblock encoder is fed to a prefetch circuit. Hit signals in the flag data in the first priority CAM subblock are sequentially encoded in the priority main encoder and as hit addresses are output, the hit signals in the flag register are sequentially reset.

At this time, a timing detection control circuit means for predetecting the end of the hit signal in the flag register detects the number of hit signals held in the flag register. When the number of remaining hit signals ultimately comes up to one, for example, flag data in the second priority CAM subblock that has been fed to the prefetch circuit is transferred to the flag register immediately after the termination of encoding the preceding hit signal and it is started to encode the hit signal in this flag data. Then flag data in the next priority CAM subblock is prefetched to the prefetch circuit caused to have a free space. These steps are sequentially repeated to encode the hit signals in the whole CAM block, that is, output addresses.

With the encoder shown in Figs., the hit signal of the flag data in the CAM subblock subject to subsequent encoding has been applied to the prefetch circuit while the hit signal in the flag data in the preceding CAM subblock is being encoded, whereby the time required to transfer the hit signal from the CAM subblock to the flag register of the priority main encoder can be saved. It is simultaneously detected that the number of hit signals ultimately becomes one immediately after the encoding of the last hit signal of the flag data in the flag register is started. In the next encoding cycle, the flag data held in the prefetch circuit is transferred to the flag register and the hit signal in the flag data thus transferred is encoded. Since no loss is caused in the encoding cycle, the encoding time in not only the whole CAM block but also the whole CAM can be shortened, so that the high-speed match retrieval operation of CAM becomes possible.

Referring to the accompanying drawings, the encoder and the semiconductor integrated circuit as a preferred embodiment, which provides a basis for understanding an associative memory and an encoder according to the present invention, will subsequently be described.

Figure 8:
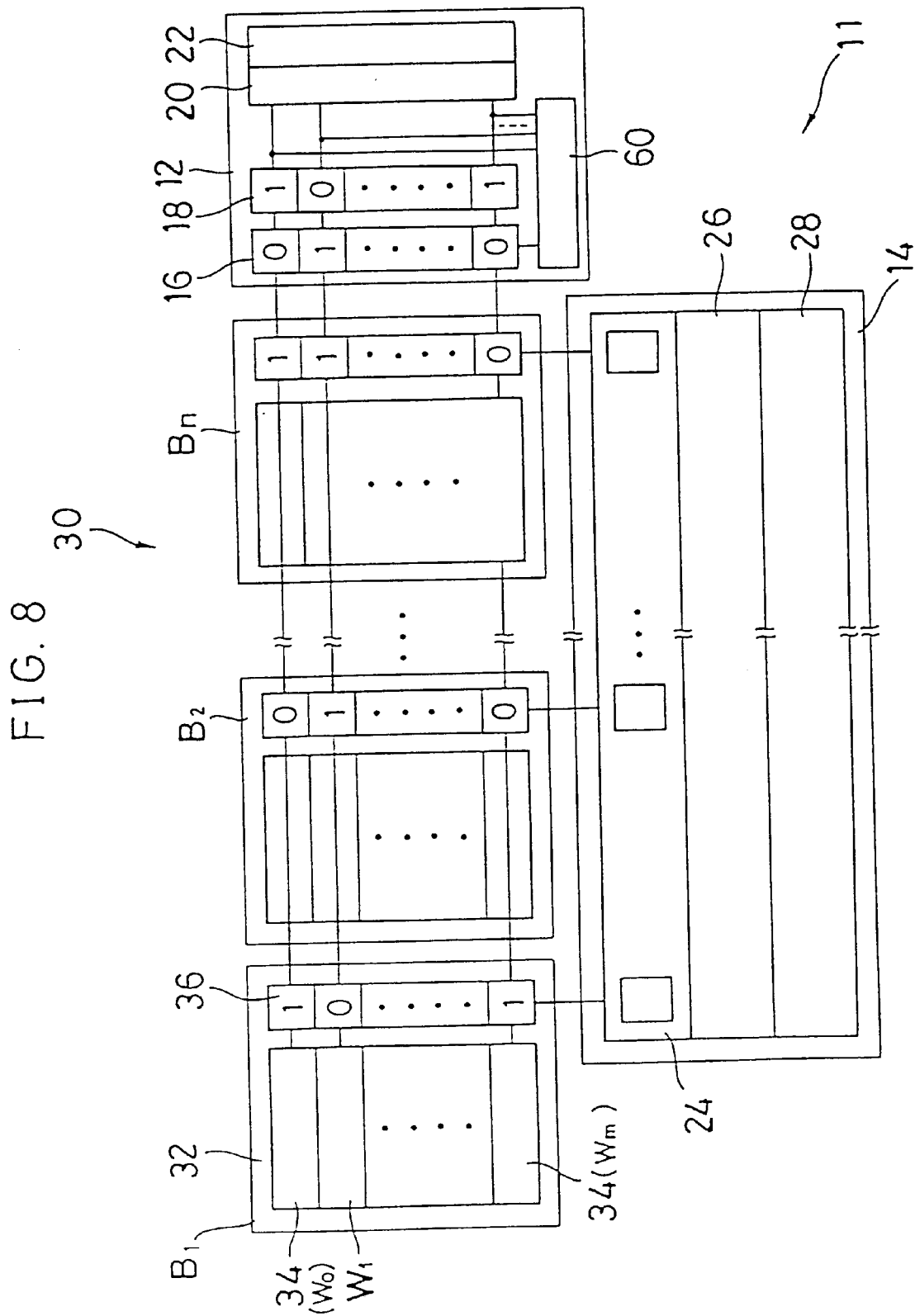
FIG. 8 is a block diagram of another CAM block applicable to the encoder which provides a basis for understanding an associative memory and an encoder according to the present invention.

FIG. 8 is a schematic diagram of a CAM block to which the encoder providing a basis for understanding an associative memory and an encoder according to the present invention is applied.

An encoder 11 of FIG. 8 has a timing control circuit 60 as the semiconductor integrated circuit in a main encoder 12 which provides a basis for understanding an associative memory and an encoder according to the present invention and as it is basically similar in structure to the encoder shown in FIG. 1 except that the output of the timing control circuit is used to set the initial value of the flag register (data latch circuit) 18, like component elements are designated by like reference characters and the detailed description thereof will be omitted.

The encoder 11 of FIG. 8 comprises a priority encoder with a prefetch circuit (hereinafter called "main priority encoder" or "main encoder") 12, and a priority subblock encoder (hereinafter called "subblock priority encoder" or "subblock encoder") 14. The main encoder 12 comprises a prefetch circuit 16, a flag register circuit 18, a priority circuit 20, an encode circuit 22, and a timing control circuit 60. The subblock encoder 14 comprises a latch circuit 24, a priority circuit 26, and an encode circuit 28.

Figure 9:
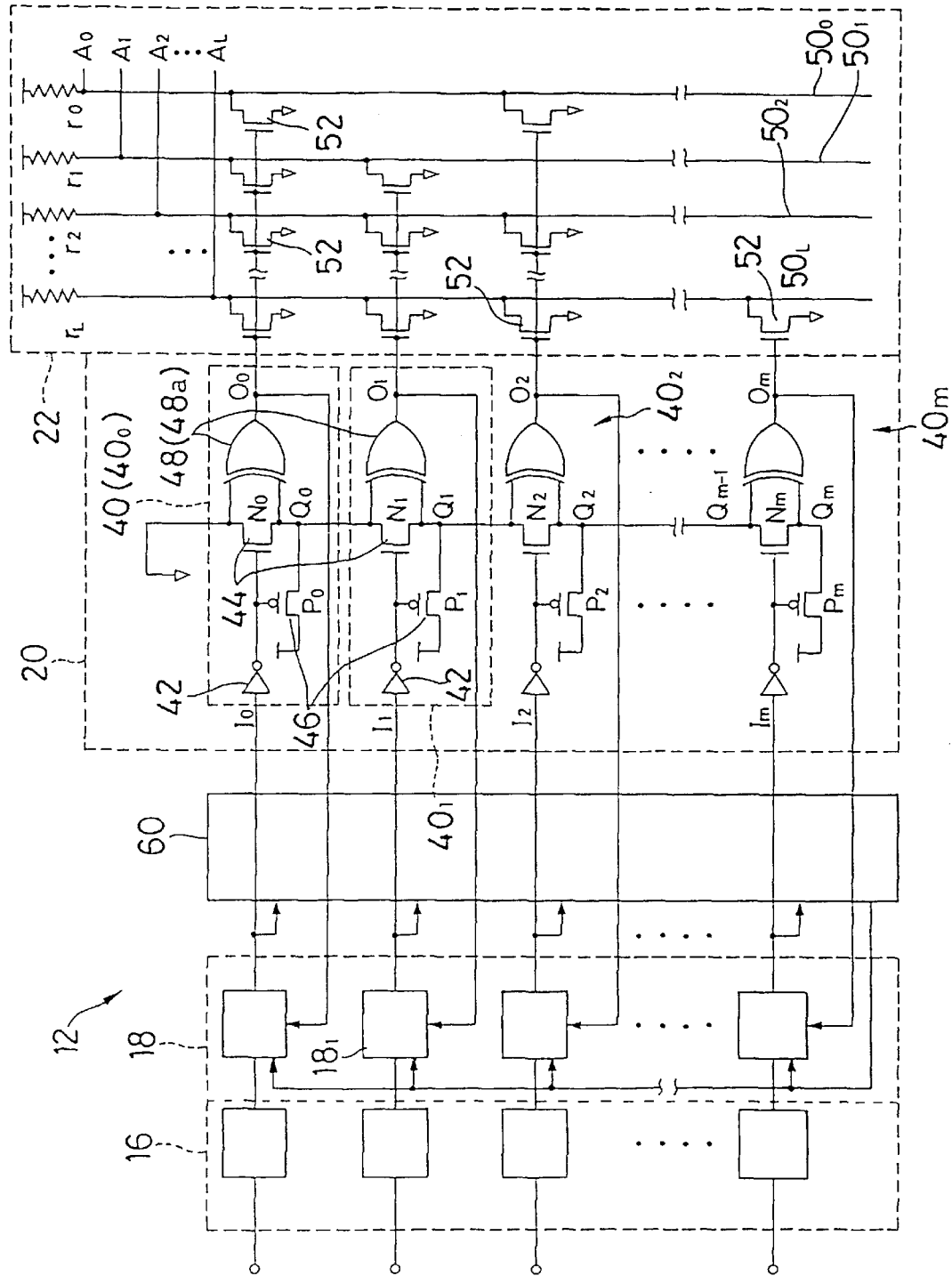
FIG. 9 is a block diagram of another priority encoder with a prefetch circuit for use in the encoder which provides a basis for understanding an associative memory and an encoder according to the present invention.

FIG. 9 is a block diagram of the main encoder 12 which provides a basis for understanding an associative memory and an encoder according to the present invention. In FIG. 9, the prefetch circuit 16 of the main encoder 12 stores the flag data held in the register 36 of the second priority subblock 32 on a word 34 basis ($W_0, W_1, \ldots, W_m$) while the priority circuit 20 and the encoder circuit 22 of the main encoder 12 are encoding the hit signal in the flag data in the first priority subblock 32 and the address of the match word 34 in the order of predetermined priorities. In this case, the prefetch circuit 16 may be any apparatus such as a data latch circuit or a data register as long as it is capable of temporarily holding m+1 of 1-bit data "0" or "1". The flag data from the prefetch circuit 16 is fed by the switch timing output (detection output) of the timing control circuit 60 in parallel to the flag register 18. Moreover, the prefetch circuit 16 fetches the flag data in the second priority subblock 32 selected by the subblock encoder 14 per each word 34 while the flag data is being encoded by the main encoder 12.

More specifically, the timing control circuit 60 in the main encoder 12 as shown in FIG. 9 detects the number of flag data (hit signals), for example, the last one held in the flag register 18, applies a switch timing signal (initial value setting signal) to the flag register 18 and feeds the flag data in the prefetch circuit 16 to the flag register 18. After the last hit signal in the flag data held in the flag register 18 is reset in the case of the main encoder 12 of FIG. 2, termination data "0" as an OR output from the $Q_m$ node of the priority circuit 20 is used to switch the flag data in the flag register 18 over to flag data in the second priority subblock latch-held in the prefetch circuit 16. In other words, OR output "0" of node $Q_m$ is output from the OR output terminal or and inverted by the inverter 49, the inverted value "1" being supplied to the flag register 18. The flag data of the following priority subblock 32 latch-held in the prefetch circuit 16 is fed to (shifted in) the corresponding circuit of the flag register circuit 18 and held therein. Then the flag data in the subsequent priority subblock 32 selected by the subblock encoder 14 beforehand is read from the register 36 and is latch-held to a vacant prefetch circuit in the main encoder 12 of FIG. 9 as well as the main encoder 12 of FIG. 2. The priority circuit 20 thus terminates the processing of the flag data in the first priority subblock and since it need not wait for the flag data in the second priority subblock transferred from the register 36 of the subblock 32, it can perform the encoding operation with efficiency likewise according to the method of the main encoder 12 of FIG. 2. In the main encoder 12 of FIG. 2, however, there occurs a cycle in which the flag data in the subblock is impossible to encode when it is switched in the priority encode cycle started by resetting since the contents of the flag register 18 are switched over to the second priority flag data held in the prefetch circuit after the last hit signal in the flag data in the first priority subblock held in the flag register is reset. As a result, there is produced a time during which no encode output operation can be performed.

In the main encoder 12 of FIG. 9, instead of resetting the last hit signal in the prefetch circuit 20 with the result of detection as an input signal when the last hit signal is detected after the number of hit signals in the flag data in the flag register 18 is detected by means of the timing control circuit 60 to be described below, the flag data in the second priority subblock 32 held in the prefetch circuit 16 is shifted (input) to the flag register 18. With respect to even the flag data in the identical subblock, priority encoding can be carried out in the same cycle even when the flag data in the subblock is varied. Needless to say, the prefetching time (the time required to transfer the flag data from each subblock 32 to the main encoder 12) is made irrelevant to the encoding process by prefetching the flag data in the third priority subblock 32 preselected by the subblock encoder 14 from the register 36 to the prefetch circuit 16 caused to have a free space by switching the flag data in the subblock of the flag register 18 according to the main encoder 12 of FIG. 9 and latch-holding the result. Encoding efficiency can thus be improved. Moreover, the last hit signal in the flag data in the flag register 18 need not be reset.

Figure 10:
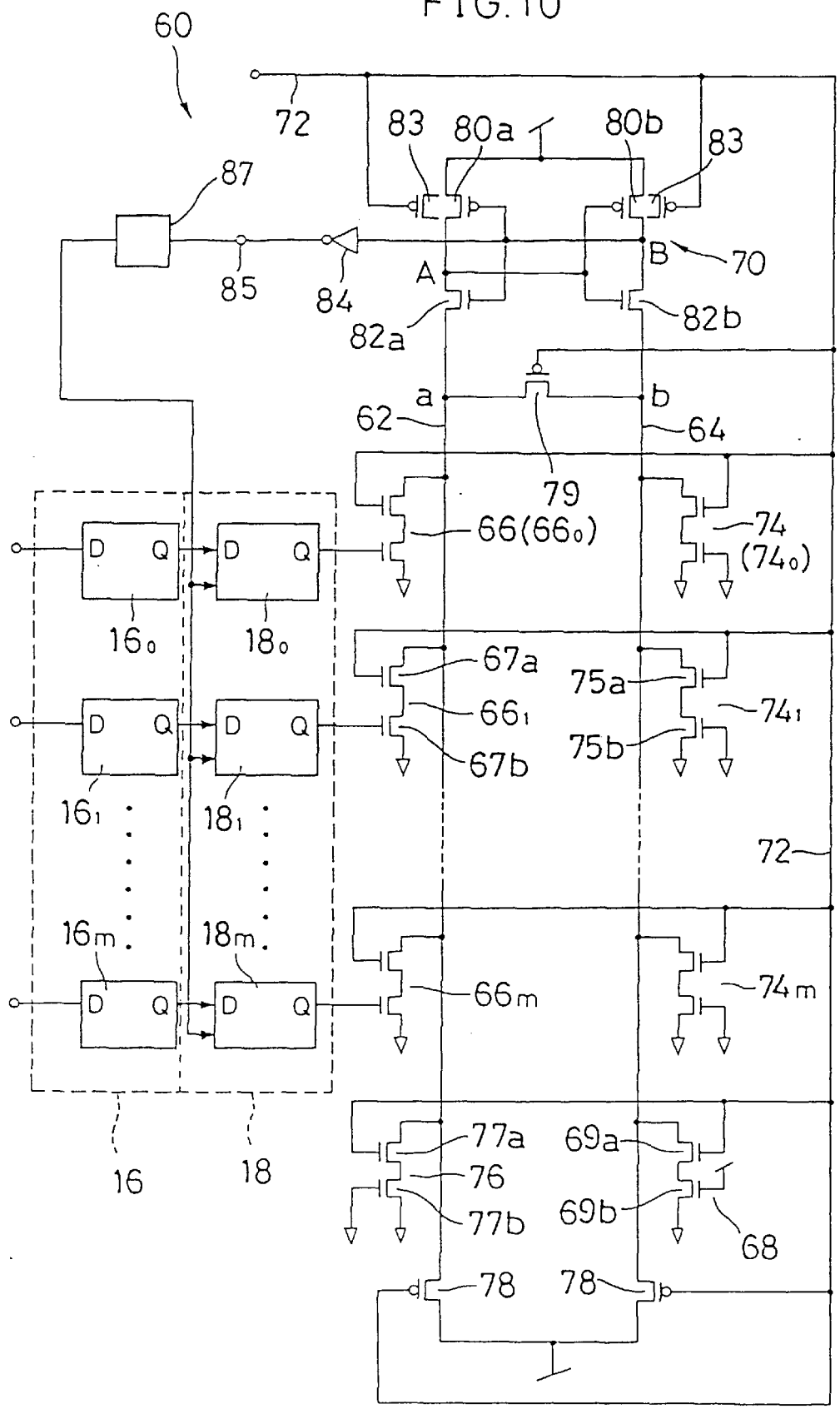
FIG. 10 is a timing control circuit for use in the encoder which provides a basis for understanding an associative memory and an encoder according to the present invention.

FIG. 10 is a circuit diagram of a specific timing control circuit 60 to which the semiconductor integrated circuit providing a basis for understanding an associative memory and an encoder according to the present invention is applied, the semiconductor integrated circuit featuring the encoder 11 of FIG. 8 in the best way.

The timing control circuit 60 of FIG. 10 comprises a first signal line (signal current detection line) 62, a second signal line (reference current drive line) 64, m+1 of current drive circuits (current drive means) $66_0, 66_0, \ldots, 66_m$ provided for respective m+1 of data latch circuits $18_0, 18_1, \ldots, 18_m$ of a flag register 18 in parallel to the first signal line 62, a reference current drive circuit (reference current drive means) 68 provided for the second signal line 64, a differential current detection circuit (differential current detection means) 70 for detecting the difference between the currents flowing through the first and second signal lines 62, 64, that is, detecting the differential current, and a precharge control signal line 72 for controlling the operation timing of the timing control circuit, namely, the current drive circuits 66 ($66_0$, $66_0$, ..., $66_m$), the reference current drive circuit 68 and the differential current detection circuit 70.

In the timing control circuit 60 of FIG. 10, dummy circuits 74 ($74_0$, $74_1$, ..., $74_m$) are provided for the second signal line 64 as those correspond to the current drive circuits 66 ($66_0$, $66_0$, ..., $66_m$) provided for the first signal line 62, whereas a dummy circuit 76 is provided for the first signal line 62 as what corresponds to the reference current drive circuit 68 provided for the second signal line 64. Moreover, one ends of both the first and second signal lines 62, 64 are connected to the differential detection circuit 70. Respective precharge transistors 78 and a transistor 79 for keeping at the same potential are also connected to the signal lines 62 and 64. These transistors 78 and 79 function to initialize both signal lines 62 and 64 to a predetermined potential, for example, 5 V. In this case, the transistors 78, 79 are formed with P-channel MOS transistors and their gate electrodes are connected to the precharge control signal line 72. Moreover, one of the dummy circuits 74 ($74_0$, $74_1$, ..., $74_m$) may be made the reference current drive circuit 68. Then the dummy circuit 76 can be dispensed with.

One of the current drive circuits 66 will be described as what represents them. The current drive circuit 66 comprises a control transistor 67a and a signal voltage application transistor 67b which are formed with two N-channel MOS transistors connected in series. The transistor 67a is connected to the first signal line 62, whereas the transistor 67b is grounded. The gate electrode of the transistor 67a is connected to the control signal line 72 and the gate electrode of the transistor 67b to the output terminal Q of the corresponding data latch circuit of the flag register 18.

The transistor 67a of the current drive circuit 66 is held ON at the time of detection and when a hit signal "1" is applied from the flag register 18 to the gate electrode of the transistor 67b, the transistor is turned on and causes a predetermined current $i_0$ to flow. The drive current $i_0$ is arranged so as to make it has the same intensity in all of the current drive circuits $66_0$, $66_0$, ..., $66_m$, though it slightly varies to an extent resulting from the variations of the transistors 67a, 67b for use, for example, variation in process. The dummy circuit 74 is also similar in structure to the current drive circuit 66 and comprises two N-channel MOS transistors 75a, 75b with one end connected to the second signal line 64, the other being grounded. The gate electrode of the transistor 75a is connected to the control signal line 72 likewise, whereas the gate electrode of the transistor 75b is grounded so that it is not allowed to be turned on at all times.

On the contrary, the reference current drive circuit 68 is used for causing a predetermined reference current ir to flow through the second signal line 64 and provided with two N-channel transistors 69a, 69b connected in series. The transistor 69a is connected to the second signal line 64 and its gate electrode to the control signal line 72. The transistor 69b is grounded and its gate electrode is connected to the power supply at H (high) potential so that it is held ON at all times. On the other hand, the dummy circuit 76 comprises N-channel MOS transistors 77a, 77b similar in structure to those in the dummy circuit 74 except that it is connected to the first signal line 62. The reference current value $i_r$ may properly be determined according to the value $i_0$ of the current that can be made to flow by the current drive circuit 66 ($66_0$, $66_0$, ..., $66_m$) and the number of hit signals to be detected, and may be greater than $i_0$ but less than $2i_0$ and the value at which the differential current detection circuit 70 to be described below is able to detect the differential current in order for the last one of the hit signal to be detected. The current value $i_r$ may be determined in consideration of the variations of the circuit elements such as the component transistors 67a, 67b, 69a, 69b, and may preferably be $i_r=1.2i_0-1.8i_0$, for instance.

The differential current detection circuit 70 detects the intensity of the current flowing down both signal lines 62 and 64 and is a current drive type latch circuit for latch-holding the great side of the flowing current at L (low) and the small side thereof at H (high). The differential current detection circuit 70 comprises P-channel MOS transistors (PMOSs) 80a, 80b connected to the power supply at the same potential as the potential at the other ends of both signal lines 62 and 64, for example, 5 V, N-channel MOS transistors (NMOS) 82a, 82b connected to the above-noted transistors in series, and two precharge transistors 83 as PMOSs. The gate electrodes of the transistors 82a and 80a connected to the first signal line 62 are connected to each other and also to the contact B between the transistors 80b and 82b. Moreover, the gate electrodes of the transistors 82b and 80b connected to the second signal line 64 are connected to each other and also to the contact A between the transistors 80a and 82a. An output line extends from the contact B and is connected via an inverter 84 to an output terminal 85.

Subsequently, the detecting operation of the timing control circuit 60 will be described as a representative example in a case where the last one of the hit signal of the flag data in the flag register 18, that is, the last hit signal is detected. In this case, flag data having a plurality of hit signals ("1") is held in the flag register 18 on the assumption that the reference current $i_r$ is 1.5 times as great as the drive current $i_0$ of one current drive circuit 66, that is, set at 1.5 $i_0$.

With the precharge control signal line 72 at L (low: "0"), both precharge transistors 78 and the transistor 79 are first turned on to precharge the first and second signal lines 62 and 64, consequently contacts a and b at H (high) potential (e.g., 5 V). Further, both precharge transistors 83 and the transistors 80a, 80b are turned on to precharge the contacts A and B within the differential current detection circuit 70 at H (high) potential (e.g., 5 V) likewise. Incidentally, the transistors 82a, 82b of the differential current detection circuit 70, the transistors 67a of all current drive circuits 66 and the transistor 68a of the reference current drive circuit 68 are held off.

With the precharge control signal line 72 at H (high: "1"), the PMOS transistors 78, 79, 80a, 80b, 83 are subsequently turned off, whereas the NMOS transistors 67a, 69a, 75a, 77a are turned on. Both the two transistors 69a, 69b of the reference current drive circuit 68 are turned on accordingly and the reference current $i_r$ (=1.5 $i_0$) flows through the second signal line 64 to lower the potential of the contact b. On the other hand, the transistor 67b having the gate electrode connected to the data latch circuit 18j of the flag register 18 whose flag data has the hit signal "1" out of m+1 of current drive circuits 66 ($66_0$, $66_0$, ..., $66_m$) is turned on and the transistor 67a is held on, whereby the drive current $i_0$ flows from the first signal line 62 through the current drive circuit 66j. Since the flag data in the flag register 18 has a plurality of hit signals "1", for example, k (k≧2) of hit signals in this case, current of $ki_0$ flows through the first signal line 62 and the potential of the contact a drops accordingly.

When k is greater than 2, the potential of the contact a drops faster than that of the contact b because current $ki_0$ flowing through the first signal line 62 is greater than the reference current $i_r$ (=1.5 $i_0$) flowing through the second signal line 64. When the difference between the gate potential (potential at the contact B) of NMOS 82a and the source potential (potential of the contact a) becomes greater than the substrate-biased threshold voltage (e.g., 1.4 V) of NMOS 82a, that is, the potential of the contact a becomes lower than 3.6 V, NMOS 82a is turned on and the potential of the contact A drops. However, the potential of the contact b has not yet so much lowered as to turn on NMOS 82a, which remains in the off state accordingly. Although the current flows through both signal lines 62 and 64 then to cause the potential at the contacts A and a to drop further, NMOS 82b keeps the off state as the potential drop at the contact A is greater than the potential drop at the contact b. The contact A thus turns to "0". On the other hand, the contact B remains at "1" and the output of the inverter 84 keeps "1".

As the plurality of hit signals "1" within the flag register 18 are encoded, they are reset to "0" one after another. When the number of remaining hit signals comes up to one, the timing control circuit 60 performs the detecting operations, that is, first precharges the precharge control signal line 72 by applying "0" and then applying "1" thereto, thus causing the current $i_0$ and the reference current $i_r$ (=1.5 $i_0$) to flow through the first and second signal lines 62, 64 likewise, respectively. Since the current flowing through the second signal line 64 is greater at this time, the potential of the contact b drops faster than that of the contact a and NMOS 82a conversely keeps the off state, whereas NMOS 82b is held ON. Consequently, the potential of the contact B drops, and the signal thereat is inverted by the inverter 84, whereby "1" is output from the output terminal 85.

Further, it is significantly important that both signal lines 62 and 64 being precharged beforehand at the supply potential (e.g. 5 V) in order to obtain stable operation of the differential current detection circuit 70. That is, since a time margin is available before the charge of either signal line 62 or 64 drops to the operation potential 3.6 V of the differential current detection circuit 70, the latch type differential current detection circuit can have a spare time for the operation timing which enables elimination of such effects as switching noises of control line.

As a result, it is apparent that more than one hit signal "1" is held in the flag register 18 if the output signal from the output terminal 85 of the timing control circuit 60 is "0" and the number of hit signals is one or less if the output signal is "1". When the output signal is changed from "0" to "1", the result of detection, for example, the "1" signal or the signal change may be used to switch the flag data in the flag register 18 over to what is in the prefetch circuit 16. Needless to say, the output signal may be fetched from the contact A.

Figure 11:
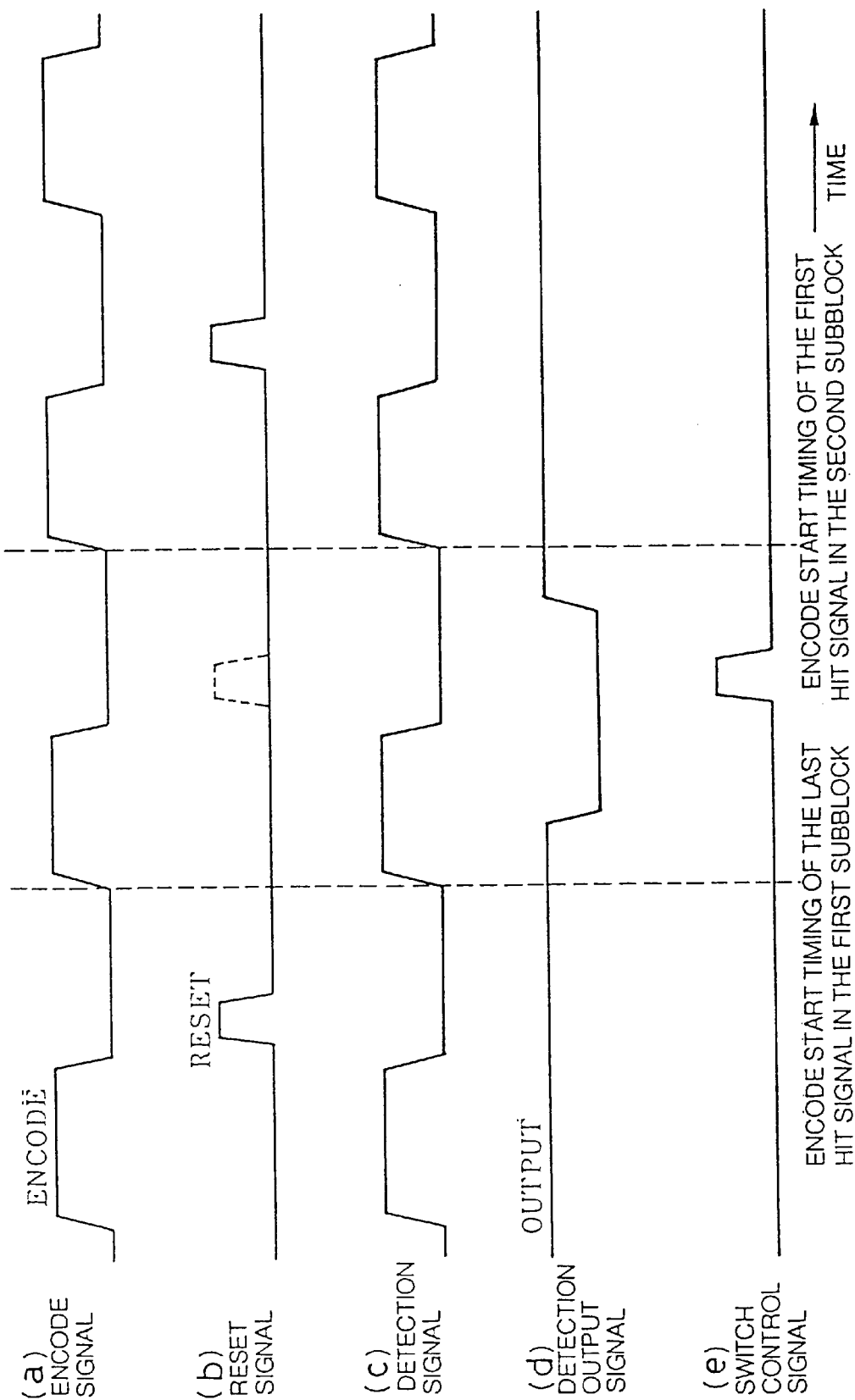
FIG. 11 is a time chart showing timing in each portion of the priority circuit with a prefetch circuit for use in the encoder which provides a basis for understanding an associative memory and an encoder according to the present invention.

FIG. 11 shows an encode time chart using the timing control circuit 60.

In FIG. 11, (a) represents an encode timing in the main encoder 12; (b) a reset timing of the hit signal "1" in the flag register 18; (c) detection timing in the timing control circuit 60; (d) variation of the output signal of the timing control circuit 60; and (e) timing at which the flag data in the prefetch circuit 16 is shifted to the flag register 18.

While the hit signal in the same flag data held in the flag register 18 is being encoded with the predetermined priority, it has been so arranged that the encode cycle is started (rise) after a passage of fixed time followed from the rise timing of the reset pulse of the hit signal. When, however, the timing control circuit 60 detects the last hit signal at the detection timing activated by the encode pulse, with the output signal (d) changed from "0" to "1", a pulse circuit 87 of FIG. 10 generates pulse for alternatively feeding the flag data in the prefetch circuit 16 to the flag register 18 with the timing at which the reset pulse should have been generated so as to switch the flag data in the flag register 18. Moreover, the flag data is used to make the priority circuit 20 and the encode circuit 22 perform the encode operation in the continuous encode cycle to output an encode address. The main encoder 12 thus performs the encode operation in the predetermined continuous cycle and produces an encode output. The main encoder 12 is basically arranged as stated above.

As previously noted, the encoder shown in FIG. 8 has the effect, in addition to what has been achieved in the aforementioned encoder of FIG. 1, of starting the encoding of the flag signal data in the second priority subblock that has previously been fed to the prefetch circuit in the continuous cycle after the priority encoder terminates the encoding the hit signal by means of a data switch timing control circuit, encoding the data and outputting a word address.

With the encoder shown in FIG. 8, the memory block, though it is provided with the plurality of CAM subblocks, can encode output signals from a number of CAM subblocks efficiently in the continuous cycle without subblock-to-subblock switch delay (switch time). Consequently, this encoder is applicable to a content addressable bulk memory which has the CAM block comprising the plurality of CAM subblocks and is required to process mass data at high speed.

With the semiconductor integrated circuit which provides a basis for understanding an associative memory and an encoder according to the present invention, it is possible to detect accurately and quickly the fact that the number of data "0" or "1" fed to the current drive means has reached a preset value.

Figure 12:
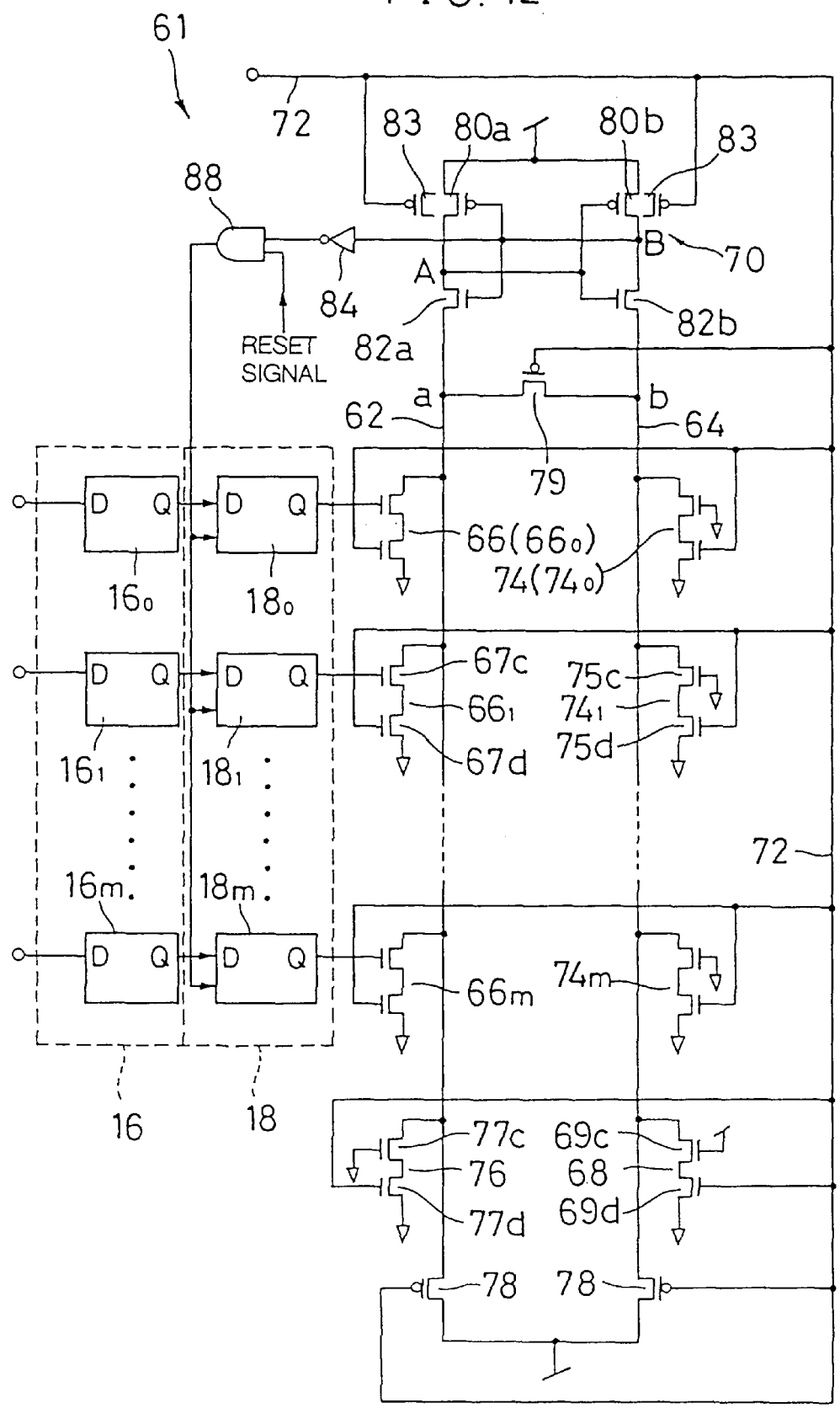
FIG. 12 is a block diagram of another timing control circuit as a semiconductor integrated circuit which provides a basis for understanding an associative memory and an encoder according to the present invention.
Figure 13:
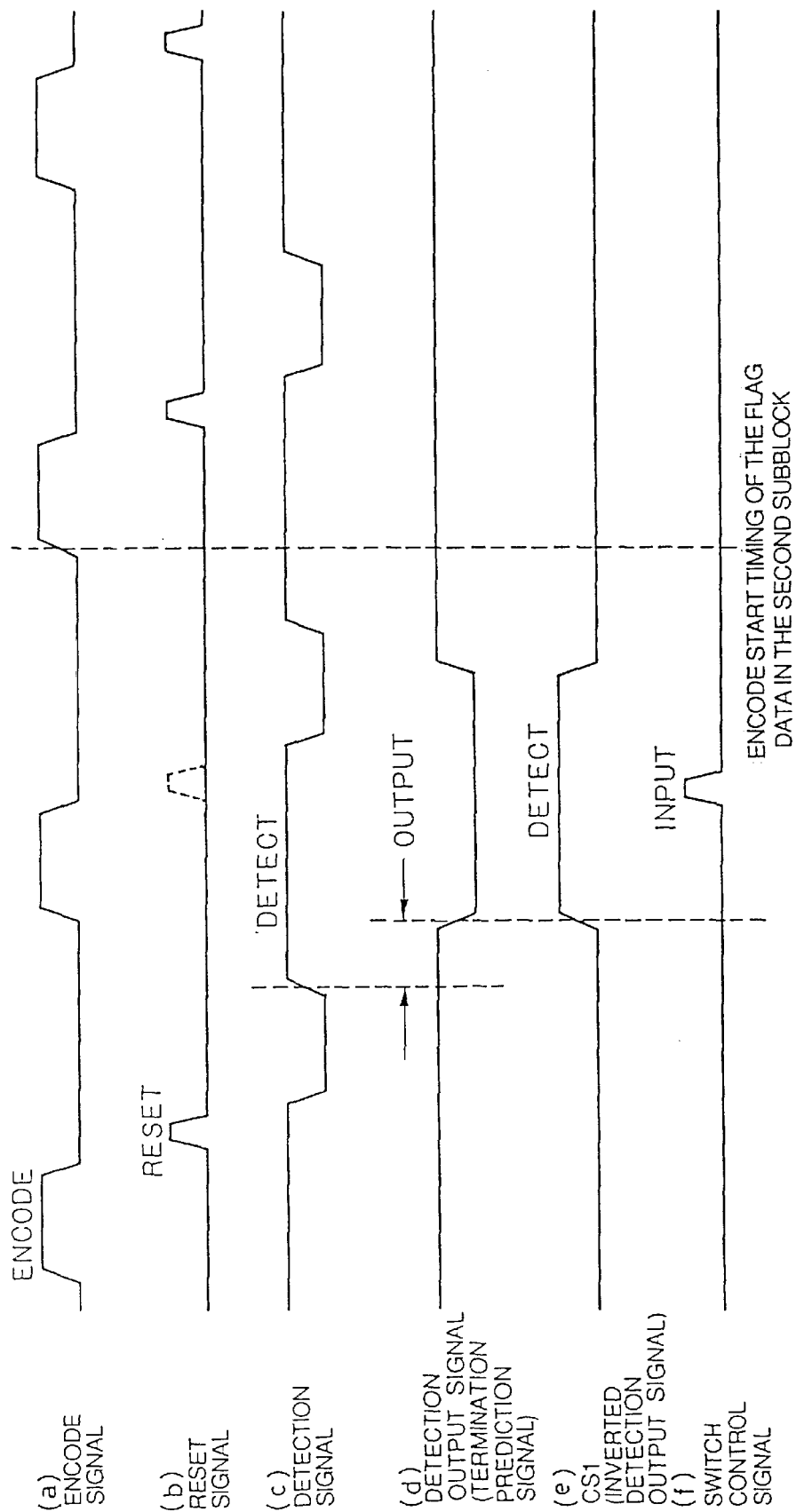
FIG. 13 is a time chart showing timing in each portion of the priority circuit with a prefetch circuit for use in the encoder to which the semiconductor integrated circuit providing a basis for understanding an associative memory and an encoder according to the present invention is applied.

Referring to FIGS. 12–14, a semiconductor integrated circuit which provides a basis for understanding an associative memory and an encoder according to the present invention will be described in detail.

This semiconductor integrated circuit is applicable to the encoder shown in FIG. 8 as a number detection circuit for timing control.

In the semiconductor integrated circuit, there is preset the reference current $i_r$ made to flow in the reference current drive means provided on the reference current drive line as the second signal line in accordance with the number of data ko (M>$k_0 \geq 0$) desired to be detected out of the data "1" or "0" fed to data input lines for respectively controlling M (M$\geq$1) provided in parallel on the first signal line, or the signal current detection line, that is, a current value ($k_0 i_0 < i_r <$ ($k_0$+1) $i_0$) greater by ko times and smaller by $k_0$+1 times than the current value $i_0$ flowing through one current drive means. Each current drive means of the semiconductor integrated circuit has a signal voltage application transistor whose gate electrode is connected to the data input line and a control transistor for controlling the operating time of the semiconductor integrated circuit, the signal voltage application transistor being provided on the signal current detection line side.

Therefore, In the semiconductor integrated circuit of FIG. 12, the control transistors of the whole current drive means as well as those of the reference current drive means are controlled according to the operating timing. When these transistors are turned on, the current flows through the current drive means as all the signal voltage application transistors of the current drive means with the data input line supplied with desired data, whereby current i (i=ki$_0$) in proportion to the number k (M>k≧0) flows through the signal current detection line. On the other hand, the reference current value i$_r$ is caused by the reference current drive means to flow through the reference current drive line. The differential current detection means detects the differential current between the values i and i$_r$ of the current flowing through both the signal lines and outputs the inversion of the differential current, that is, the inverted (timing) with respect to the size relation between both the current value i and i$_r$. It is thus detected that the number k of desired data out of those fed to the respective input lines has reached the preset value k$_0$. The semiconductor integrated circuit of FIG. 12 is capable of detecting the number of desired data fed to the data input lines.

With the control transistor of the current drive means provided closer to the current signal detection line than the signal voltage application transistor, the semiconductor integrated circuit is set at the operating timing even though the data fed to the data input line is not what has been desired while the signal voltage application transistor is held OFF. Since current temporarily flows from the signal current detection line to the control transistor, the current also flows into the signal current detection line at the time the operation is started. The difference between the current flowing through the detection line when the detection is required and what flows through the reference current drive line decreases accordingly and this makes it difficult to detect the inversion of the differential current by means of the differential current detection means. No accurate detecting operation may be performed stably in that case because of noise.

Since the signal voltage application transistor is provided closer to the signal current detection line than the control transistor in the semiconductor integrated circuit, the current will not flow from the signal current detection line unless the signal voltage application transistor is turned on even if the control transistors of the whole current drive means are turned on. Therefore, the differential current between the current flowing through the signal current detection line and the reference current because of the voltage application transistor that has been turned on can be detected clearly to a degree even when the detection thereof is needed. As a result, the inversion of the differential current can be detected by the differential current detection means quickly and stably with accuracy.

FIG. 12 shows a specific circuit diagram of a timing control circuit 61 to which the semiconductor integrated circuit providing a basis for understanding an associative memory and an encoder according to the present invention is applied. The timing control circuit 61 of FIG. 12 is applied to the encoder 11 shown in FIG. 8 and as it is exactly the same in structure as the timing control circuit 60 of FIG. 10 except for the configuration of the signal voltage application transistor 67c and the control transistor 67d of the current drive circuit 66, and that of the transistors 69c and 69d of the reference current drive circuit 68, like component elements are designated by like reference characters and the detailed description thereof will be omitted.

One of the current drive circuits 66 which best features the timing control circuit 61 of FIG. 12 will be described as what represents them. The current drive circuit 66 comprises a signal voltage application transistor 67c and a control transistor 67d which are formed with two N-channel MOS transistors connected in series. The signal voltage application transistor 67c is connected to the first signal line 62, whereas the control transistor 67d is grounded. The gate electrode of the signal voltage application transistor 67c is connected to the output terminal Q of the corresponding data latch circuit of the flag register 18 and the gate electrode of the transistor 67d to the control signal line 72.

The control transistor 67d of the current drive circuit 66 is held ON at the time of detection and when a hit signal "1" is applied from the flag register 18 to the gate electrode of the signal voltage application transistor 67c, the signal voltage application transistor 67c is turned on and causes a predetermined current i$_0$ to flow. The drive current i$_0$ is arranged so as to make it has the same intensity in all of the current drive circuits 66$_0$, 66$_0$, . . . , 66$_m$, though it slightly varies to an extent resulting from the variations of the transistors 67a, 67b for use, for example, variation in process. The dummy circuit 74 is also similar in structure to the current drive circuit 66 and comprises two N-channel MOS transistors 75c, 75d with one end connected to the second signal line 64, the other being grounded. The gate electrode of the grounded transistor 75d is connected to the control signal line 72 likewise, whereas the gate electrode of the transistor 75c on the side of the second signal line 64 is grounded so that it is not allowed to be turned on at all times.

On the contrary, the reference current drive circuit 68 is used for causing the predetermined reference current i$_r$ to flow through the second signal line and provided with two N-channel transistors 69c, 69d connected in series. The transistor 69c is connected to the second signal line and its gate electrode to the power supply at H (high) potential so that it is held ON at all times. The transistor 69d is grounded and its gate electrode is connected to the control signal line 72. Moreover, the dummy circuit 76 of the reference current drive circuit 68 is connected to the first signal line 62. The reference current value i$_r$ may properly be determined according to the value i$_0$ of the current that can be made to flow by the current drive circuit 66 (66$_0$, 66$_1$, . . . , 66$_m$) and the number of hit signals to be detected, and may be greater than i$_0$ but less than 2i$_0$ and the value at which the differential current detection circuit 70 to be described below is able to detect the differential current in order for the last one of the hit signal to be detected. The current value i$_r$ may be determined in consideration of the variations of the circuit elements such as the component transistors 67c, 67d, 69c, 69d, and may preferably be i$_r$=1.2i$_0$–1.8i$_0$, for instance.

An output line is extended from the contact B of the differential detection circuit 70 and connected via an inverter 84 to an AND circuit 88. The reset signal of the flag register 18 is applied to one input of the AND circuit 88. The output of the AND circuit 88 is connected to the clock terminal of the flag register 18.

Subsequently, the detecting operation of the timing control circuit 61 will be described as a representative example in a case where the last one of the hit signal of the flag data in the flag register 18, that is, its last hit signal is detected. In this case, flag data having a plurality of hit signals ("1") is held in the flag register 18 on the assumption that the reference current i$_r$ is 1.5 times as great as the drive current i$_0$ of one current drive circuit 66, that is, set at 1.5 i$_0$.

With the precharge control signal line 72 at L (low: "0"), both precharge transistors 78 and the transistor 79 are first turned on to precharge the first and second signal lines 62 and 64, consequently contacts (nodes) a and b at H (high) potential (e.g., 5 V). Further, both precharge transistors 83 are turned on to precharge the contacts A and B within the differential current detection circuit 70 at H (high) potential (e.g., 5 V) likewise. Incidentally, the transistors 82a, 82b of the differential current detection circuit 70, the transistors 67d of the whole current drive circuit 66 and the transistor 69d of the reference current drive circuit 68 are held off.

With the precharge control signal line 72 at H (high: "1"), the PMOS transistors 78, 79, 83 are subsequently turned off, whereas the NMOS transistors 67d, 69d, 75d, 77d are turned on. Both the two transistors 69c, 69d of the reference current drive circuit 68 are turned on accordingly and the reference current $i_r$ (=1.5 $i_0$) flows through the second signal line 64 to lower the potential of the contact b. On the other hand, the transistor 67c having the gate electrode connected to the data latch circuit 18j of the flag register 18 whose flag data has the hit signal "1" out of m+1 of current drive circuits 66 ($66_0$, $66_0$, . . . , $66_m$) is turned on and the control transistor 67d is held on, whereby the drive current $i_0$ flows from the first signal line 62 through the current drive circuit 66j. Since the flag data in the flag register 18 has a plurality of hit signals "1", for example, k (k≧2) of hit signals in this case, current of k$i_0$ flows through the first signal line 62 and the potential of the contact a drops accordingly.

When k is greater than 2, the potential of the contact a drops faster than that of the contact b because current k$i_0$ flowing through the first signal line 62 is greater than the reference current $i_r$ (=1.5 $i_0$) flowing through the second signal line 64. When the difference between the gate potential (potential at the contact B) of NMOS 82a and the source potential (potential of the contact a) becomes greater than the substrate-biased threshold voltage (e.g., 1.4 V) of NMOS 82a (for example, the potential of the contact a drops up to 3.6 V when the potential of the contact B is 5 V), NMOS 82a is turned on and the potential of the contact A drops. However, the potential of the contact b has not yet so much lowered as to turn on NMOS 82b, which remains in the off state accordingly. Although the current flows through both signal lines 62 and 64 then to cause the potential at the contacts A and a to drop further, NMOS 82b keeps the off state as the potential drop at the contact a, that is, at the contact A is greater than the potential drop at the contact b. The contact B thus keeps "1" and "0" is applied by the inverter 84 connected thereto to the AND circuit 88. On the other hand, the contact A remains at "0".

As the plurality of hit signals "1" within the flag register 18 are encoded, they are reset to "0" one after another. When the number of remaining hit signals comes up to one, the timing control circuit 61 shown in FIG. 12 performs the detecting operation, that is, first precharges the precharge control signal line 72 by applying "0" and then applying "1" thereto, thus causing the current $i_0$ and the reference current $i_r$ (=1.5 $i_0$) to flow through the first and second signal lines 62, 64 likewise, respectively. Since the current flowing through the second signal line 64 is greater at this time, the potential of the contact b drops faster than that of the contact a and NMOS 82a conversely keeps the off state, whereas NMOS 82b is held ON. Consequently, the potential of the contact B drops to the low level and inverted by the inverter 84 so that "1" is applied to the AND circuit 88. The potential of the contact A is maintained at H (high) potential.

As a result, it is apparent that more than one hit signal "1" is held in the flag register 18 if the output signal from the inverter 84 of the timing control circuit 61 of FIG. 12 is "0" and the number of hit signals is one or less if the output signal is "1". When the output signal is changed from "0" to "1", the result of detection, that is, a switch control signal is obtainable from the "1" signal and the reset signal of the flag register 18 by means of the AND circuit 88. Further, this switch control signal may be used to switch the flag data in the flag register 18 over to the flag data in the prefetch circuit 16. Needless to say, the output signal may be fetched from only the contact A or both contacts A and B.

As previously noted, the timing control circuit 60 of FIG. 10 is exactly the same as the timing control circuit 61 of FIG. 12 except for the reversed arrangement of the control transistor 67a and the signal voltage application transistor 67b in the current drive circuit 66 ($66_0$, $66_1$, . . . , $66_m$) and that of the control transistor 75a and the gate-grounded transistor 75b in the dummy circuit 74 ($74_0$, $74_1$, . . . , $74_m$). It is thus detectable when the number of hit signals applied to the gate electrode of the signal voltage application transistor 67b and held by the data latch circuit of the flag register 18 has reached the predetermined value, for example, ultimately one.

When the timing detecting operation is started in both timing control circuits 60 and 61, the current corresponding to the number of hit signals ("1") in the flag register 18 flows into the signal current detection line (the first signal line) 62 and the predetermined reference current into the reference current drive line (the second signal line) 64. Therefore, the differential current detection circuit 70 detects the small potential difference between the contacts a, b resulting from the difference between the currents flowing through both signal lines 62 and 64 as a great potential difference at the contacts A, B one side of which (high potential sides of the contacts a, b) is held at the precharge voltage (e.g., $V_{dd}$), the other side (low potential sides thereof) being lowered up to the ground level (e.g., 0 V.

The subsequent changes of the contacts A and B precharged at the same potential (e.g., $V_{dd}$=5 V) are determined by which one of the transistors 82a and 82b is turned on. In other words, the current flows through the first and second signal lines 62 and 64 during the operation of timing detection, thus causing the potentials of the contacts a and b of both signal lines 62, 64 to drop as previously noted. When either one of the potential difference between the contacts B and a and the potential difference between the contacts A and b exceeds the substrate-biased threshold value (e.g., 1.4 V), that is, when either one of the potentials of both signal lines 62 and 64 (those of the contacts a and b) drops beyond the threshold value (e.g., 1.4 V)(to lower than 3.6 V), one of the transistors 82a and 82b is turned on. As a result, the contact A or B on the side of the energized transistor 82a or 82b immediately becomes equal in potential to the contact a or b thus lowered and lowers up to the ground level (0 V together. On the other hand, the contact A or B on the side of the de-energized transistor 82a or 82b is maintained at the precharged potential (5 V).

It is thus possible to detect the predetermined number of hit signals (e.g., ultimately only one) by making the potential of the contact B a detection signal and by taking out the output signal via the inverter 84. In other words, the transistor 82b is turned on as the inverter 84 has been connected to the tip of the contact B and the potential of the contact B then drops. When the potential becomes lower than the threshold value (e.g., about 2.5 V) of the inverter 84, the output signal "1" is obtained.

If the potential difference between the contacts a and b is excessively small when the contacts A and B branch off in the differential current detection circuit 70, the ON-operation of the transistors 82a and 82b becomes irrelevant to the potential difference between the contacts a, b, that is, the possibility of malfunction increases. Therefore, the greater the potential difference between both contacts a and b, the less the transistors may be seriously affected thereby. Stable accurate timing detection is thus always assured. In the timing control circuit 60 of FIG. 10, however, the control transistor 67a of the current drive circuit 66 is connected to the first signal line 62 as the signal current detection line; the other electrode of the signal voltage application transistor 67b connected to the control transistor 67a in series; the control transistor 75a of the dummy circuit 74 is connected to the second signal line as the reference current drive line; and the other electrode of the gate-grounded transistor 75b connected to the control transistor 75a in series is grounded. When the precharge operation of the precharge control signal line 72 at low (L: "0") level is changed to the timing detecting operation at high (H: "1") level, the control transistor 67a of the current drive circuit 66 is turned on, despite the data held in each data latch circuit 18j (j=0, ..., $_m$) of the flag register 18 and there occurs the temporary inflow of charge between the control transistor 67a and the signal voltage application transistor 67b. Likewise, the control transistor 75a of the dummy circuit 74 is turned on and there occurs the temporary inflow of charge between the control transistor 75a and the gate-grounded transistor 75b.

As a result, the current flows from the first and second signal lines 62 and 64 into the current drive circuit 66 and the control transistors 67a and 75a of the dummy circuit 74 in the initial stage of the timing detecting operation as shown in FIG. 14(b) and the potentials of the contacts a and b of the respective signal lines 62, 64 simultaneously drop. If the number of data latch circuits of the flag register 18 and the number of corresponding current drive circuits 66 and dummy circuits 74, the current flowing through the first and second signal lines 62 and 64 increases in the initial stage of detection, thus causing the potentials of the contacts a and b to drop simultaneously and sharply. Consequently, the potential difference between the contacts a and b slowly develops when the signal voltage application transistor 67b is turned on, and the then potentials of both tends to become low; in other words, their potentials lower beyond the predetermined value (e.g., 3.6 V) of the potential of either signal line 62 or 64 (either contacts a or b). The potential difference between the contacts a and b becomes small when either transistor 82a or 82b is turned on.

In the timing control circuit 61, however, the signal voltage application transistor 67c of the current drive circuit 66 is provided on the side of the first signal line 62 and the control transistor 67d on the grounding side, whereas the gate-grounded transistor 75c of the dummy circuit 74 is connected to the second signal line and the control transistor 75d on the grounding side. Therefore, not only the whole control transistor 67d of the current drive circuit 66 but also the whole control transistor 75d of the dummy circuit 74 is not turned on unless the signal voltage application transistor 67c is turned on even though the timing detecting operation is started. Therefore, no current for charging the control transistors 67d, 75d is allowed to flow through both signal lines 62, 64 in the initial stage of the detecting operation. In consequence, the signal voltage application transistor 67c and the control transistor 67d of every current drive circuit 66 corresponding to the data latch circuit of the flag register 18 holding the hit signal "1" are only turned on; only the current in proportion to the number of them flows through the first signal line 62. Then only the transistors 69c, 69d of the reference current drive circuit 68 are turned on, so that only the reference current flows through the second signal line 64. The potential difference between the contacts a and b is produced immediately after the detecting operation, that is, at a point of time the potential of both contacts a, b slightly drops as shown in FIG. 14(a), whereby the potential difference between both contacts can be secured by a large margin when the potential of either contact a or b drops under the predetermined value (e.g., 3.6 V).

In the timing control circuits 60 and 61 shown in FIGS. 10 and 12, the potential difference between both contacts a and b differs when either contact a or b drops under the predetermined value (e.g., 3.6 V). Referring to the examples (a) and (b) shown in FIG. 14 (examples of the timing control circuits 61 and 60 of FIGS. 12 and 10, respectively), the potential difference between the contacts a and b is about 0.3 V in the case of FIG. 14(a), whereas it is about 0.1 V in the case of FIG. 14(b), at the point of time the contact b drops under 3.6 V at which the contacts A and B start branching off. This means the timing control circuit 61 shown in FIG. 14(a) has a greater noise margin and consequently the differential current detection circuit 70, even if subjected to noise influence, may less malfunction to ensure accurate stable timing detection at all times.

Further, for contacts a and b of FIG. 14, a large potential difference between contact a and b is available at the occasion potential of the contacts a or b drops to 3.6 V by precharging both signal lines 62 and 64 beforehand. However, normal operation of the contacts a and b can not be expected due to no potential difference is available in case of both signal lines 62 and 64 are not precharged beforehand. Accordingly, it is important to operate the contacts a and b of FIG. 14 after precharging of the signal lines.

FIGS. 14(a) and (b) show detection timing (variation of voltage on the precharge control signal line 72) in the respective timing control circuits 61 and 60, with the supply voltage ($V_{dd}$) at 5 V, with the number m+1 of current drive circuits 66 and dummy circuits 74 being 256 and with the reference current $i_r$ being 1.5 $i_0$; detection timing when the last one of the hit signal "1" is held in the flag register 18; variations of the potentials of the contacts a, b and A, B; and the output signal of the inverter 84.

The timing control circuit 61 is basically arranged as stated above.

FIG. 13 is a time chart illustrating encode timing in the main encoder 12 of the encoder 11 of FIG. 8 using timing control circuit 61.

In FIG. 13, (a) represents an encode signal indicating encode timing in the main encoder 12; (b) a reset pulse indicating the reset timing of the hit signal "1" in the flag register 18; (c) a detecting operation signal (voltage applied to the precharge control signal line 72) indicating the detecting operation timing in the timing control circuit 61 of FIG. 12; (d) a detection output signal indicating variation of the potential at the contact B of the timing control circuit 61; (e) the output signal resulting from inverting the detection output signal of (d) by means of the inverter 84; and (f) a flag data switch control signal showing the timing at which the flag data in the prefetch circuit 16 is shifted to the flag register 18.

While the hit signal in the same flag data held in the flag register 18 is being encoded with the predetermined priority, that is, if the detection output signal (d) is at (H) high level, it has been so arranged that the encode cycle is started (rise) after a passage of fixed time from the rise timing of the reset pulse (b) of the hit signal. When, however, the timing control circuit 61 detects the last hit signal at the detection timing activated by the encode pulse (a), with the detection output signal (d) changed from high (H) level "1" to low (L) level "0", the inverted output signal (e) is changed from "0" to "1". In this case, the AND circuit 88 of FIG. 12 is used for ANDing the inverted output signal (e) of the detection output signal (d) and the reset pulse (b) so as to generate the switch control pulse (f) for alternatively feeding the flag data in the prefetch circuit 16 to the flag register 18. The flag data in the flag register 18 is thus replaced by means of the switch control pulse (f).

As previously noted in detail, the control transistor is not turned on unless the signal voltage application transistor is turned on even at the detection operating timing since the signal voltage application transistor of the current drive means is provided on the signal current detection line side and the control transistor on the grounding side. The charge for charging the whole control transistor is prevented from flowing out of the signal current detection line and this also prevents the differential current detection means from detection failure and malfunction to ensure that the differential current between the reference current drive line and the signal current detection line is detected stably and quickly with accuracy. Therefore, the semiconductor integrated circuit is suitably usable as a timing control circuit for notifying the termination of the encoding operation performed by the CAM encoder.

Figure 15:
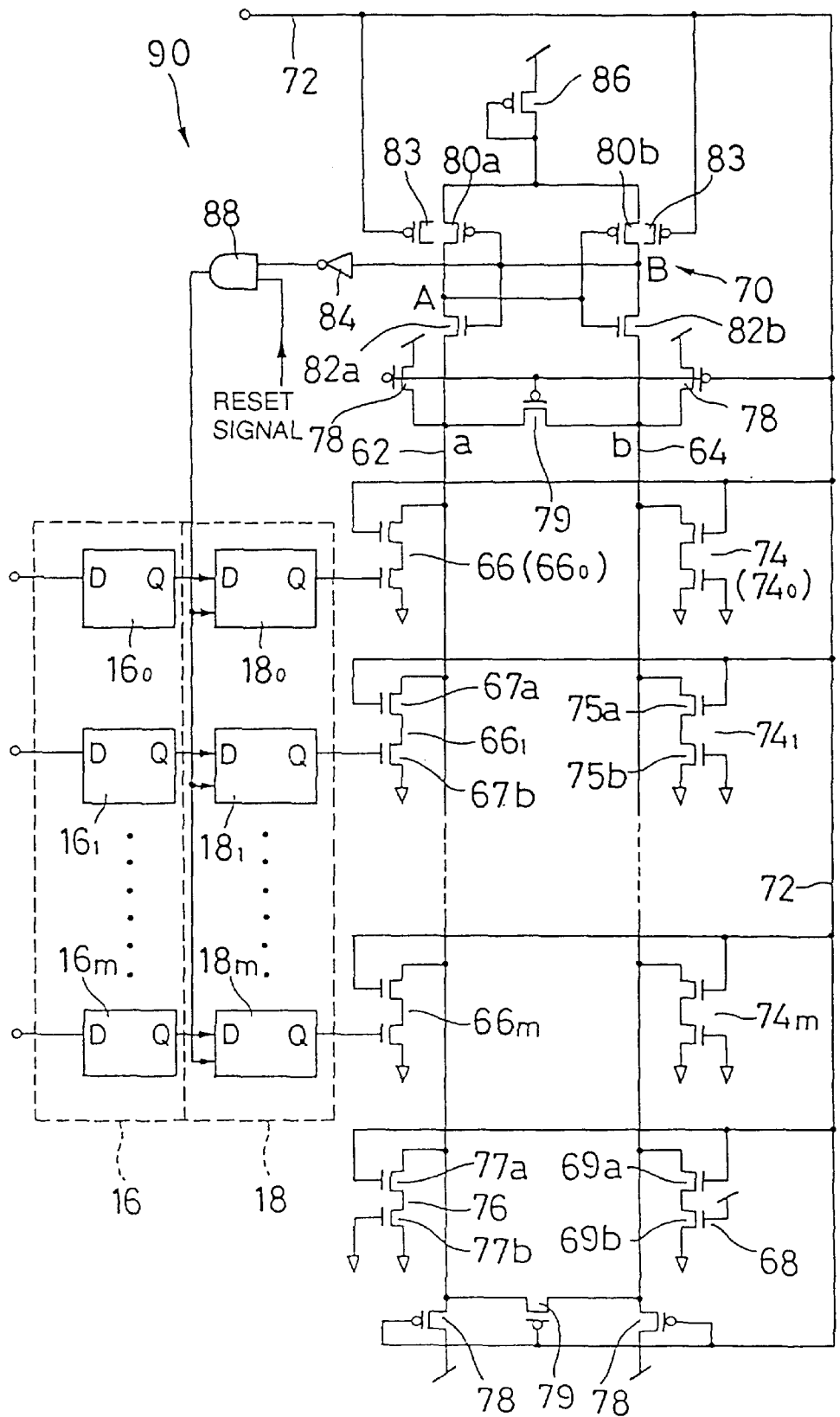
FIG. 15 is a block diagram of another timing control circuit as a semiconductor integrated circuit which provides a basis for understanding an associative memory and an encoder according to the present invention.
Figure 16:
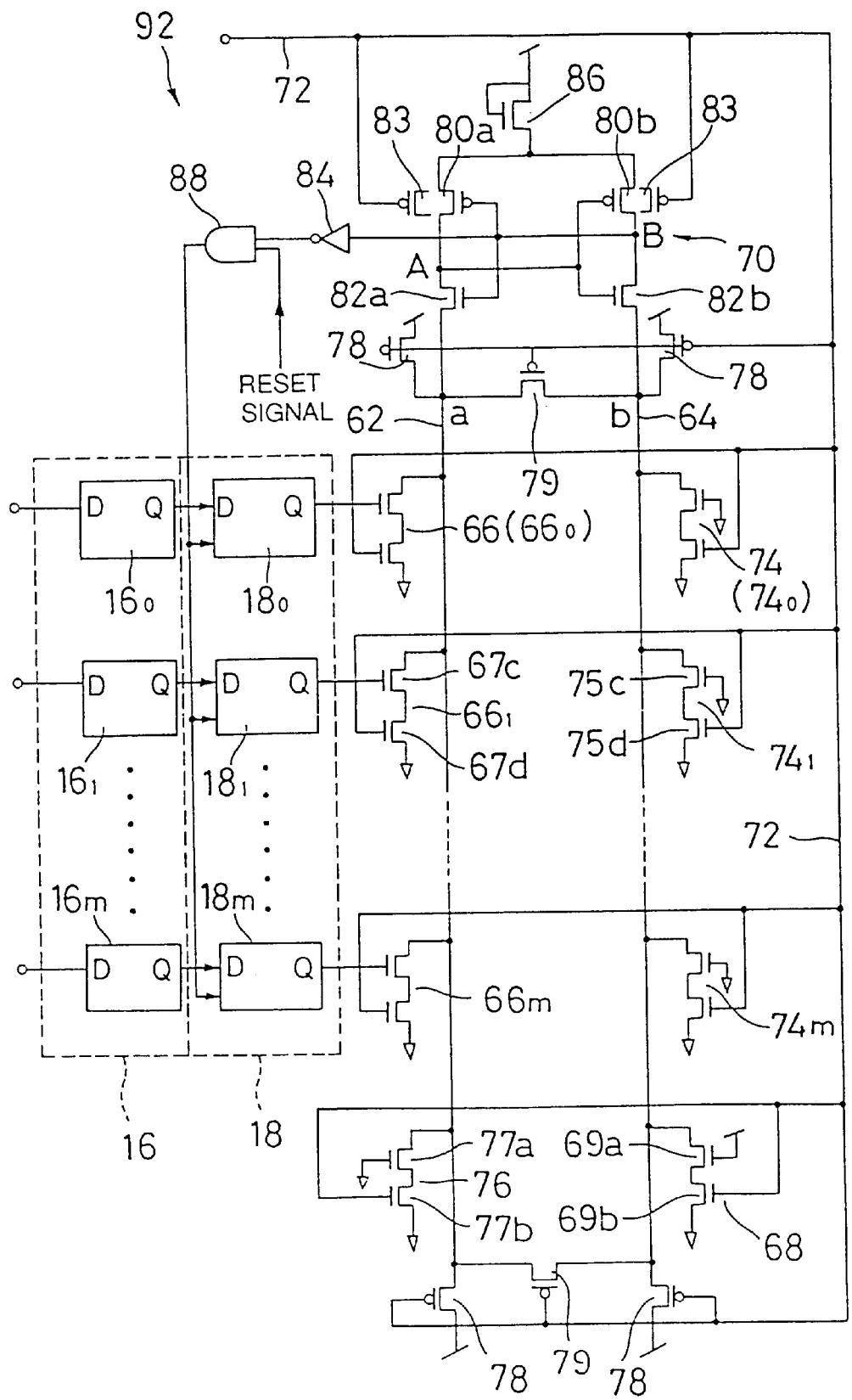
FIG. 16 is a block diagram of still another timing control circuit as a semiconductor integrated circuit which provides a basis for understanding an associative memory and an encoder according to the present invention.

Referring to FIGS. 15–17, another semiconductor integrated circuit which provides a basis for understanding an associative memory and an encoder according to the present invention will be described in detail. The semiconductor integrated circuit shown in FIGS. 15–17, like those of FIGS. 10 and 12, is applicable to the encoder shown in FIG. 8 as a number detection circuit for timing control.

In the semiconductor integrated circuit shown in FIGS. 15–17, there is preset the reference current $i_r$ made to flow in the reference current drive means provided on the reference current drive line as the second signal line in accordance with the number of data $k_0$ ($M > k_0 \geq 0$) desired to be detected out of the data "1" or "0" fed to data input lines for respectively controlling M ($M \geq 1$) provided in parallel on the first signal line, or the signal current detection line, that is, a current value ($k_0 \cdot i_0 < i_r < (k_0+1) \, i_0$) greater by $k_0$ times and smaller by $k_0+1$ times than the current value $i_0$ flowing through one current drive means. Each current drive means of the semiconductor integrated circuit has a signal voltage application transistor whose gate electrode is connected to the data input line and a control transistor for controlling the operating time of the semiconductor integrated circuit.

Therefore, In the semiconductor integrated circuit shown in FIGS. 15–17, when the whole current drive means with the reference current drive means and the data input line supplied with the desired data is turned on according to the operating timing, reference current $i_r$ is caused by the reference current drive means to flow through the reference current drive lines on one hand and current $i_0$ flows through each current drive means on the other hand. As a result, current i ($i = k i_0$) in proportion to the number k ($M > k \geq 0$) flows through the signal current detection line. The differential current detection means detects the differential current between the values i and $i_r$ of the current flowing through both the signal lines and outputs the inversion of the differential current, that is, the inverted (timing) with respect to the size relation between both the current value i and $i_r$. It is thus detected that the number k of desired data out of those fed to the respective input lines has reached the preset value $k_0$. The semiconductor integrated circuit shown in FIGS. 15–17 is capable of detecting the number of desired data fed to the data input lines. The reference current drive line (reference current line) and the signal current detection line (detection line) have been set at a constant voltage level ($V_0$). Therefore, the voltage difference between both signal lines, resulting from the current difference between the reference current $i_r$ flowing through the reference current line and the whole signal current i ($k i_0$) flowing through the detection line when the predetermined time has elapsed after the commencement of the detecting operation, that is, at the time of the predetermined voltage drop from the set voltage level ($V_0$) or at the raised voltage level, becomes greater than the difference when the detecting operation is started, that is, at the time both signal lines are substantially set at the constant voltage level ($V_0$). This is the reason why the cumulative consumed current difference of the former is greater than that of the later. Therefore, by setting the detection starting voltage level of the differential current detection means (circuit) to the set voltage level ($V_0$) simply to set the predetermined voltage drop relatively differing from the set level ($V_0$) or the raised voltage level, the current difference between both signal lines, that is, the voltage difference can be detected stably with accuracy, thus minimizing the influence of disturbances such as noise on the result of detection.

The differential current detection means of the semiconductor integrated circuit shown in FIGS. 15–17 has a means for setting the detection starting level, whereby it is possible to set the detection starting voltage level at such a level as is greatly different (parting from the predetermined voltage level) from a preset voltage level (e.g., precharge voltage level) common to both the signal current detection line and the reference current line. The voltage difference between both signal lines at the time the difference therebetween is detected can be made relatively large. Consequently, the detection of the differential current between the current flowing through the signal current detection line and the reference current is most important and a relatively large voltage difference can be secured even when the differential current is reversed where the differential current is minimized. Therefore, the detection of the differential current by the differential current detection means and its reverse timing can be carried out stably and quickly with accuracy.

FIG. 15 shows a specific circuit diagram of a timing control circuit 90 to which the semiconductor integrated circuit providing a basis for understanding an associative memory and an encoder according to the present invention is applied. The timing control circuit 90 of FIG. 15 is applied to the encoder 11 shown in FIG. 8 and as it is exactly the same in structure as the timing control circuit 60 of FIG. 10 except for the installation of a transistor 86 as a means for setting the detection starting level, a precharge transistors 78 for respectively precharging the contacts a and b on one respective sides of both signal lines 62, 64, and a transistor 79 for giving both signal lines 62, 64 an equal potential on the other sides thereof. As this timing control circuit 90 is capable likewise of detecting the fact that the number of hit signals applied to the gate electrode of the signal voltage application transistor 67b and held by the data latch circuit of the flag register 18 has reached the predetermined value, for example, ultimately one, like component elements are designated by like reference characters and the detailed description thereof will be omitted.

The differential current detection circuit 70 which best features the timing control circuit 90 of FIG. 15 comprises a P-channel MOS transistor (PMOS) 86 connected to the power supply at the same potential as the potential at the other ends of both signal lines 62 and 64, for example, 5 V, PMOS transistors 80a, 80b connected to this PMOS transistor 86, N-channel MOS transistors (NMOS) 82a, 82b connected to the above-noted transistors in series, and two precharge transistors 83 as PMOSs. The PMOS transistor 86 connected to the power supply forms the means of setting the detection starting level, with its source electrode connected to the power supply and with its gate electrode connected to its own drain electrode. The gate electrodes of the transistors 82a and 80a connected to the first signal line are connected to each other and also to the contact B between the transistors 80*b* and 82*b*. Moreover, the gate electrodes of the transistors 82*b* and 80*b* connected to the second signal line are connected to each other and also to the contact A between the transistors 80*a* and 82*a*. An output line extends from the contact B and is connected via the inverter 84 to the AND circuit 88. The reset signal of the aforementioned flag register 18 is applied to the other input of the AND circuit 88. The output of the AND circuit 88 is connected to the aforementioned flag register 18.

Assuming in this case that the supply voltage $V_{dd}$ to which the source electrode of the PMOS transistor 86 is connected remains at a predetermined potential, for example, 5 V and that the threshold value $V_{TH}$ at a predetermined voltage, for example, about 0.7 V, the PMOS transistor 86 is held ON on condition that the gate voltage of the PMOS transistor 86 is lower than what results from subtracting the threshold voltage from the supply voltage ($V_{dd}-V_{TH}$, e.g., 5−0.7=4.3 V) but it will be turned off if the gate voltage thereof exceeds the difference. Therefore, the voltage of the drain electrode connected to the gate electrode rises up to only the supply voltage—threshold voltage ($V_{dd}-V_{TH}$, e.g., 4.3 V). In other words, the PMOS transistor 86 makes the precharge voltage at the contacts A and B the aforementioned $V_{dd}-V_{TH}$ when the voltage is precharged via the precharge transistor 83 and also functions as what reduces the precharge voltage from the supply voltage $V_{dd}$. As the precharge potential at the contacts A, B lowers, as described in detail later, the precharged gate electrode voltage of the transistors lowers, thus also lowering the potentials of the contacts a and b when either transistor 82*a* or 82*b* is turned on at the time of timing detecting operation, that is, lowering the detection starting voltage level. In other words, the PMOS transistor 86 functions as the mean of setting the detection starting level.

Subsequently, the detecting operation of the timing control circuit 90 shown in FIG. 15 will be described as a representative example in a case where the last one of the hit signal of the flag data in the flag register 18, that is, its last hit signal is detected. In this case, the power supply for precharging purposes is at the same potential, for example, 5 V and flag data having a plurality of hit signals ("1") is held in the flag register 18 on the assumption that the reference current $i_r$ is 1.5 times as great as the drive current $i_0$ of one current drive circuit 66, that is, set at 1.5 $i_0$.

With the precharge control signal line 72 at L (low: "0"), both precharge transistor 78 and the transistor 79 at the respective ends of both signal lines 62, 64 are first turned on to precharge the first and second signal lines 62 and 64, consequently contacts a and b at the same potential, for example, the power supply potential (e.g., 5 V). Further, both precharge transistors 83 are turned on to precharge the contacts A and B within the differential current detection circuit 70 at H (high) potential (e.g., 4.3 V) likewise. Incidentally, the transistors 82*a*, 82*b* of the differential current detection circuit 70, the transistors 67*a* of the whole current drive circuit 66 and the transistor 68*a* of the reference current drive circuit 68 are held off. While the transistor 86 connected to the power supply initially is held OFF, the threshold voltage keeps its drain potential at supply voltage—threshold voltage ($V_{dd}-V_{TH}$, e.g., 4.3 V). When the drain potential $V_{dd}-V_{TH}$ of the transistor 86 drops as the result of the energized precharge transistor 83, the transistor 86 is turned on to precharge the contacts A, B. The transistor 86 is held ON to keep precharging the contacts A, B until the potential of the contacts A, B, that is, the gate potential of the transistor 86 reaches the precharge voltage, that is, $V_{dd}-V_{TH}$ (e.g., 4.3 V) and the transistor 86 is turned off after the precharge voltage has been reached.

With the precharge control signal line 72 at H (high: "1"), the PMOS transistors 78, 79, 83 are subsequently turned off, whereas the NMOS transistors 67*d*, 69*d*, 75*d*, 77*d* are turned on. Both the two transistors 69*a*, 69*b* of the reference current drive circuit 68 are turned on accordingly and the reference current $i_r$ (=1.5 $i_0$) flows through the second signal line 64 to lower the potential of the contact b. On the other hand, the transistor 67*b* having the gate electrode connected to the data latch circuit 18*j* of the flag register 18 whose flag data has the hit signal "1" out of m+1 of current drive circuits 66 (66$_0$, 66$_0$, . . . , 66$_m$) is turned on and the transistor 67*a* is held on, whereby the drive current $i_0$ flows from the first signal line 62 through the current drive circuit 66*j*. Since the flag data in the flag register 18 has a plurality of hit signals "1", for example, k (k≧2) of hit signals in this case, current of k$i_0$ flows through the first signal line 62 and the potential of the contact a drops accordingly.

When k is greater than 2, the potential of the contact a drops faster than that of the contact b because current k$i_0$ flowing through the first signal line 62 is greater than the reference current $i_r$ (=1.5 $i_0$) flowing through the second signal line 64. When the difference (gate—source voltage) between the gate potential (potential at the contact B) of NMOS 82*a* and the source potential (potential of the contact a) becomes greater than the substrate-biased threshold voltage (e.g., 1.4 V) of NMOS 82*a*, that is, when the potential of the contact a drops beyond detection starting voltage $V_{ON}$ (voltage resulting from subtracting the above-noted threshold voltage from the precharge voltage) (for example, if the potential of the contact a drops up to 2.9 V when the potential of the contact B is 4.3 V), NMOS 82*a* is turned on and the potential of the contact A drops. However, the potential of the contact b has not yet so much lowered as to turn on NMOS 82*b*, which remains in the off state accordingly. Although the current flows through both signal lines 62 and 64 then to cause the potential at the contacts A and a to drop further, NMOS 82*b* keeps the off state as the potential drop at the contact a, that is, at the contact A is greater than the potential drop at the contact b. The contact B thus keeps "1" and "0" is applied by the inverter 84 connected thereto to the AND circuit 88. On the other hand, the contact A remains at "0".

As the plurality of hit signals "1" within the flag register 18 are encoded, they are reset to "0" one after another. When the number of remaining hit signals comes up to one, the timing control circuit 90 shown in FIG. 15 performs the detecting operation, that is, first precharges the precharge control signal line 72 by applying "0" and then applying "1" thereto, thus causing the current $i_0$ and the reference current $i_r$ (=1.5 $i_0$) to flow through the first and second signal lines 62, 64 likewise, respectively. Since the current flowing through the second signal line 64 is greater at this time, the potential of the contact b drops faster than that of the contact a and NMOS 82*a* conversely keeps the off state, whereas NMOS 82*b* is held ON. Consequently, the potential of the contact B drops to the low level and inverted by the inverter 84 so that "1" is applied to the AND circuit 88. The potential of the contact A is maintained at H (high) potential.

As a result, it is apparent that more than one hit signal "1" is held in the flag register 18 if the output signal from the inverter 84 of the timing control circuit 90 shown in FIG. 15 is "0" and the number of hit signals is one or less if the output signal is "1". When the output signal is changed from "0" to "1", the result of detection, that is, a switch control signal is obtainable from the "1" signal and the reset signal of the flag register 18 by means of the AND circuit 88. Further, this switch control signal may be used to switch the flag data in the flag register 18 over to the flag data in the prefetch circuit 16. Needless to say, the output signal may be fetched from only the contact A or both contacts A and B.

When the timing detecting operation is started in the timing control circuits 90 shown in FIG. 15, the current corresponding to the number of hit signals ("1") in the flag register 18 flows into the signal current detection line (the first signal line) 62 and the predetermined reference current into the reference current drive line (the second signal line) 64. Therefore, the differential current detection circuit 70 detects the small potential difference between the contacts a, b resulting from the difference between the currents flowing through both signal lines 62 and 64 as a great potential difference at the contacts A, B one side of which (high potential sides of the contacts a, b) is held at the precharge voltage (e.g., $V_{dd}$), the other side (low potential sides thereof) being lowered up to the ground level (e.g., 0 V).

The subsequent changes of the contacts A and B precharged at the same precharge potential (e.g., 4.3 V) are determined by which one of the transistors 82a and 82b is turned on. In other words, the current flows through the first and second signal lines 62 and 64 during the operation of timing detection, thus causing the potentials of the contacts a and b of both signal lines 62, 64 to drop as previously noted. When either one of the potential difference between the contacts B and a and the potential difference between the contacts A and b exceeds the substrate-biased threshold value (e.g., 1.4 V), that is, when either one of the potentials of both signal lines 62 and 64 (those of the contacts a and b) drops beyond the detection starting voltage (potential resulting from subtracting the aforementioned threshold voltage from the precharge potential) $V_{ON}$ (e.g., 2.9 V), one of the transistors 82a and 82b is turned on. As a result, the contact A or B on the side of the energized transistor 82a or 82b immediately becomes equal in potential to the contact a or b thus lowered and lowers up to the ground level (0 V together. On the other hand, the contact A or B on the side of the deenergized transistor 82a or 82b is maintained at the precharge potential (4.3 V).

It is thus possible to detect the predetermined number of hit signals (e.g., ultimately only one) by making the potential of the contact B a detection signal and by taking out the output signal via the inverter 84. In other words, the transistor 82b is turned on as the inverter 84 has been connected to the tip of the contact B and the potential of the contact B then drops. When the potential becomes lower than the threshold value (e.g., about 2.5 V) of the inverter 84, the output signal "1" is obtained.

If the potential difference between the contacts a and b is excessively small when the contacts A and B branch off in the differential current detection circuit 70, the ON-operation of the transistors 82a and 82b becomes irrelevant to the potential difference between the contacts a, b, that is, the possibility of malfunction increases. Therefore, the greater the potential difference between both contacts a and b, the less the transistors may be seriously affected thereby. Stable accurate timing detection is thus always assured.

The equally precharged potential at the contacts a, b of both signal lines 62, 64 lowers likewise as the temporary inflow of charge into the control transistors 67a, 69a, 75a, 77a that have turned on the current drive circuit 66, the reference current drive circuit 68, the dummy circuits 74, 76 and the like in the initial stage of the timing detecting operation (at the time the precharge control signal line 72 is at the high level (H: "1")). However, the difference between the whole signal current i flowing in the first signal line 62 through the current drive circuit 66 turned on by the signal voltage application transistor 67b in proportion to the number of hit signals ("1") held in the flag register 18 and the reference current $i_r$ flowing in the second signal line 64 through the reference current drive circuit 68 turned on by the transistor 69b causes potential difference at the contacts a and b because of the current difference after the passage of fixed time followed by the commencement of detection. The greater the difference between the cumulative currents that have flowed down both signal lines 62, 64, the greater the potential difference becomes, so that the potential difference grows until the predetermined time after the commencement of detection. As the current flows, the potential of both signal lines 62, 64 thus precharged lowers and the charge held thereby decreases and when the potential comes almost near to the ground level, the current becomes hard to flow and ultimately stops flowing. Consequently, the potentials of both signal lines, that is, the potentials at both contacts a, b are set at substantially the same ground level after the passage of adequate time.

Unless the potential of the contacts a and b has lowered up to the ground level in the semiconductor integrated circuit shown in FIG. 15, the lower their potential than the precharged one, the greater the difference in potential between the contacts a and b becomes. Consequently, it is preferred to make the lower one of the potentials of the contacts a and b a detection starting voltage for use in turning on either transistor 82a or 82b, that is, to make greater the difference between the precharge voltage of both contacts a and b, or both signal lines 62 and 64, and the level of the detection starting voltage for turning on the transistors 82a, 82b, at a point of time a greater potential difference occurs between both contacts a and b. For this reason, there is a method of either increasing the precharge voltage of both signal lines 62, 64 or lowering the detection starting voltage level. In order to raise the precharge voltage of both signal lines 62, 64, a step-up circuit may be employed. However, an increase in not only the circuit area but also cost resulting from the provision of such a step-up circuit makes it desirable to provide a means to lower the detection starting voltage level. Since the detection starting voltage is the source voltage at which the transistor 82a or 82b is turned on, that is, what is at the potential of the contacts a or b and since the threshold voltage (e.g., 1.4 V) between the gate-source of the transistors 82a, 82b has been predetermined, the detection starting voltage level may be lowered by lowering the potential of the gate electrodes of the transistors 82a, 82b.

In the timing control circuit 90 of FIG. 15, the precharge potential of the contacts A, B connected to the gate electrodes of both transistors 82a, 82b is reduced by the threshold voltage of the PMOS transistor from the supply potential (e.g., 5 V) up to a predetermined potential (e.g., 4.3 V) by means of a transistor 86 for setting the detection starting level using the PMOS transistor. However, it is not limited to the arrangement above but can employ the detection starting level setting transistor 86 formed with an NMOS transistor as in the case of a timing control circuit 92 of FIG. 16. Assuming the substrate-biased gate—source threshold voltage $V_{TH}$ of the NMOS transistor is about 1.4 V, for example, a rise in the potential of the source electrode may be reduced up to $V_{dd}-V_{TH}$, that is, about 3.6 V by connecting the drain electrode of the NMOS transistor 86 to its gate electrode when the current voltage $V_{dd}$ is 5 V. Consequently, the precharge voltage of the contacts A, B is maintained at about 3.6 V and since the threshold voltage $V_{TH}$ between the gate—source of the NMOS transistors 82a, 82b is about 1.4 V, the detection starting voltage $V_{ON}$ at which these transistors 82a, 82b are turned on may be set at about 2.2 V (3.6–1.4 V).

When the semiconductor integrated circuit shown in FIG. 15 is applied as a timing control circuit of the encoder in order to increase the difference between the contacts a and b of both signal lines 62, 64 quickly even though a decrease in the potential between the contacts a and b is insignificant after the timing detecting operation is started, there may be installed the signal voltage application transistor 67c of the current drive circuit 66 on the side of the first signal line (signal current detection line) 62, the control transistor 67d on the grounding side as in a timing control circuit 92, unlike the timing control circuit 90 of FIG. 15, the gate-grounded transistor 75c of the dummy circuit 74 on the second signal line (reference current drive line) side, and the control transistor 75d on the grounding side. Only the control transistor 67d of the current drive circuit 66 is turned on when the signal voltage application transistor 67c is turned on, whereas the whole control transistor 67d at the time the transistor 67c is not turned on and the control transistor 75d of the whole dummy circuit 74 are not turned on, whereby it is possible to eliminate the charge flowing into these control transistors 67d, 75d in the initial stage of the timing detecting operation, to prevent the potentials of both signal lines 62, 64, that is, both contacts a and b from simultaneously dropping in the initial stage of the timing detecting operation, and to increase the potential difference itself between both contacts a and b.

In the case of the timing control circuit 60 of FIG. 10, however, the contacts A, B are precharged at the supply potential $V_{dd}$ (e.g., 5 V) since the precharge transistor 83 is connected to the power supply. As the precharge voltage of the contacts A, B is at the supply potential $V_{dd}$, the detection starting voltage $V_{ON}$ at which the transistors 82a, 82b whose gate—source threshold voltage is $V_{TH}$ (e.g., 1.4 V) are turned on conforms to $V_{dd}$-$V_{TH}$ (e.g., 3.6 V). On the contrary, as the detection starting levels (voltage) $V_{ON}$ of the timing control circuits 90 and 92 shown in FIGS. 15 and 16 respectively remain to be about 2.9 V and 2.2 V against the same supply potential (5 V), it is possible to lower the detection starting voltage level $V_{ON}$ as compared with the timing control circuit 60 of FIG. 10. Consequently, the potential difference between both signal lines 62 and 64, that is, contacts a and b is increased further, whereby the transistor 82a or 82b can be turned on stably with accuracy at a lower potential. As a result, the timing control circuits 90 and 92 of FIGS. 15 and 16 have a greater noise margin and consequently the differential current detection circuit 70, even if subjected to noise influence, may less malfunction to ensure accurate stable timing detection at all times.

FIGS. 17(a), (b) show simulation waveforms relating to the operation of the timing control circuit 92 shown in FIG. 16 and that of the timing control circuit 60 shown in FIG. 10, respectively.

The voltage difference between the nodes a and b at the operating points where the nodes A and B branch off is 0.6 V in the case of FIG. 17(a) and 0.1 V in FIG. 17(b), indicating a greater margin in the former.

Since the main encoder 12 of the encoder 11 of FIG. 8 to which the timing control circuit 90 is applied operates likewise as shown in the timing chart of FIG. 13, the description thereof will be omitted.

The timing control circuit 90, 92 applied to the encoder shown in FIG. 8 is basically thus arranged.

As set forth above in detail, the detection start level setting means for making relatively greater the difference between the detection start voltage and what is preset to the first and second signal lines is provided for the differential current detection means in the semiconductor integrated circuit shown in FIGS. 15–17. Therefore, the potentials of both signal lines, that is, the signal current detection line and the reference current drive line are sufficiently lowered at the timing of detecting operation and the potential difference can be detected dynamically when the difference grows sufficiently greater. Consequently, it is possible to detect the differential current between the reference current drive line and the signal current detection line stably and quickly with accuracy by a greater noise margin at low power consumption. In addition, the circuitry can be made compact in configuration to ensure that the semiconductor integrated circuit which provides a basis for understanding an associative memory and an encoder according to the present invention is fit for use as a timing control circuit for previously notifying the termination of the encoding operation in an encoder for CAM.

Referring to FIGS. 18–22, another semiconductor integrated circuit which provides a basis for understanding an associative memory and an encoder according to the present invention will be described in detail. The semiconductor integrated circuits shown in FIGS. 18–22 are applicable to the encoder shown in FIG. 8 as number detection circuits for timing control.

In the semiconductor integrated circuits shown in FIGS. 18–22, there is preset the reference current $i_r$ made to flow in the reference current drive means provided on the reference current drive line as the second signal line in accordance with the number of data $k_0$ (M>$k_0$≧0) desired to be detected out of the data "1" or "0" fed to data input lines for respectively controlling M (M≧1) provided in parallel on the first signal line, or the signal current detection line, that is, a current value ($k_0 i_0 < i_r < (k_0+1) i_0$) greater by $k_0$ times and smaller by $k_0+1$ times than the current value $i_0$ flowing through one current drive means. Prior to the detecting operation, moreover, the first and second signal lines are precharged at the predetermined same potential. Therefore, the inputs and inverted outputs of the first and second inverters both connected to these signal lines in series or parallel are identical and both inputs to the differential current detection means are also identical.

Therefore, In the semiconductor integrated circuit shown in FIGS. 18–22, when the whole current drive means with the data input line supplied with the desired data becomes active according to the operating timing, reference current $i_r$ flows through the current drive means and current $i_0$ flows through each current drive means. Further, current i ($i=ki_0$) in proportion to the number k (M>k≧0) flows through the signal current detection line. On the other hand, reference current $i_r$ is caused by the reference current drive means to flow through the reference current drive line. As a result, the potentials of the signal current detection line and the reference current drive line that have been precharged at the predetermined potential start decreasing. When k is greater than $k_0$ in the current drive means kept active, the potential of the signal current detection line lowers faster and when it is less than $k_0$, that of the reference current drive line lowers faster.

When the potential of either signal line lowers beyond the threshold value of the inverter connected thereto in the semiconductor integrated circuit shown in FIGS. 18–22, the output of the inverter is inverted. In the semiconductor integrated circuit of FIG. 18, the differential current detection means is capable of directly detecting the inversion of the inverted output of the inverter connected to the signal line in series. In the semiconductor integrated circuit of FIGS. 19–21, moreover, the inversion of the inverted output of the inverter connected to the signal line in parallel caused the transistor connected to the signal line (connected to the inverter in parallel) to be turned on, letting the current flow through the signal line to lower the potential and making the differential current detection means detect the reduction of the input potential. Consequently, the differential current between the current values i and $i_r$ flowing through the first and second signal lines is detected by the differential current detection means, so that the inversion of a differential current code, that is, the inversion (timing) of the size relation between both current values i and $i_r$ is output. In this way, it is detected that the number k of desired data out of those applied to each data input line has reached the preset number $k_0$ of data to be detected. The semiconductor integrated circuit shown in FIGS. 18–22 can thus detect the number of desired data fed to the data input line.

By regulating the threshold values of the inverters connected to the respective signal lines, a relatively great potential difference between both signal lines can be secured when the differential current therebetween is detected. Accordingly, the inverted output of only one inverter can be inverted then quickly with accuracy. Since the inverter itself has drive capability in the semiconductor integrated circuit shown in FIG. 18, moreover, the voltage level of the initial value of the input signal to the differential current detection means can be raised by the inversion of the inverter on one side and the voltage difference between two input signals due to the differential current between both signal lines can be made greater at the start of detection to ensure that the detecting operation is performed with stability. Since the transistor is turned on by inverting the inverter to ensure that one of the signal lines is conducted to the input of the differential current detection means in the semiconductor integrated circuit shown in FIGS. 19–21, the detecting operation is performed stably with accuracy. Consequently, it is possible to detect by the differential current detection means the inversion of the differential current between both signal lines stably and quickly with accuracy.

Figure 18:
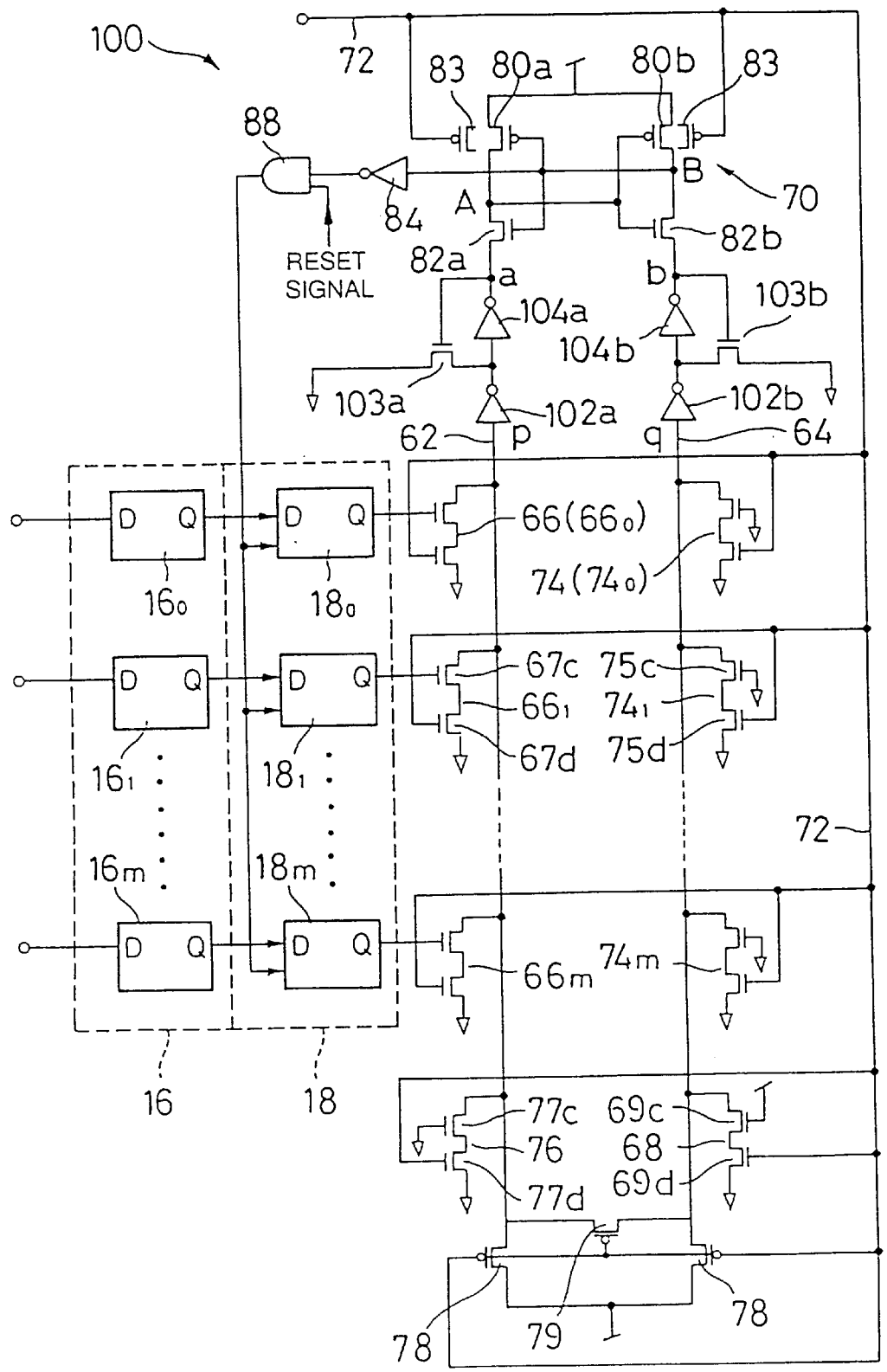
FIG. 18 is a block diagram of still another timing control circuit to which the semiconductor integrated circuit providing a basis for understanding an associative memory and an encoder according to the present invention is applied.

FIG. 18 shows a specific circuit diagram of a timing control circuit 100 to which the semiconductor integrated circuit providing a basis for understanding an associative memory and an encoder according to the present invention is applied. The timing control circuit 100 of FIG. 18 is applied to the encoder 11 shown in FIG. 8 and as it is exactly the same in structure as the timing control circuit 61 of FIG. 12 except for the installation of a transistor 86 as a means for setting the detection starting level, a precharge transistors 78 for a train of inverters 102a, 104a and 102b, 104b, and transistors 103a, 103b, like component elements are designated by like reference characters and the detailed description thereof will be omitted.

The timing control circuit 100 of FIG. 18 comprises a first signal line (signal current detection line) 62, a second signal line (reference current drive line) 64, m+1 of current drive circuits (current drive means) $66_0$, $66_0$, ..., $66_m$ provided for respective m+1 of data latch circuits $18_0$, $18_1$, ..., $18_m$ of a flag register 18 in parallel to the first signal line 62, a reference current drive circuit (reference current drive means) 68 provided for the second signal line 64, a differential current detection circuit (differential current detection means) 70 for detecting the difference between the currents flowing through the first and second signal lines 62, 64, that is, detecting the differential current, inverters 102a, 104a and 102b, 104b provided between the first and second signal lines 62, 64 and the differential current detection circuit 70, and a precharge control signal line 72 for controlling the operation timing of the timing control circuit, namely, the current drive circuits 66 ($66_0$, $66_0$, ..., $66_m$), the reference current drive circuit 68 and the differential current detection circuit 70.

In the timing control circuit 100, contacts p and q at one ends of the respective first and second signal lines 62 and 64 are connected to the respective inverters 102a and 102b and further connected via the inverters 104a and 104b to the differential current detection circuit 70 at the contacts a and b, the other ends thereof being connected via respective precharge transistors 78 to a power supply at a predetermined potential, for example, 5 V. In this case, the value $i_r$ of the reference current caused to flow down the reference current drive circuit 68 may properly be determined according to the value $i_0$ of the current that can be made to flow by the current drive circuit 66 ($66_0$, $66_0$, ..., $66_m$) and the number of hit signals to be detected, and may be greater than $i_0$ but less than $2i_0$ and the value at which the inversion timing of the inverters 102a and 102b is clearly distinguishable and at which the differential current detection circuit 70 is able to detect the differential current in order for the last one of the hit signal to be detected.

The inverters 102a and 104a are connected between the first signal 62 and the differential current detection circuit 70, whereas the inverters 102b and 104b are connected between the second signal line 64 and the differential current detection circuit 70. Moreover, NMOS transistors 103a and 103b connected to a predetermine potential (e.g., grounding potential) are connected in between the inverters 102a, 104a and 102b, 104b, respectively. These gate electrodes are also connected to the contact a (between the inverter 104a and the differential current detection circuit 70) and the contact b (between the inverter 104b and the differential current detection circuit 70). The threshold voltage at which the outputs of the inverters 102a and 102b are inverted is regulated in accordance with the width or threshold voltage of PMOS and NMOS transistors constituting the inverter. By regulating the threshold voltage for the output inversion, it is possible to secure a relatively great potential difference due to the differential current between the contacts p and c and to increase the operating margin.

Subsequently, the detecting operation of the timing control circuit 100 shown in FIG. 18 will be described as a representative example in a case where the last one of the hit signal of the flag data in the flag register 18, that is, its last hit signal is detected. In this case, flag data having a plurality of hit signals ("1") is held in the flag register 18 on the assumption that the reference current $i_r$ is 1.5 times as great as the drive current $i_0$ of one current drive circuit 66, that is, set at 1.5 $i_0$.

With the precharge control signal line 72 set at L (low: "0"), prior to start the detecting operation, both precharge transistor 78 and the transistor 79 are first turned on to precharge the first and second signal lines 62 and 64, consequently contacts p and g at the same H (high) potential (e.g., 5 V). Further, both precharge transistors 83 are turned on to precharge the contacts A and B within the differential current detection circuit 70 at H (high) potential (e.g., 5 V) likewise. Consequently, the inverters 102a and 102b set both connections between the inverters 102a, 104a and 102b, 104b at L (low) potential, whereas the inverters 104a and 104b set the contacts a and b at H (high) potential. The transistors 103a and 103b are thus turned on to ensure that both connection potentials between the inverters 102a, 104a and 102b, 104b are set at L (low) potential. Incidentally, the transistors 82a, 82b of the differential current detection circuit 70, the transistors 67d of the whole current drive circuit 66 and the transistor 69d of the reference current drive circuit 68 are held off.

With the precharge control signal line 72 at H (high: "1"), the PMOS transistors 78, 79, 83 are subsequently turned off, whereas the NMOS transistors 67d, 69d, 75d, 77d are turned on. Both the two transistors 69c, 69d of the reference current drive circuit 68 are turned on accordingly and the reference current $i_r$ (=1.5 $i_0$) flows through the second signal line 64 to lower the potential of the contact g. On the other hand, the transistor 67c having the gate electrode connected to the data latch circuit 18j of the flag register 18 whose flag data has the hit signal "1" out of m+1 of current drive circuits 66 ($66_0, 66_0, \ldots, 66_m$) is turned on and the transistor 67d is held on, whereby the drive current $i_0$ flows from the first signal line 62 through the current drive circuit 66j. Since the flag data in the flag register 18 has a plurality of hit signals "1", for example, k (k≧2) of hit signals in this case, current of $ki_0$ flows through the first signal line 62 and the potential of the contact p drops accordingly.

When k is greater than 2, the potential of the contact p drops faster than that of the contact g because current $ki_0$ flowing through the first signal line 62 is greater than the reference current $i_r$ (=1.5 $i_0$) flowing through the second signal line 64. Therefore, the output inverted potential (threshold value) is reached at the contact p earlier than the contact g and the output inversion of the inverter 102a occurs earlier than that of the inverter 102b and besides the output inversion of the inverter 104a occurs earlier. In other words, only the inverters 102a and 104a undergo the output inversion earlier, thus causing the potential of the contact a to drop. When the difference between the gate potential (potential at the contact B) of NMOS 82a and the source potential (potential of the contact a) in the differential current detection circuit 70 becomes greater than the substrate-biased threshold voltage (e.g., 1.4 V) of NMOS 82a (for example, the potential of the contact a drops up to 3.6 V when the potential of the contact B is 5 V), NMOS 82a is turned on and the potential of the contact A drops and turns out to be in the L (low) state. As the potential of the contact a drops, NMOS 103a is turned off to keep the connection with the inverters 102a and 102b in the H (high) state. On the other hand, the contact g (the second signal line 64) has not yet reached the output inverted potential (threshold value) of the inverter 102b and the output inversion of both inverters 102b and 104b does not occur. The potential of the contact b is thus maintained in the H (high) state and NMOS 82b remains in the OFF state, whereas the contact B is maintained in the H (high) state.

The current then flows through both signal lines 62 and 64, causing the potentials of the contacts p and q to lower. The potential of the contact a drops beyond the threshold value of the inverter 102b, causing the output inversion thereof and the output inversion of the inverter 104b. Since the gate potential (potential of the contact A) NMOS 82b is maintained in the L (low) state even though the potential of the contact b drops, NMOS 82b is maintained in the OFF state and the potential of the contact B is maintained in the H (high) state. The latch operation of the differential current detection circuit 70 keeps the setting at H (high) "1", which is inverted by the inverter 84 connected thereto, and L (low) "0" 1 is applied to the AND circuit 88. On the other hand, the contact A remains at L (low) "0".

As the plurality of hit signals "1" within the flag register 18 are encoded, they are reset to "0" one after another. When the number of remaining hit signals comes up to one, the timing control circuit 100 of FIG. 18 performs the detecting operation, that is, first precharges the precharge control signal line 72 by applying "0" and then applying "1" thereto, thus causing the current $i_0$ and the reference current $i_r$ (=1.5 $i_0$) to flow through the first and second signal lines 62, 64 likewise, respectively. Since the current flowing through the second signal line 64 is greater at this time, the potential of the contact g drops faster than that of the contact p and the output inversion of the inverters 102b and 104b conversely occurs earlier. Only the potential of the contact b drops first and NMOS 82b is turned on, whereas NMOS 82a remains in the OFF state. Consequently, the potential of the contact B drops to L (low) level and inverted by the inverter 84 so that "1" is applied to the AND circuit 88. The potential of the contact A is maintained at H (high) potential.

As a result, it is apparent that more than one hit signal "1" is held in the flag register 18 if the output signal from the inverter 84 of the timing control circuit 100 is "0" and the number of hit signals is one or less if the output signal is "1". When the output signal is changed from "0" to "1", the result of detection, that is, a switch control signal is obtainable from the "1" signal and the reset signal of the flag register 18 by means of the AND circuit 88. Further, this switch control signal may be used to switch the flag data in the flag register 18 over to the flag data in the prefetch circuit 16. Needless to say, the output signal may be fetched from only the contact A or both contacts A and B.

By regulating the threshold values of the inverters 102a and 104b connected to both signal lines 62 and 64, the difference in potential drop between both contacts p and g resulting from the differential current between both signal lines 62 and 64, even though it is small, can be detected to ensure that the output of the inverter on only one side is inverted first at all times. Since the inverter itself has drive capability, the potential of the contacts a and b can be raised by the output inversion and the great potential difference between the contacts a and b can be secured when the detecting operation is started by the differential current detection circuit 70 to ensure that either NMOS 82a or 82b is turned on. Therefore, the detecting operation of the differential current detection circuit 70 can be performed stably and certainly. Since the potential difference between the contacts a and b is greater than the potential difference between the contacts p and g at the time the detecting operation is started by the differential current detection circuit 70, either of the transistors 82a and 82b is prevented from malfunctioning. As the timing control circuit 100 has a greater noise margin and is hardly affected by noise, it can make timing detection stably with accuracy at all times. By regulating the input threshold voltage for varying the outputs of the inverters 102a, 102b in such a way as to keep the voltage lower, it is needless to say possible to ensure stable operations by increasing the voltage difference between the contacts p and g when one of the inverters starts to operate.

The timing control circuit 100 as illustrated is arranged so as to use two-stage inverters 102a, 104a and 102b, 104b provided between both signal lines 62 and 64 and the differential current detection circuit 70 and to perform the detecting operations by making NMOS 82a and 82b drop the potential of either contact A or B. However, it is not limited to this arrangement but may be practiced by providing one-stage inverters and a differential current detection circuit for raising the potential of either contact A or B by means of PMOS transistors.

The timing control circuit 100 is basically so configured as stated above.

A description will subsequently be given of a semiconductor integrated circuit which provides a basis for understanding an associative memory and an encoder according to the present invention.

Figure 19:
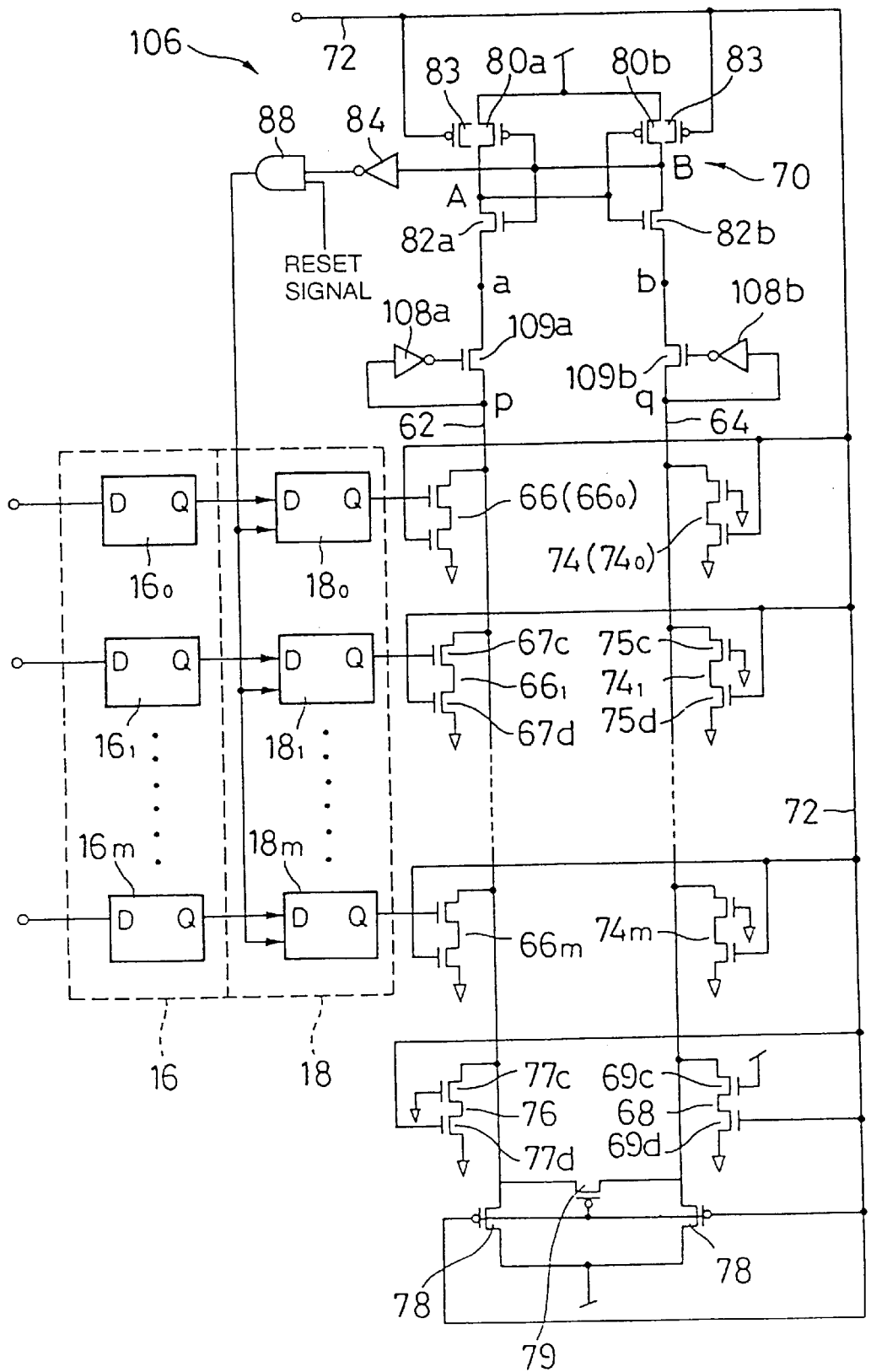
FIG. 19 is a block diagram of still another timing control circuit to which the semiconductor integrated circuit providing a basis for understanding an associative memory and an encoder according to the present invention is applied.

FIG. 19 shows another timing control circuit to which the semiconductor integrated circuit providing a basis for understanding an associative memory and an encoder according to the present invention is applied. As the timing control circuit 106 of FIG. 19 is exactly the same in structure as the timing control circuit 100 of FIG. 18 except for the installation of inverters 108a, 108b and transistors 109a, 109b in place of the two-stage inverters 102a, 104a and 102b, 104b, like component elements are designated by like reference characters and the detailed description thereof will be omitted.

In the timing control circuit 106 of FIG. 19, the NMOS transistor 109a is connected between the contact p at one end of the first signal line 62 and the contact a on the source electrode side of NMOS 82a of the differential current detection circuit 70; the inverter 108a between the gate electrode of NMOS 109a and the contact p; the NMOS transistor 109b between the contact g at the end of the second signal line and the contact b on the source electrode side of NMOS 82b; and the inverter 108b between the gate electrode of NMOS 109b and the contact g. In this case, the threshold values of the inverters 108a and 108b are regulated like the inverters 102a and 102b.

Like the timing control circuit 100 of FIG. 18, the timing control circuit 106 is such that all the contacts A, B, a, b, p, g are first precharged by the L signal of the precharge control signal line 72 at H level (for example, the contacts A, B, p, g at the supply voltage ($V_{dd}$, e.g., 5 V) and the contacts a and b at 3.6 V by the substrate-biased threshold value (e.g., 1.4 V) of NMOS 82a, 82b). With the signal line 72 as H, $ki_0$ current lead-in corresponding to the number k of hit signals is subsequently caused to occur on the first signal line 62 by the current drive circuit 66 which is made active by the hit signal "1" of the flag register 18 and the voltage drops correspondingly. Then $i_r$ ($1.5i_0$) current lead-in is caused to occur on the second signal line 64 by the reference current drive line 68.

When the number k of active current drive circuits 66 is more than one, the voltage of the first signal line 62 then drops faster than that of the second signal line 64. Consequently, the threshold voltage of the inverter is reached at the contact b earlier than at the contact g and the output inversion of the inverter 108a occurs earlier than that of the inverter 108b. Therefore, NMOS 109a is turned on before NMOS 109b. Then a voltage drop occurs at the contact a and NMOS 82a of the differential current detection circuit 70 is turned on and further the potential of the contact A is set at L (low) level. As a result, the potential of the contact g then lowers further and the output of inverter 108b is inverted and the transistor 109b is turned on. Even though the potential of the contact b drops, NMOS 82b remains in the off state and the potential of the contact B remains in the H state as the gate potential (potential of the contact A) of NMOS 82b is already at L. Consequently, the output at the contact B is inverted by the inverter 84 and the output of the inverter 84 as the output of the timing control circuit 106 is held L (low).

When the number k of active current drive circuits 66 is conversely one or less, the flow down current i of the first signal line 62 is greater than the flow down current $i_r$ of the second signal line 64 and the voltage drop at the contact p is greater than the voltage drop at the contact g. Therefore, the output of the inverter 108b is inverted and the transistor 109b is turned on and further the voltage drop at the contact b occurs. Subsequently, NMOS 82b is turned on and the potential of the contact B is set at L level. Since the potential of the gate electrode (contact B) of NMOS 82a is at L level, on the other hand, NMOS 82a is never turned on, irrespective of the potential of the contact a, that is, despite the fact that the potential drop occurs at the contact g, that the output of the inverter 108a is inverted and that the potential of the contact a drops when the transistor 109a is turned on. The potential of the contact A is maintained at H level. As a result, the potential of the contact B is inverted by the inverter 84 and the output of the timing control circuit 106 is changed to H level. It is thus detected that the number of hit signals "1" in the flag register 18 ultimately comes up to one.

By regulating the threshold values of the inverters 108a and 108b in the timing control circuit 106 as illustrated, the potential difference between the contacts a and b can be set when the detecting operation is started by the differential current detection circuit 70, that is, at a point of them either NMOS 82a or 82b is turned on. Consequently, timing detection can be made with a greater noise margin stably and accurately at all times.

Figure 20:
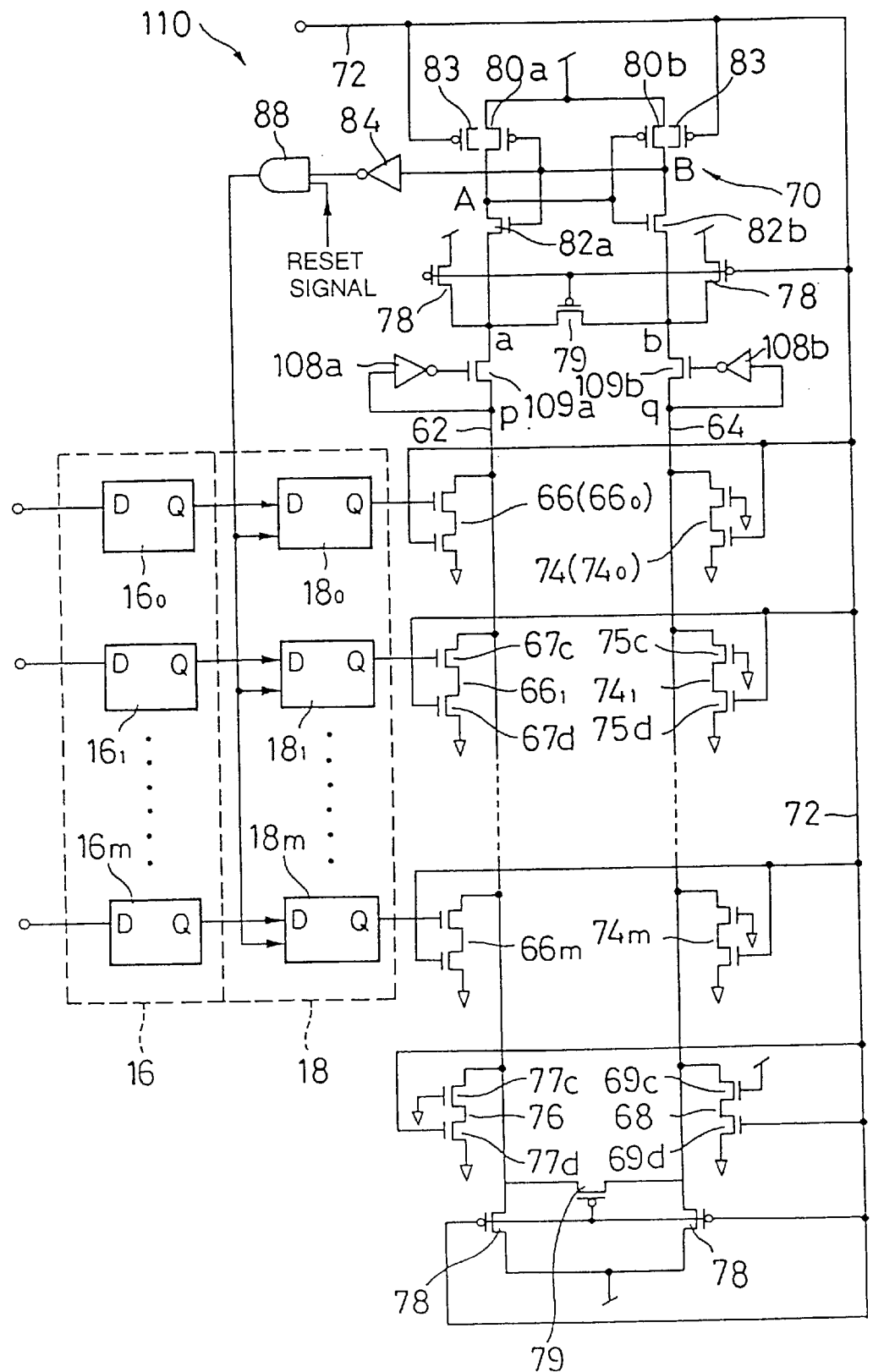
FIG. 20 is a block diagram of still another timing control circuit to which the semiconductor integrated circuit providing a basis for understanding an associative memory and an encoder according to the present invention is applied.

FIG. 20 shows another timing control circuit to which the semiconductor integrated circuit providing a basis for understanding an associative memory and an encoder according to the present invention is applied. The timing control circuit 110 of FIG. 20 is additionally provided with precharge PMOS transistors 78, 78 for precharging contacts a and b at up to a predetermined potential, for example, supply potential $V_{dd}$ (e.g., 5 V) and PMOS 79 for connecting both contacts a and b to make these contacts equipotential in the timing control circuit 106. The gate electrodes of these PMOS 78, 78, 79 are connected to a precharge control line 72.

When the contacts A, B, p, g are first precharged at H level, for example, the supply potential 5 V, the potentials of the contacts a and b are also set at H level of 3.6 V in the timing control circuit 106 of FIG. 19, whereas the potentials of the contacts a and b can be raised up to 5 V in the timing control circuit 110 of FIG. 20. Therefore, the potential difference between the contacts p and g can be made greater than what is set in the timing control circuit 106 of FIG. 19 at a point of time the detecting operation is started by the differential current detection circuit 70, that is, at the point of time either NMOS 82a or 82b is turned on. The timing control circuit 110 of FIG. 20 has a further greater noise margin to ensure accurate, stable timing detection at all times.

Figure 21:
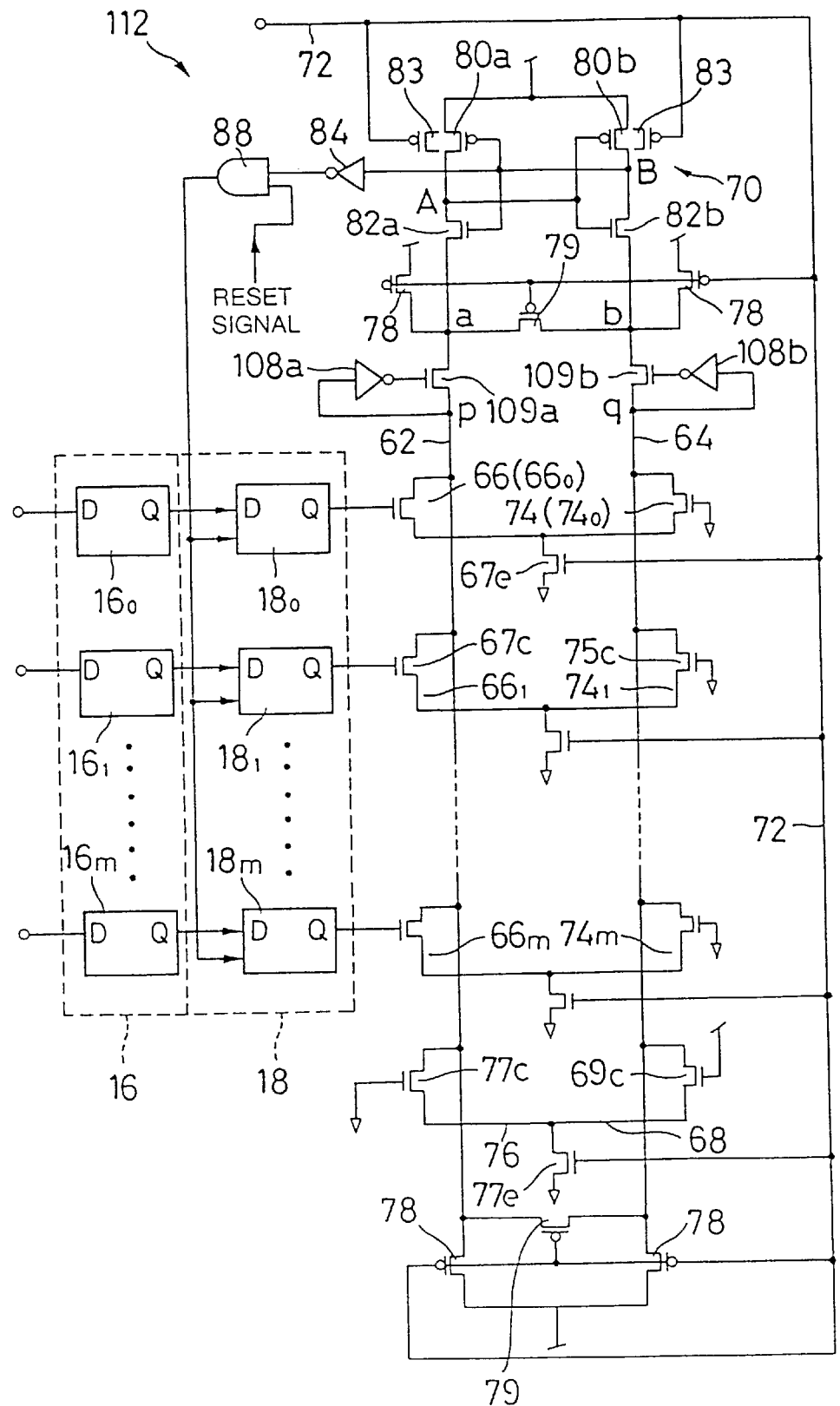
FIG. 21 is a block diagram of still another timing control circuit to which the semiconductor integrated circuit providing a basis for understanding an associative memory and an encoder according to the present invention is applied.

Moreover, use may needless to say be made of control transistors 67e, 77e merging the control transistors 67d, 69d, 75d, 77d of the current drive circuit 66 and the reference current drive circuit 68 for common use as in the case of timing control circuit 112 of FIG. 21.

Figure 22:
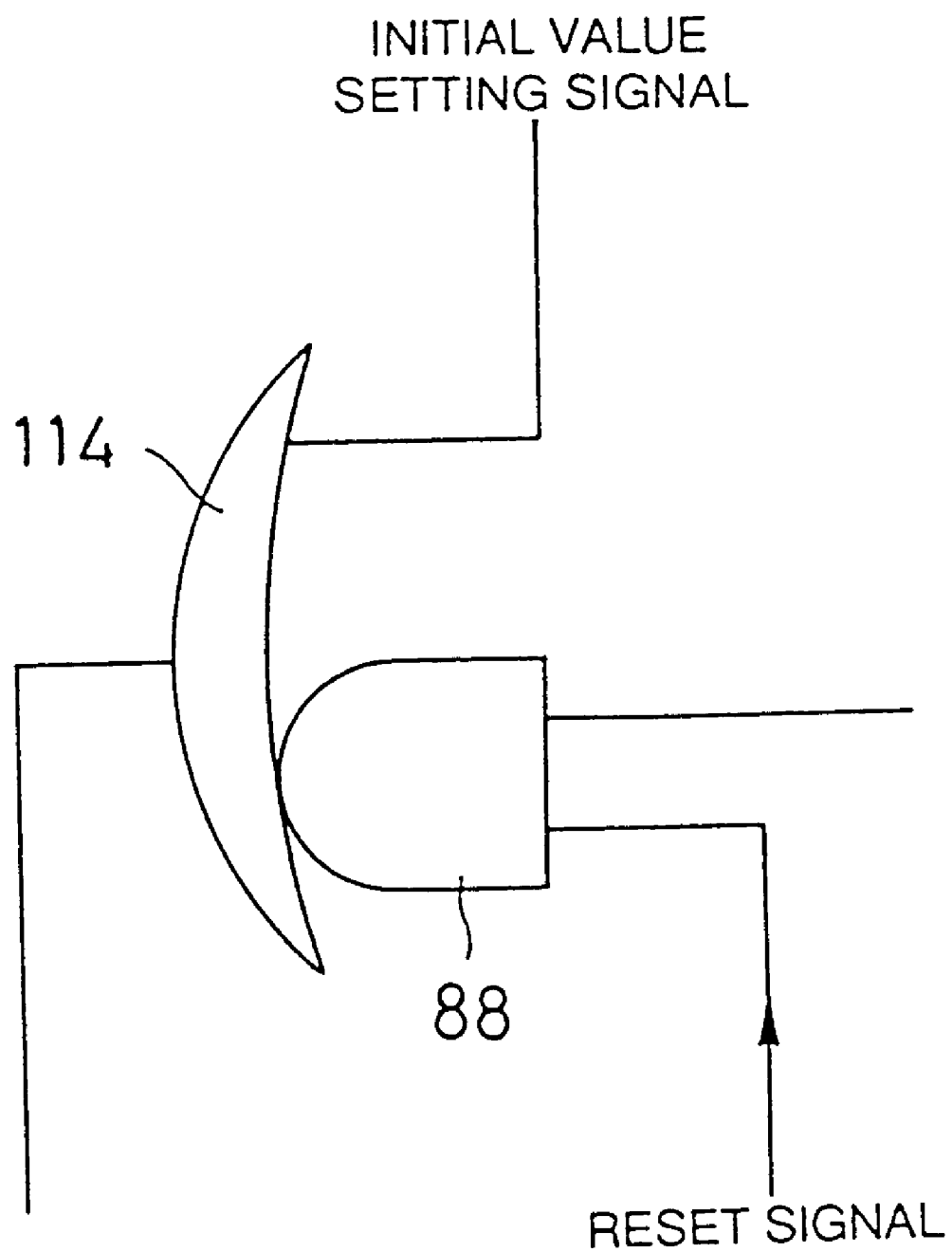
FIG. 22 is a block diagram of a priority subblock encoder component to which the semiconductor integrated circuit providing a basis for understanding an associative memory and an encoder according to the present invention is applied.

An OR logical circuit 114 that has received an initial value setting signal of FIG. 22 is inserted between the AND circuit 88 and the flag register 18 so as to set the initial value of the flag register 18.

As the encoding operation of the main encoder 12 of the encoder 11 of FIG. 8 to which the timing control circuits 100, 106, 110, 112 is similar to what is illustrated by reference to the timing chart of FIG. 13, the description thereof will be omitted.

The timing control circuits with the applications of the semiconductor integrated circuits which provides a basis for understanding an associative memory and an encoder according to the present invention are basically so configured as stated above.

In the semiconductor integrated circuits shown in FIGS. 18–22, the inverters are provided in series or parallel between the first and second signal lines and the differential current detection means and by regulating the threshold voltage of the inverted output of the inverter, the potential difference between two input signals to the differential current detection means when the detecting operation is started by the differential current detection means can be set relatively optionally, so that the differential current detection means is prevented from detection failure and malfunction. It is therefore possible according to these semiconductor integrated circuits to detect the size of the differential current between both signal lines and reverse timing stably with accuracy at all times. In other words, the semiconductor integrated circuits shown in FIGS. 18–22 are hardly affected by noise and stable circuits having a greater operating margin and consequently fit for use as timing control circuits for previously notifying or predicting the termination of the encoding operation in encoders of content addressable memories.

In the semiconductor integrated circuit of FIG. 18, the differential current detection means can be made to perform the detecting operation after the output of the inverter is inverted, regardless of potential changes on the first and second signal lines. In the semiconductor integrated circuits of FIG. 20, moreover, an operating margin can be made greater than that of the semiconductor integrated circuits of FIG. 19.

Figure 23:
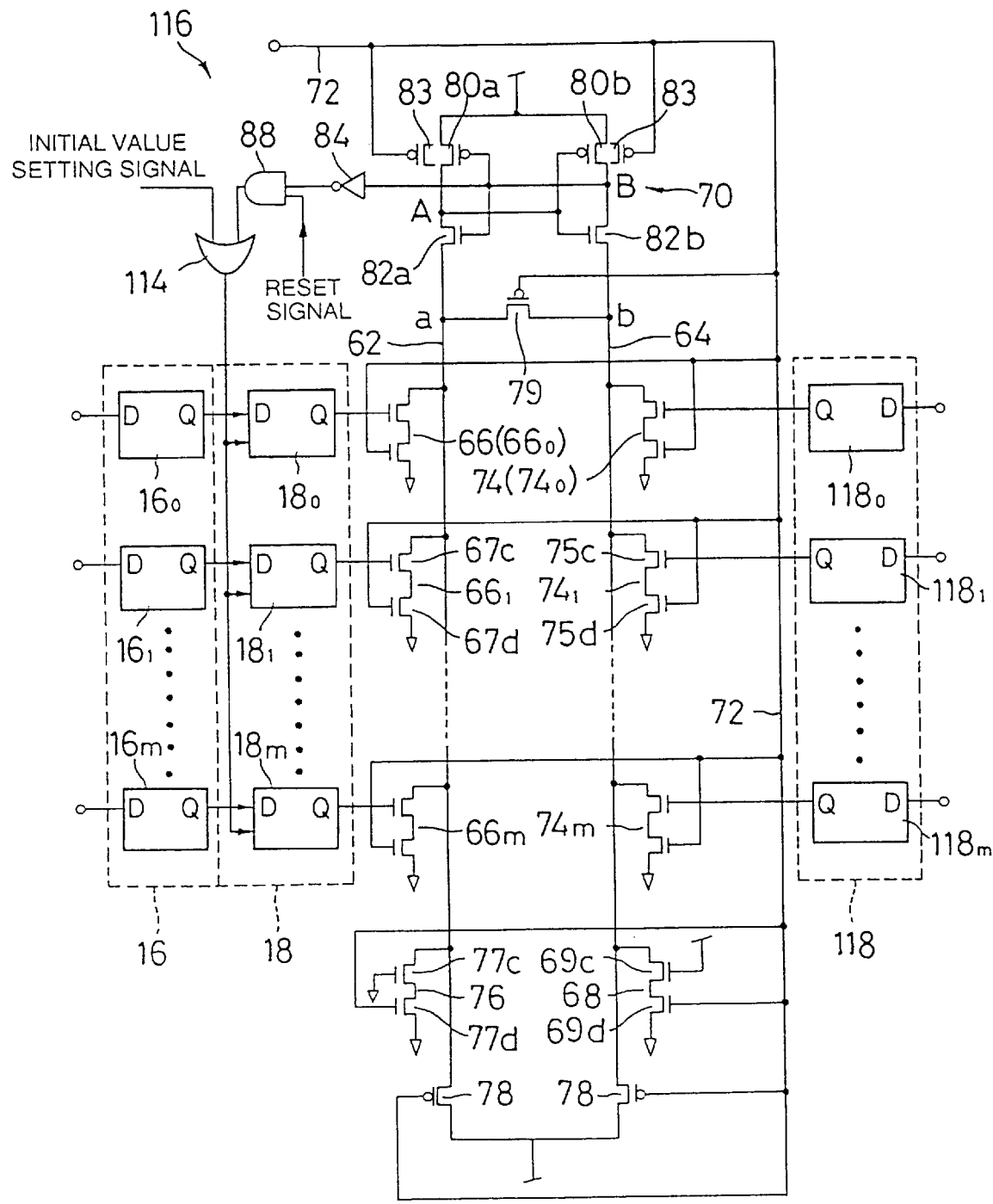
FIG. 23 is a block diagram of still another timing control circuit as a semiconductor integrated circuit which provides a basis for understanding an associative memory and an encoder according to the present invention.

Referring to FIG. 23, another semiconductor integrated circuit which provides a basis for understanding an associative memory and an encoder according to the present invention will be described in detail. The semiconductor integrated circuit of FIG. 23 is applicable to the encoder of FIG. 8 as a number detection circuit for timing control.

In this semiconductor integrated circuit, a reference current control register is made to hold the number of data equal to that of data $k_0$ (M>$k_0 \geq 0$: wherein M (M$\geq$1): the number of data that can be held in a data register) desired to be detected out of the data "1" or "0" held in the data register. For example, the reference current control register is made to hold $k_0$ of data "1" if it is desired to detect that the number of data "1" held in the data register comes to $k_0$.

The current flowing through M of signal unit current drive means provided in parallel to the first signal line, that is, the signal current detection line and controlled by the data held in the data register and the current flowing through N of reference unit current drive means provided in parallel to the reference current drive line as the second signal line and controlled by the data held in the reference current control register are defined as an identical unit current $i_0$ and an offset current ios flowing through a reference offset current drive means provided in the reference current drive line is preset as what is smaller in current value ($i_0$>$i_{os}$>0) than the unit current $i_0$. Therefore, a reference current $i_r$ (=$k_0$ $i_0$+$i_{os}$) has a value greater than $k_0$ $i_0$ and smaller than ($k_0$+1) $i_0$, namely, ($k_0$ $i_0$<$i_r$<($k_0$+1) $i_0$).

In the semiconductor integrated circuit shown in FIG. 23, the unit current $i_0$ flows through each of the signal unit current drive means corresponding to the data register holding desired data according to the operating timing. Consequently, the current i (i=$ki_0$) corresponding to the number k (M>k$\geq$0) flows through the signal current detection line, whereas the reference current $i_r$ flows through the reference current drive line. The differential current detection means is then used to detect the differential current between the current i and $i_r$ flowing through both signal lines and output an inverted differential current code, that is, inversion (timing) of the size relation between both current values i and $i_r$. In this manner, it is detected that the number k of desired data output of the data input to each data input line has reached the number $k_0$. The semiconductor integrated circuit shown in FIG. 23 is capable of detecting the number of desired data held in the data register. Moreover, the number of data to be detected may be set optionally by changing the number of desired data set and held in the reference current control register.

FIG. 23 shows a specific circuit diagram of a timing control circuit 116 to which the semiconductor integrated circuit providing a basis for understanding an associative memory and an encoder according to the present invention is applied. The timing control circuit 116 of FIG. 23 is applied to the encoder 11 shown in FIG. 8 and as it is exactly the same in structure as the timing control circuit 61 of FIG. 12 except for the installation of a reference current control register 118 and an OR circuit 114, like component elements are designated by like reference characters and the detailed description thereof will be omitted. In the timing control circuit 61 of FIG. 12, the serially-connected transistors 75c and 75d are used as dummy circuits 74, whereas in the timing control circuit 116 of FIG. 23, the gate of the NMOS transistor 75c is connected to the output of the reference current control register 118 and the transistor is made to function as a signal unit current drive circuit 74.

The timing control circuit 116 of FIG. 23 comprises a reference current control register 118 having m+1 of data latch circuits $118_0$, $118_1$, . . . , $118_m$, a first signal line (signal current detection line) 62, a second signal line (reference current drive line) 64, m+1 of signal unit current drive circuits (signal unit current drive means) $66_0$, $66_1$, . . . , $66_m$ provided for respective data latch circuits $18_0$, $18_1$, . . . , $18_m$ of a flag register 18 in parallel to the first signal line 62, m+1 of reference unit current drive circuits (reference unit current drive means) $74_0$, $74_1$, . . . , $74_m$ provided for respective data latch circuits $118_0$, $118_1$, . . . , $118_m$ of the reference current control register 118 in parallel to the second signal line, a reference offset current drive circuit (reference offset current drive means) 68 provided for the second signal line 64, a differential current detection circuit (differential current detection means) 70 for detecting the difference between the currents flowing through the first and second signal lines 62, 64, that is, detecting the differential current, and a precharge control signal line 72 for controlling the operating timing of the timing control circuit, namely, the unit current drive circuits 66 ($66_0$, $66_1$, . . . , $66_m$), 74 ($74_0$, $74_1$, . . . , $74_m$) the reference offset current drive circuit 68 and the differential current detection circuit 70.

The reference current control register 118 is similar in structure to the flag register 18 and has m+1 of data latch circuits $118_0$, $118_1$, . . . , $118_m$ and makes $k_0$ of data latch circuits $118_i$ hold $k_0$ of data (hit signal) "1" in accordance with $k_0$ (m+1>$k_0 \geq 0$) of flag data (hit signal "1") to be detected and held in the respective data latch circuits $18_0$, $18_1$, . . . , $18_m$ of the flag register 18. The number of data (hit signal) "1" to be held in the data latch circuit of the register 118 can be set optionally from the outside, and the number $k_0$ to be detected can also be set optionally as occasion demands. Moreover, it is optional to decide which $k_0$ of data latch circuits $118_j$ out of the those $118_0$, $118_1$, . . . , $118_m$ of the register 118 should hold the data The reference unit current drive circuit 74 is exactly the same in structure as the unit current drive circuit 66 and comprises the signal application transistor 75c and the control transistor 75d, these being formed with two of serially-connected N-channel MOS transistors one side of which is connected to the second signal line 64, the other being grounded. The gate electrode of the signal application transistor 75c on the side of the signal line 64 is connected to the output terminal Q of the data latch circuit $118_j$ corresponding to the reference current control register 118, whereas the gate electrode of the control transistor 75d on the grounding side is connected to the control signal line 72. Moreover, the unit current drive circuit 74, like the unit current drive circuit 66, is so arranged as to let the unit current $i_0$ flow from the second signal line 64 when the control transistor 75d is turned on during the detecting operation and when the signal application transistor 75c is turned on simultaneously with receipt of the hit signal "1" at its gate electrode from the reference current control register 118. When the number of hit signals to be detected is $k_0$, $k_0$ of hit signals "1" are held in the reference current control register 118. Consequently, $k_0$ of reference unit current drive circuits 74 are turned on and $k_0$ $i_0$ of currents in the whole circuit flow through the second signal line. The unit currents $i_0$ are arranged so that they are identical in all the unit current drive circuits $66_0$, $66_1$, . . . , $66_m$ and $74_0$, $74_1$, . . . , $74_m$. In this case, however, variations of transistors 67c, 67d and 75c, 75d for use may be ignored on condition that the variations thereof are produced during the course of processing.

On the other hand, the reference offset current drive circuit 68 is used for the predetermined reference offset current $i_{os}$ to flow through the second signal line. The value of the reference offset current $i_{os}$ may be smaller ($i_0 > i_{os} > 0$) than that of the unit current $i_0$ and may be a value at which the differential current detection circuit 70 is able to detect the differential current. This current value $i_{os}$ may be determined in consideration of the unit current $i_0$ and variations of circuit elements such as the transistors 67c, 67d, 75c, 75d constituting the unit current drive circuits 66 and 74, the transistors 69c, 69d constituting the reference offset current drive circuit 68. It should preferably be $i_{os}$=0.2 $i_0$–0.8 $i_0$, for example.

As a result, the value of the reference current $i_r$ flowing through the second signal line at the time of detection is given as the sum ($k_0$ $i_0 + i_{os}$) of the value $k_0$ $i_0$ of the current flowing through $k_0$ of unit current drive circuits 74 which are turned on in accordance with the number (of hit signals to be detected) $k_0$ and the value ios of the reference offset current flowing through the reference offset current drive circuit 68. The current value ($k_0$ $i_0 < i_r < (k_0+1)$ $i_0$) is greater than what is $k_0$ times the unit current value $i_0$ and smaller than what is $k_0+1$ times. For example, the reference current value $i_r$ is greater than $i_0$ and smaller than $2i_0$ in order to detect the last one of the hit signal but should be set at $i_r$=1.2 $i_0$–1.8$i_0$ in consideration of variations of component circuit elements and a margin in the differential current detection circuit 70.

The output of the AND circuit 88 of the differential current detection circuit 70 is connected to the clock terminal of the flag register 18. Moreover, the output of the AND circuit is connected to the one input of an OR circuit 114 and the other input of the OR circuit 114 is connected to an initial value setting signal.

Subsequently, the detecting operation of the timing control circuit 116 shown in FIG. 23 will be described as a representative example in a case where the last one of the hit signal of the flag data in the flag register 18, that is, its last hit signal is detected. In this case, flag data having hit signals ("1") in the plurality of data latch circuits $18_j$ is held in the flag register 18, whereas data having hit signals ("1") in one data latch circuit $118_j$ is held in the reference current control register 118. The unit current value in each of the unit current drive circuits 66 and 74 is $i_0$ and the reference offset current value $i_{os}$ in the reference offset current drive circuit 68 is set at 0.5 $i_0$ on the assumption that the reference current $i_r$ is 1.5 times as great as the unit current $i_0$, that is, set at 1.5 $i_0$.

Prior to starting the detecting operation, one data latch circuit $118_j$ of the reference current control register 118 is made to latch-hold the hit signal "1". With the precharge control signal line 72 set at L (low: "0"), the first and second signal lines 62 and 64, consequently contacts a and b, and further the contacts A and B within the differential current detection circuit 70 are precharged at H (high) potential (e.g., 5 V) likewise.

With the precharge control signal line 72 at H (high: "1"), the PMOS transistors 78, 79, 83 are subsequently turned off and the control transistors 67d, 69d, 75d, 77d are turned on. Consequently, two NMOS transistors 75c and 75d of the unit current drive circuit $74_j$ and two NMOS transistors 69c and 69d of the reference offset current drive circuits 68 corresponding to one data latch circuit $118_j$ holding the hit signal "1" in the reference current control register 118 are simultaneously turned on. The reference current $i_r$ (=1.5 $i_0$) flows through the second signal line 64 to lower the potential of the contact a. On the other hand, the drive current $i_0$ flows from the first signal line through the unit current drive circuit $66_j$ connected to the data latch circuit $18_j$ whose flag data has the hit signal "1" out of m+1 of current drive circuits 66 ($66_0$, $66_0$, . . . , $66_m$). Since the flag data in the flag register 18 has a plurality of hit signals "1", for example, k (k≧2) of hit signals in this case, current of k$i_0$ flows through the first signal line 62 and the potential of the contact a drops accordingly.

When k is greater than 2, the contact B keeps "1" because current k$i_0$ flowing through the first signal line 62 is greater than the reference current $i_r$ (=1.5 $i_0$) flowing through the second signal line 64 and the inverter 84 connected thereto applies "0" to the AND circuit.

The detecting operation performed by the timing control circuit 116 at the time the number of hit signals remaining in the flag register 18 comes up to one lowers the potential of the contact B to low level and the potential is inverted by the inverter 84, whereby "1" is applied to the AND circuit 88. The potential of the contact A is maintained at H (high) level.

When the output signal of the inverter 84 of the timing control circuit 116 changes from "0" to "1", the result of detection obtained from the AND circuit 88, that is, a switch control signal is obtained from the "1" signal and the reset signal of the flag register 18 and this switch control signal may be used to switch the flag data in the flag register 18 over to the flag data in the prefetch circuit 16.

Although the signal application transistor 67c and the normally OFF transistor 77c are provided on the side of the first signal line 62 and the signal application transistor 75c, the normally ON transistor 69c on the side of the second signal line 64, and the control transistors 67d, 75d, 69d, 77d on the grounding side in the unit current drive circuits 66, 74, the reference offset current drive circuit 68 and the dummy circuit 76 of the timing control circuit 116 of FIG. 23, it is not limited to this arrangement, which may be made conversely. However, the arrangement illustrated above is preferred because, when the detecting operation is started, the ON-current directed from the first and second signal lines 62, 64 to the control transistors 67d, 77d, 75d respectively connected to the transistors 67c, 77c, 75c that have not been turned on (that have not received the hit signal "1" at the gate electrode of each) prevents the voltage of the first and second signal lines from dropping to ensure the stable operation of the differential current detection circuit 70 when the branching of the contacts A and B is started, that is, by increasing the potential difference between the contacts a and b at a point of time the potential of the contacts a or b becomes lower than 3.6 V.

Although the identical unit current $i_0$ is caused to flow through both unit current drive circuits 66 and 74, it is not limited to this arrangement but different currents may be allowed to flow therethrough. At this time, the reference current $i_r$ may be determined in accordance with the value of the reference offset current $i_{os}$. Although the reference offset current $i_{os}$ is defined as what is smaller than the unit current $i_0$, it is not limited to this arrangement but the current $i_{os}$ may be determined properly in accordance with the number of data latch circuits holding the hit signal "1" in the reference current control register 118 and the value of the reference unit current made to flow through one reference unit current drive circuit 74.

The timing control circuit 116 is basically so configured as stated above.

The timing control circuit 116 is applicable to the encoder 11 of FIG. 8. However, it is not limited to this arrangement but also applicable to the circuit required to detect any given number of signals at a plurality of detection nodes.

With the semiconductor integrated circuit of FIG. 23 as stated above in detail, the number of predetermined data in the data register for use in controlling the signal unit current drive means provided for the first signal line can be detected by making the reference current control register hold a predetermined number of data, for example, data "1" for controlling the reference unit current drive means. Therefore, the semiconductor integrated circuits shown in FIG. 23 are fit for used as timing control circuits for previously notifying or predicting the termination of the encoding operation in the encoders of content addressable memories.

Referring to FIGS. 24–27, an encoder which provides a basis for understanding an associative memory and an encoder according to the present invention will be described.

In CAM shown in FIGS. 24–27, when retrieval data are fed to CAM blocks constituting CAM at the time of match retrieval, the match retrieval is made in a plurality of CAM subblocks. At this time, the result, that is, flag data including a signal (hit signal) matching the retrieval data is held in the plurality of CAM words on a CAM subblock basis. Then the highest priority CAM subblock is selected by a priority subblock encoder and its flag data is transferred to and held in the flag register of a priority main encoder. The priority main encoder encodes the hit signal in the flag data stored in the flag register in the order of predetermined priorities and outputs a hit address. As hit addresses are output, the hit signals in the flag register are sequentially reset in the priority main encoder.

On the other hand, a timing detection control circuit for previously notifying or predicting the termination of the hit signal detects the number of hit signals held in the flag register during the operation of encoding flag data in order to prepare to feed flag data in the second priority CAM subblock selected by the priority subblock encoder before the termination of the whole hit signal of the flag data in the first priority CAM subblock. When the number of remaining hit signals comes up to one, for example, a flag data sense circuit provided on a CAM word basis detects flag data in the second priority subblock in response to the detection signal. The flag data in the second priority CAM subblock is fed to the flag register immediately after the termination of encoding the whole hit signal in the flag data to start encoding the hit signal in the flag data. These steps are repeated to encode the hit signals in the whole CAM block, that is, to output addresses.

With the encoder shown in FIGS. 24–27, since the hit signal of the flag data in the CAM subblock subject to subsequent encoding has been ready to be fed to the flag register by the flag data sense (detection) circuit while the hit signal in the flag data in the preceding CAM subblock is being encoded, the time required to transfer the hit signal from the CAM subblock to the flag register of the priority main encoder can be saved. It is simultaneously detected that the number of hit signals ultimately becomes one immediately before the encoding of the last hit signal of the flat data in the flag register is started. Then the flag data sense circuit detects the flag data in the second priority CAM subblock and the flag data is fetched in the next encoding cycle so that the hit signal in the flag data thus fed can be encoded. Since no loss is caused in the encoding cycle, the encoding time in not only the whole CAM block but also the whole CAM can be shortened, whereby the high-speed match retrieval operation of CAM becomes possible.

When the number of hit signals of flag data to be encoded ultimately comes up to one while flag data in one CAM subblock is being encoded, flag data to be subsequently encoded in the CAM subblock is taken to the signal line and fetched into the flag register at the termination of the preceding encoding operation. Therefore, the flag data is encoded quickly and efficiently, and this makes not only a prefetch circuit and the like unnecessary but also the area occupied thereby reducible in the encoder shown in FIGS. 24–27.

Referring to the accompanying drawings, an encoder as a preferred embodiment, which provides a basis for understanding an associative memory and an encoder according to the present invention, will be described.

Figure 24:
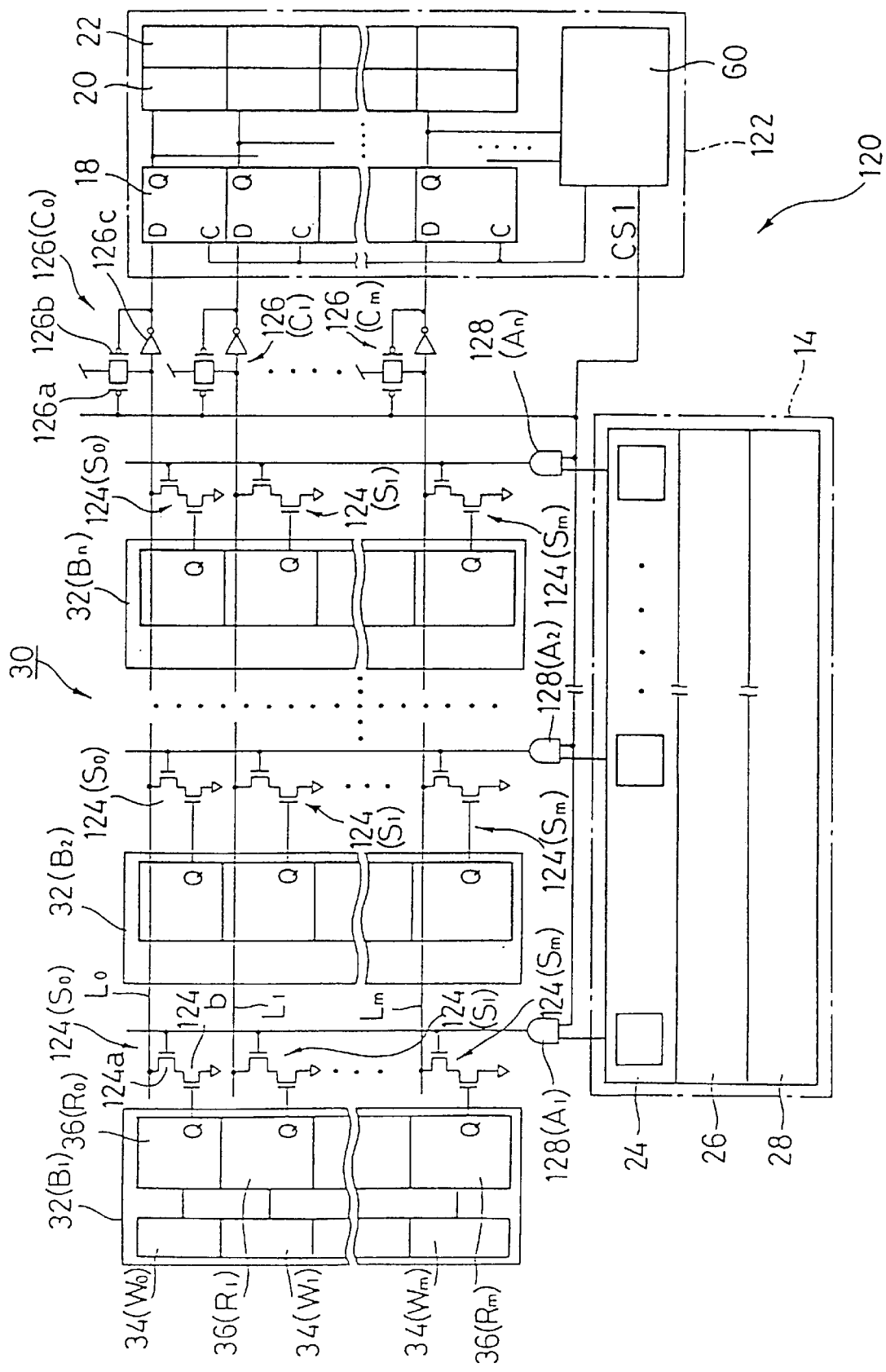
FIG. 24 is a block diagram of another CAM block applicable to an encoder which provides a basis for understanding an associative memory and an encoder according to the present invention.
Figure 25:
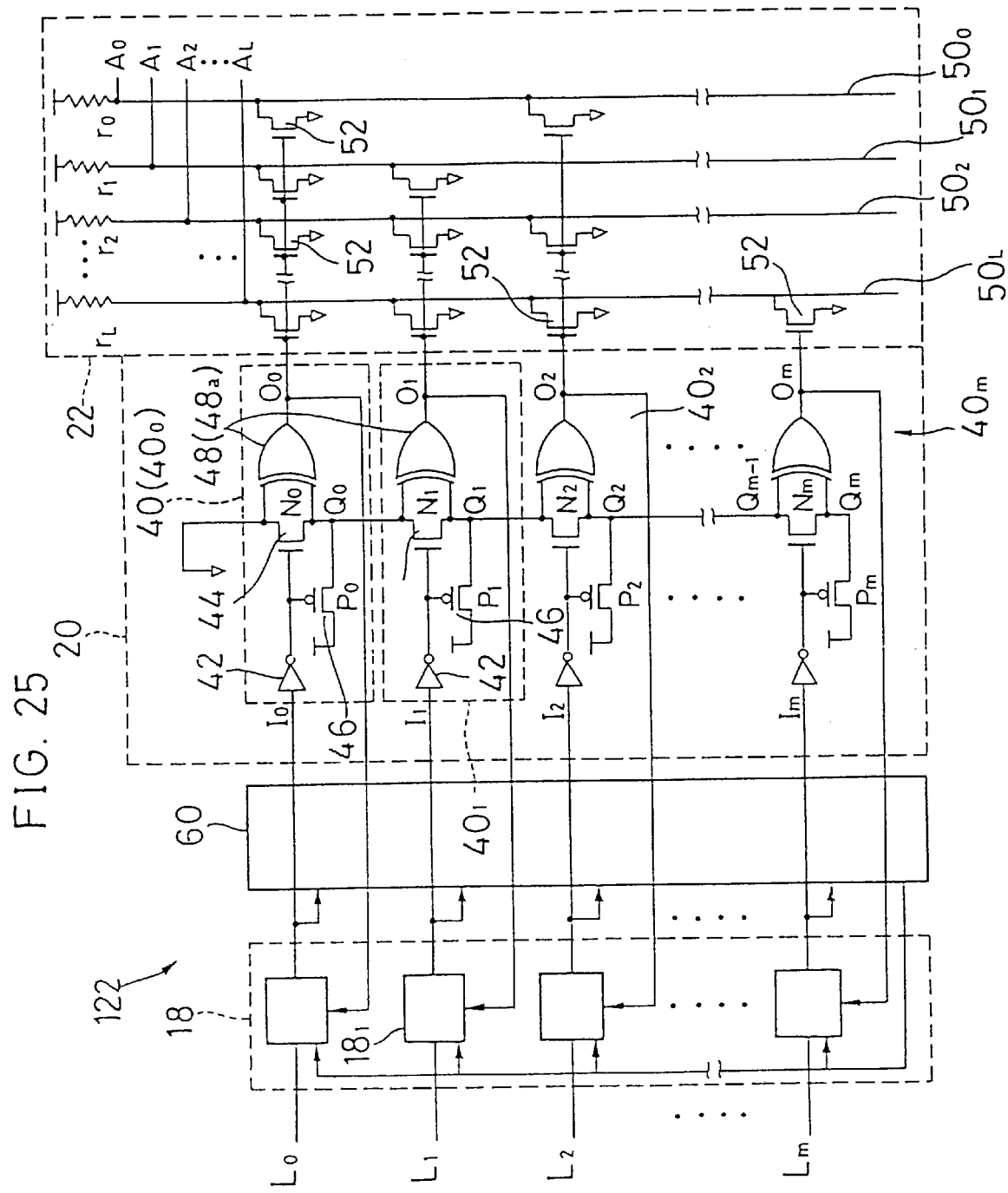
FIG. 25 is a block diagram of another priority encoder for use in an encoder which provides a basis for understanding an associative memory and an encoder according to the present invention.
Figure 26:
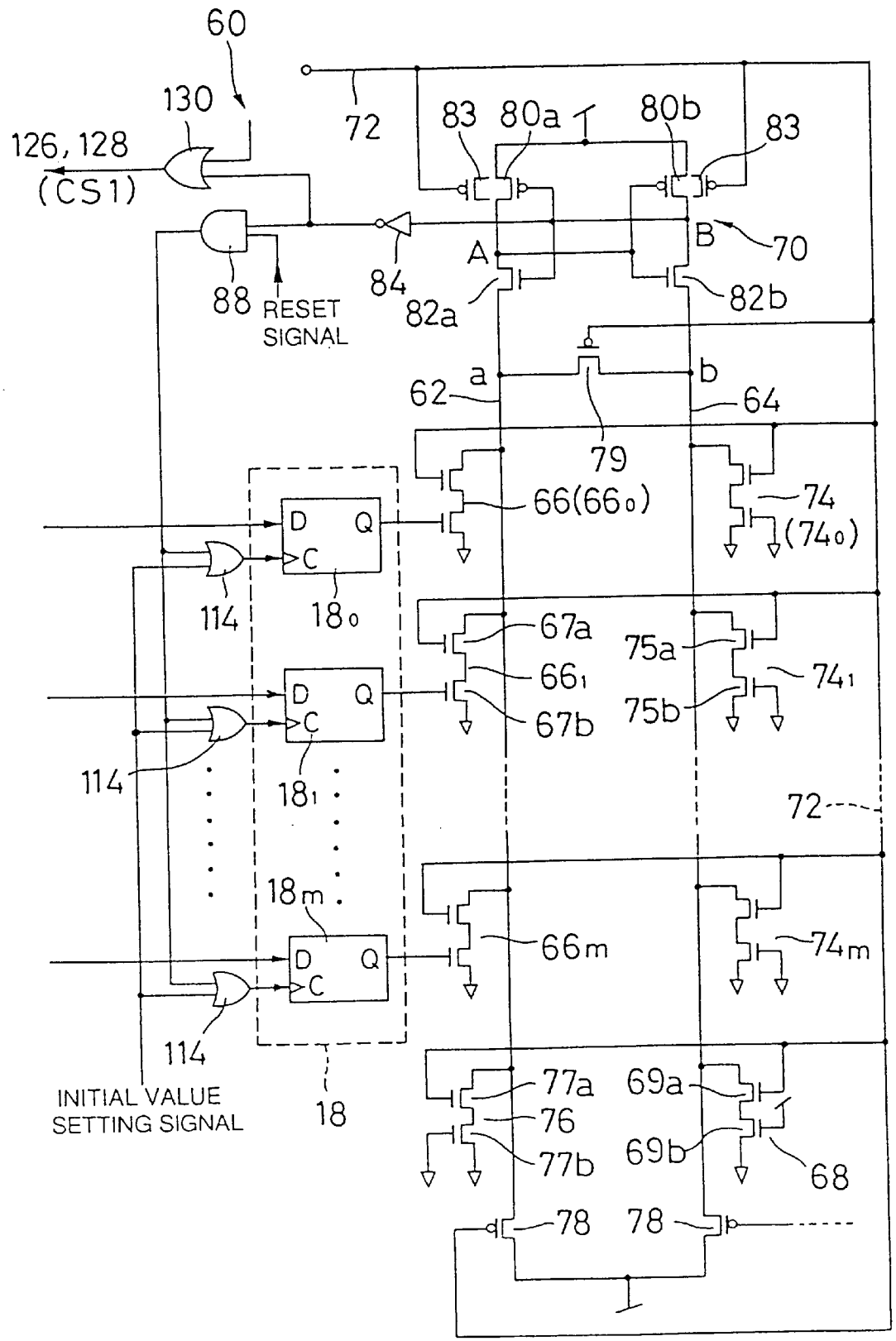
FIG. 26 is a block diagram of another timing control circuit to which a semiconductor integrated circuit for in the encoder providing a basis for understanding an associative memory and an encoder according to the present invention is applied.
Figure 27:
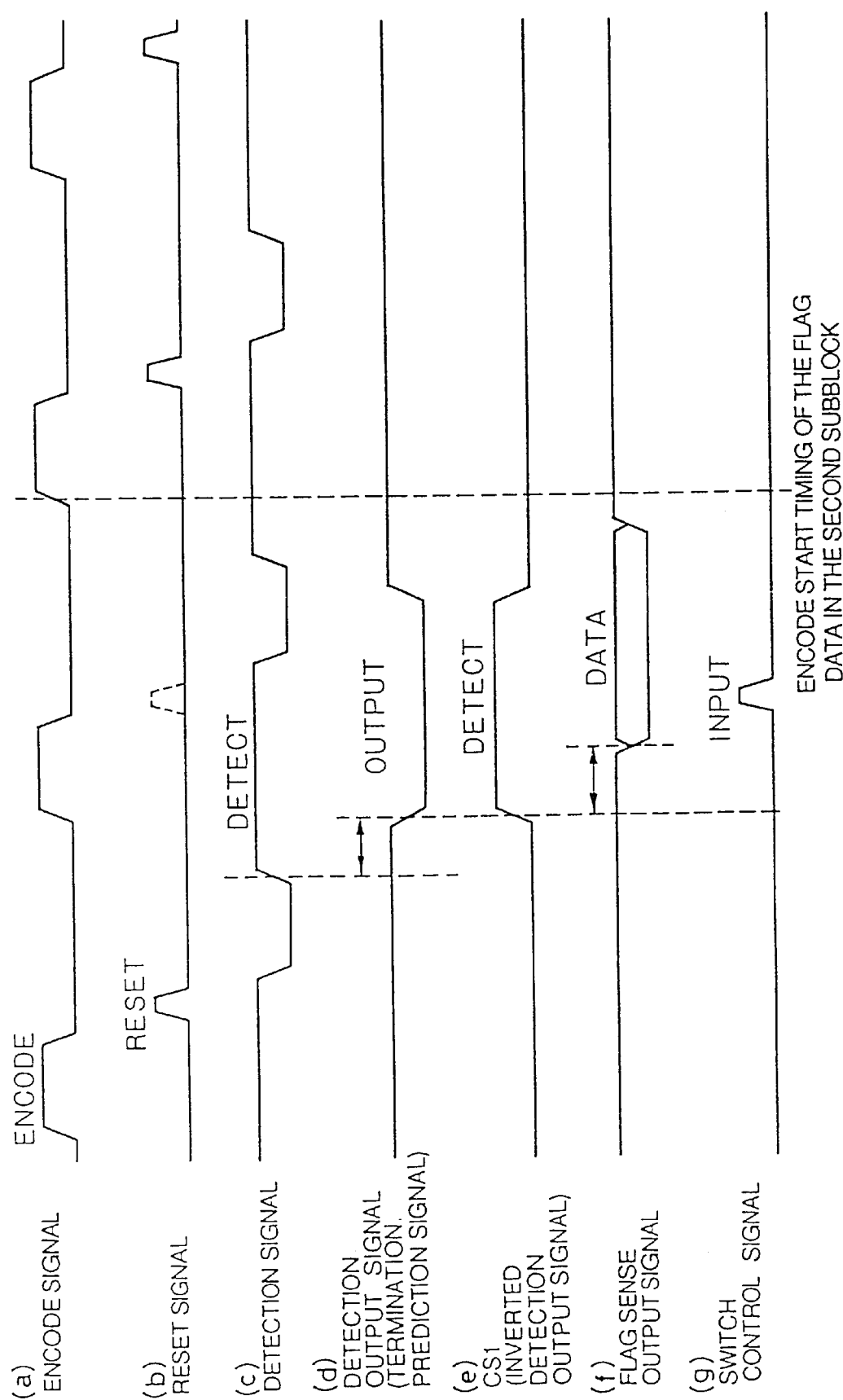
FIG. 27 is a timing chart explanatory of the function of the encoder which provides a basis for understanding an associative memory and an encoder according to the present invention.

FIGS. 24 to 27 illustrate another embodiment of an encoder which provides a basis for understanding an associative memory and an encoder according to the present invention: FIG. 24 is a block diagram including a CAM portion in the encoder which provides a basis for understanding an associative memory and an encoder according to the present invention; FIG. 25 is a partial circuit diagram; FIG. 26 is a circuit diagram of the principal portion; and FIG. 27 is a timing chart. As the encoder 120 shown in these drawings is exactly the same in structure as the encoder 11 shown in FIGS. 8–10 except for nothing of the prefetch circuit 16, like component elements are designated by like reference characters and the detailed description thereof will be omitted. In FIG. 24, the flag data sense circuit 126 is illustrated in a little detail, however, this configuration of the encoder 120 including the flag data sense circuit 126 is not different so great from the encoder 11 as shown in FIG. 8. FIG. 24 includes a switch circuit 124 for selecting a register 36 of a desired subblock and an AND circuit 128.

FIG. 24 is a schematic diagram of another embodiment of a CAM block to which the encoder providing a basis for understanding an associative memory and an encoder according to the present invention is applied.

The encoder 120 of FIG. 24 comprises a priority encoder (hereinafter called "main priority encoder" or "main encoder") 122, a priority subblock encoder (hereinafter called "subblock priority encoder" or "subblock encoder") 14, a switch circuit 124 for detecting flag data, a flag data sense circuit 126 and an AND circuit 128. The main encoder 122 comprises a flag register circuit 18, a priority circuit 20, an encode circuit 22, and a timing control circuit 60. The subblock encoder 14 comprises a latch circuit 24, a priority circuit 26, and an encode circuit 28.

As shown in FIG. 24, a CAM memory block 30 (hereinafter called "memory block") comprises a plurality (n of them $B_1, B_2, \ldots, B_n$ in this embodiment) of CAM subblocks (hereinafter called "subblock") 32. Further, n ($A_1, A_2, \ldots, A_n$) of AND circuits 128 are provided for each subblock and there are installed m+1 ($C_0, C_1, \ldots, C_m$) of flag sense circuits 126.

A description will subsequently be given of the switch circuit 124, the flag data sense circuit 126 and the AND circuit 128 for use in detecting flag data as those which best feature in the encoder 120 of FIG. 24.

The switch circuit 124 ($S_0$) shown herein as a representative example which is connected to the register 36 ($R_0$) of the subblock 32 ($B_1$) comprises two NMOS transistors 124a, 124b connected in series. Each switch circuit 124 is connected to the flag data sense circuit 126 via detection lines L ($L_0, L_1, \ldots, L_m$) connected in parallel, the detection line L corresponding to the electrode (e.g., drain electrode) of one transistor 124a. The gate electrode of the transistor 124a is connected to the AND circuit 128 in parallel in each subblock 32. Moreover, the other transistor 124b is connected to the output terminal of the register 36 corresponding to its gate electrode, the electrode (e.g., source electrode) of the transistor 124b being grounded. Both transistors 124a, 124b of this switch circuit 124 are turned on when the register 36 outputs the hit signal ("1") and when a high-level signal "1" is received from the AND circuit 128 thereby, and they discharge charge by grounding the detection line L to lower the potential of the detection line L. When the data held by the register 36 is "0", the potential of the detection line L is left unchanged by the switch circuit 124 even though the high-level signal "1" is supplied from the AND circuit 128 since the transistor 124 of the switch circuit 124 remains OFF.

The flag data sense circuit 126 is formed with a self-driven type sense amplifier and precharges the detection line at a predetermined potential and detects the potential of the detection line thus precharged so as to detect the data (hit signal "1" or mismatch signal "0") held in the register 36. The flag data sense circuit 126 designated by a reference character ($C_0$) as what represents them by way of example is provided for the detection line L and has two PMOS transistors 126a, 126b, an inverter 126c. These flag data sense circuits 126 is such that one electrode (e.g., drain electrode) of PMOS transistor 126a or 126b is connected to the power supply, whereas the other electrode (e.g., source) is connected to the detection line L. Further, the gate of one transistor 126a is connected to the timing control circuit 60 of 26 in the main encoder 122 in parallel, whereas the gate of the other transistor 126b is connected to the detection line L on the output side of the inverter 126c. The inverter 126c is indirectly connected to the detection line L and applies the inverted signal to the flag register circuit 18 of the main encoder. The flag data sense circuit 126 turns on PMOS transistors 126a, 126b while the output level ($CS_1$) of the timing control circuit 60 to be described below is low (L: "0") so as to precharge the detection line L.

Then the timing control circuit 60 outputs a signal for previously notifying the termination of encoding the flag data in one subblock 32, for example, indicating that the hit signal of the flag data in the subblock being used for the encoding operation is the last one. When the output level ($CS_1$) becomes high (H: "1"), the flag data sense circuit 126 turns off the transistor 126a and maintains the H (high) state in which the detection line L has been precharged. Incidentally, the transistor 126b is in the ON stage. On the other hand, a high-level signal (H: "1") is output from the AND circuit 128 provided in accordance with the second priority subblock 32 with "1" latched in the data latch circuit 24 of the subblock encoder 14. As a result, both transistors 124a, 124b are turned on in the word such that data in the register 36 of the selected subblock 32 is the hit signal "1" and the precharged charge is discharged from the detection line L. The potential of the detection line L is thus lowered and changed from high (H) to low (L) state. The flag data sense circuit 126 detects the potential drop of the detection line L and applies the hit signal in the register 36 to the flag register circuit 18. In other words, the inverter 126c inverts the low (L) potential of the detection line L, turns off the PMOS transistor 126b and applies the high (H) potential hit signal "1" to the input signal line of the flag register 18 of the main encoder 122. While the output level (CS1) of the timing control circuit 60 is at the high (H) level, on the other hand, the switch circuit 124 is not tuned on if the data in the register 36 of the subblock 32 is the mismatch signal "0" and the potential of the detection line L does not vary and besides the PMOS transistors 126a, 126b of the flag data sense circuit 126 are held ON. The mismatch signal "0" in the low (L) state inverted by the inverter 126c is applied from the flag data sense circuit 126 to the input signal line of the flag register 18 of the main encoder 122.

The flag data sense circuit 126 detects flag data in the second priority subblock 32 until the encoding of the last one of to-be-encoded hit signal in the flag date of the first priority subblock 32 is terminated. When the last hit signal is encoded completely before being applied to the clock terminal of the flag register 18, the flag data thus detected is immediately applied to the flag register 18 and latched therein.

The AND circuit 128 is used to AND the encode termination timing notifying signal ($CS_1$) from the timing control circuit 60 with the latch data (or rest output) in the data latch circuit of the subblock encoder 14 and to control the whole switch 124 of the corresponding subblock 32. Only when the notifying signal ($CS_1$) and the latch data are simultaneously at H (high) level "1", the output of the AND circuit 128 is set at H (high) level and the transistor 124a in each switch circuit 124 is turned on. If the data held in the register 36 of the subblock 32 is the hit signal ("1"), the transistor 124b is turned on and the switch circuit 124 is also turned on, whereby the detection line L is grounded and the potential drops from high to low level; if, however, it is the mismatch signal ("0"), the transistor 124b is held OFF and the switch circuit 124 is not turned on and consequently the potential of the detection line L does not vary.

The main encoder 122 has the flag register circuit 18, the priority circuit 20, the encode circuit 22 and the timing control circuit 60 as shown in FIGS. 24 and 25. The flag register 18 has m+1 data latch parts (with reference characters attached to the corresponding detection line L for convenience) corresponding to the detection line L and these latch parts hold data on the detection line L supplied from the timing control circuit according to the timing signal in the order of predetermined priorities and are reset by the signal applied from the priority circuit 20. This flag register 18 holds the flag data while the encode circuit 22 encodes all of the hit signals, and resets the hit signal at the word address each time that the hit signal at the high priority word address is encoded.

Although the flag register 18 employs a D-latch in this embodiment, any other one may be selected for use as long as one bit can be held temporarily.

The main encoder 122 of FIG. 25 for use in the encoder 120 and the main encoder 12 of FIG. 2 for use in the encoder 10 are different in that the former has the timing control circuit 60 and that the node $Q_m$ (OR output) of the priority circuit 20 is not connected via the inverter 49 to the flag register 18.

More specifically, by use of termination data "0" outputted from the $Q_m$ node after the last hit signal in the flag data held in flag register 18 is reset, the priority circuit 20 of the main encoder 12 of FIG. 2 switch the flag data in the flag register 18 over to flag data in the second priority subblock 32 latch-held in the prefetch circuit 16. In other words, in the main encoder 12 of FIG. 2, output "0" of node $Q_m$ is inverted by the inverter 49 and the inverted value "1" is supplied to the flag register 18. The flag data in the next priority subblock 32 latch-held in the prefetch circuit 16 is fed to the corresponding circuit of the flag register circuit 18 and held therein. Then the flag data in the subsequent priority subblock 32 selected by the subblock encoder 14 beforehand is read from the register 36 and latch-held in the vacant prefetch circuit 16. The priority circuit 20 thus terminates the processing of the flag data in the first priority subblock and since it need not wait for the flag data in the second priority subblock transferred from the register 36 of the subblock 32, it can perform the encoding operation with efficiency likewise. In this method, however, there occurs a cycle in which the flag data in the subblock is impossible to encode when it is switched in the priority encode cycle started by resetting since the contents of the flag register 18 are switched over to the second priority flag data held in the prefetch circuit 16 after the last hit signal in the flag data in the first priority subblock held in the flag register 18 is reset. As a result, there may be produced a time interval during which no encode output operation can be performed.

In the encoder 120 of FIG. 24, instead of resetting the last hit signal in the priority circuit 20 as an input signal with the result of detection (encode termination prediction signal) when the last hit signal is detected after the number of hit signals in the flag data in the flag register 18 is detected by means of the timing control circuit 60 as shown in FIG. 26, the flag data in the second priority subblock 32 held in the prefetch circuit 16 is shifted (input) to the flag register 18. With respect to even the flag data in the identical subblock, priority encoding can be carried out in the same cycle even when the flag data in the subblock is varied. Needless to say, the prefetching time (the time required to transfer the flag data from each subblock 32 to the main encoder 12) is made irrelevant to the encoding process by prefetching the flag data in the third priority subblock 32 preselected by the subblock encoder 14 from the register 36 to the prefetch circuit 16 caused to have a free space by switching the flag data in the subblock of the flag register 18 according to the encoder 120 of FIG. 24 and latch-holding the result. Encoding efficiency can thus be improved. Moreover, the last hit signal in the flag data in the flag register 18 need not be reset in the encoder 120 of FIG. 24.

FIG. 26 shows a timing control circuit 60 which features the encoder 120 of FIG. 24.

The timing control circuit 60 shown in FIG. 26 is the same in structure as what is shown in FIG. 10. In this timing control circuit 60, The output line is extended from the contact B and connected via the inverter 84 to the AND circuit 88 and its output is connected via the OR circuit 114 to the clock of each of the data latch circuit $18_0, 18_1, \ldots 18_m$ of the flag register 18. An initial value setting signal for setting the initial value of the flag register 18 is applied to the other input of the OR circuit 114. Moreover, the output of the inverter 84 is connected via an OR circuit 130 to the AND circuit 128 and the reset signal of the flag register 18 is applied to the other input of the AND circuit 88.

As previously noted, the timing control circuit 60 detects the number of hit signals "1" held in the flag register 18. It is apparent that more than one hit signal "1" is held in the flag register 18 if the output signal from the inverter 84 of the timing control circuit 60 is "0" and the number of hit signals is one or less if the output signal is "1". In this encoder 120 of FIGS. 24–27, the CS1 signal output from the OR circuit 130 is led to the AND circuit 128 and the flag data sense circuit 126 and when the CS1 signal is "1", that is, while the remaining last one hit signal is being encoded, the reading and switching of the flag data in the memory subblock 32 is quickly performed to make the switch circuit 124, the AND circuit 128 and the flag data sense circuit 126 detect the flag data in the next memory subblock 32.

On the other hand, the subblock 32 whose block hit signal latch-held in the data latch circuit 24 is the hit signal ("1") is selected in the order of predetermined priorities, from left to right in FIG. 24, in the priority circuit 26 of the subblock encoder 14 and the priority-ordered output signal having "1" at that block address is produced. The output signal is encoded and output by the following stage encode circuit 28 before being applied to the AND circuit 128 corresponding to the subblock 32. As mentioned previously, the AND circuit 128 applies a high-level signal to the switch circuit 124 only when the block hit signal is "1" and simultaneously when the high-level signal is applied thereto from the timing control circuit 60. As a result, the switch circuit 124 corresponding to the word 34 of the hit signal "1" grounds the signal line L. The flag data sense circuit 126 discharges the charge applied by the flag data sense circuit 126 to the signal line L beforehand and detects the potential drop on the signal line L, that is, the change of the potential from high to low, whereby the hit signal at the high potential inverted by the inverter 126c is applied to the flag register 18. The termination signal of the last one hit signal in the main encoder 122 causes theses hit signals (flag data) to be applied to the flag register 18.

FIG. 27 shows an encode timing chart of the main encoder 112 using the timing control circuit 60 shown in FIG. 26 in order to describe the encoding operation in the encoder 120 by way of example.

In FIG. 27, (a) represents an encode signal indicating encode timing in the main encoder 12; (b) a reset signal indicating the reset timing of the hit signal "1" in the flag register 18; (c) a detection signal indicating detection timing at which the number of remaining hit signals in the timing control circuit 60; (d) a detection output signal (termination notifying signal) in the timing control circuit 60; (e) the signal ($CS_1$) applied from the timing control circuit 60 via the OR circuit 130 to the AND circuit 128 and the flag data sense circuit 126; (f) a flag sense output signal (the output data signal of the flag data sense circuit 126) in the second priority subblock 32 to the flag register 18; and (g) a flag data switch control signal (termination signal) indicating shift timing of the following fag data to the flag register 18.

As is obvious from FIG. 27, while the hit signal in the same flag data held in the flag register 18 is being encoded with the predetermined priority, it has been so arranged that the encode cycle (a) and the detection cycle (c) is started (rise) after a passage of fixed time from the rise timing of the reset pulse (b) of the hit signal. When, however, the timing control circuit 60 detects the last hit signal at the detection timing activated by the encode pulse (a), the reset pulse (b) and the input pulse (g), with the detection output signal (d) as the termination notifying (prediction) signal changed from the contact B to the low level like FIG. 27(*d*), the CS1 signal (e) shown in FIG. 27(*e*) as the inverted signal of the detection output signal (d) is applied to the AND circuit 128 and the flag data sense circuit 126. Therefore, the flag data sense circuit 126 precharges the signal line L and discharges the precharged charge by grounding the signal line L corresponding the word with the switch circuit 124 supplied with the high-level signal from the AND circuit 128. However, the potential of the signal line L corresponding to the word without the hit signal held therein does not vary and so does the precharged charge. The signal line L allows its potential to change in contrast to the flag data in the register 36, so that the output signal is settled as shown in FIG. 27(*f*). FIG. 27(*f*) illustrates the flag data having the hit signal "1" and what has no hit signal.

Then the output signal of the flag data sense circuit 126 is fetched to the flag register 18 in synchronization with the switch control signal (g) and the encoding operation is performed by the priority circuit 20 and the encode circuit 22 using the flag data in the continuously encode cycle so that an encode address is output. The main encoder 122 thus performs the encoding operation in the predetermined cycle and produces an encode output. In this case, the switch control signal (g) is output by ANDing the reset pulse(b) and the inverted data(e) of the detection output (d).

Then the combination of the block address output from the encode circuit 28 of the subblock encoder 14 and the encoded word address from the encode circuit 22 of the main encoder 122 is sequentially output as an encoded logical address. When the final subblock 32 or the lowest priority subblock 32 is selected, further, the process concerned with the subblock encoder 14 is terminated and when the whole hit signal by the main encoder has been completed, the whole hit signal in the memory word of the whole CAM subblock is terminated to complete the match retrieval operation.

As set forth above in detail, when the match retrieval data in the CAM memory block is obtained by means of the encoder shown in FIGS. 24–27, the result of match retrieval in the first CAM subblock among the plurality of CAM subblocks constituting the CAM block, for example, a match signal (hit signal) matching the retrieval data in the plurality of CAM words is held in the holding means such as a register and the block hit signal indicating the presence of the CAM word matching the retrieval data is generated in the CAM subblock. On receiving a block hit signal, the priority subblock encoder subsequently selects the first priority CAM subblock and generates a subblock address. The hit signal (simultaneously over the whole word) in the first priority subblock thus selected is transferred to the priority encoder. Then the priority encoder encodes the hit signal in the order of predetermined priorities and outputs a word address. The priority subblock encoder selects the second priority CAM subblock during the encoding operation above and the switch control signal is detected by means of the data switch timing control circuit. Then, the hit signal data held by the holding means such as the register of the subblock are detected during the time up to the termination of encoding the flag data in the first priority subblock, for example, as soon as the encoding operation is terminated after the number of hit signals to be encoded becomes one, and the hit signal data are inputted in the data latch circuit of the priority encoder at the same time as the termination of encoring. Accordingly, the priority encoder starts encoding the hit signal data in the second priority subblock in a continuous cycle immediately after the hit signal in the first priority subblock has been encoded completely and encodes, then, outputs the word address. Then the priority encoder combines the word address output with the subblock address output and outputs a logical address.

According to the encoder of FIGS. 24–27, output signals from a CAM block constituted by a plurality of CAM subblocks can be encoded efficiently at high speed without delay (switch time) at the time of subblock-to-subblock switching and output signals from a number of CAM subblocks can thus be encoded in the continuous cycle with efficiency; with the encoder of FIGS. 24–27, moreover, the area thus occupied thereby and the power consumption can also be decreased proportionally further while buffers such as prefetch circuits can be dispensed with.

Although the encoder with the prefetch circuit, the semiconductor integrated circuits, the encoders equipped with the prefetch circuit, and the encoders equipped with the flag data sense circuit, which provide a basis for understanding an associative memory and an encoder according to the present invention are basically so configured as stated above, it is not limited to those arrangements above. More specifically, the timing control circuit is not limited to the applicable one to the encoder of a content addressable memory (CAM). Moreover, the number of hit signals to be detected is not limited to the last one and it may be greater than one. Applicable circuits may be encoders for memories such as SRAMs and DRAMs. Although the timing control circuit has a dummy circuit, the provision of the dummy circuit is not necessarily essential. Although the timing control circuit illustrated above is intended to detect the number of hit signals "1" held in the flag register 18, it may be designed to detect the number of signals "0". Although the timing control circuit detects the discharge of the signal line by the current drive means, it may conversely detect the charge up by the current drive means. In this case, the differential current detection means is intended to lower the potentials of both signal lines but detect the differential current as the potential grows.

In addition, various combinations of the semiconductor integrated circuits shown in Figs. may be employed and they may needless to say be combined into the various encoders shown in Figs.

The use of the semiconductor integrated circuit which provides a basis for understanding an associative memory and an encoder according to the present invention is not limited to the manner in which it is used as a timing control circuit for the encoder but it may be used as a sense amplifier for detecting the timing variation by detecting the differential current between the currents flowing through the signal current detection line to which at least one current drive means is connected and the reference current drive line to which the reference current drive means is connected. Moreover, the semiconductor integrated circuit may be used as a sense amplifier for reading a memory such as DRAM, SRAM and the like.

Figure 28:
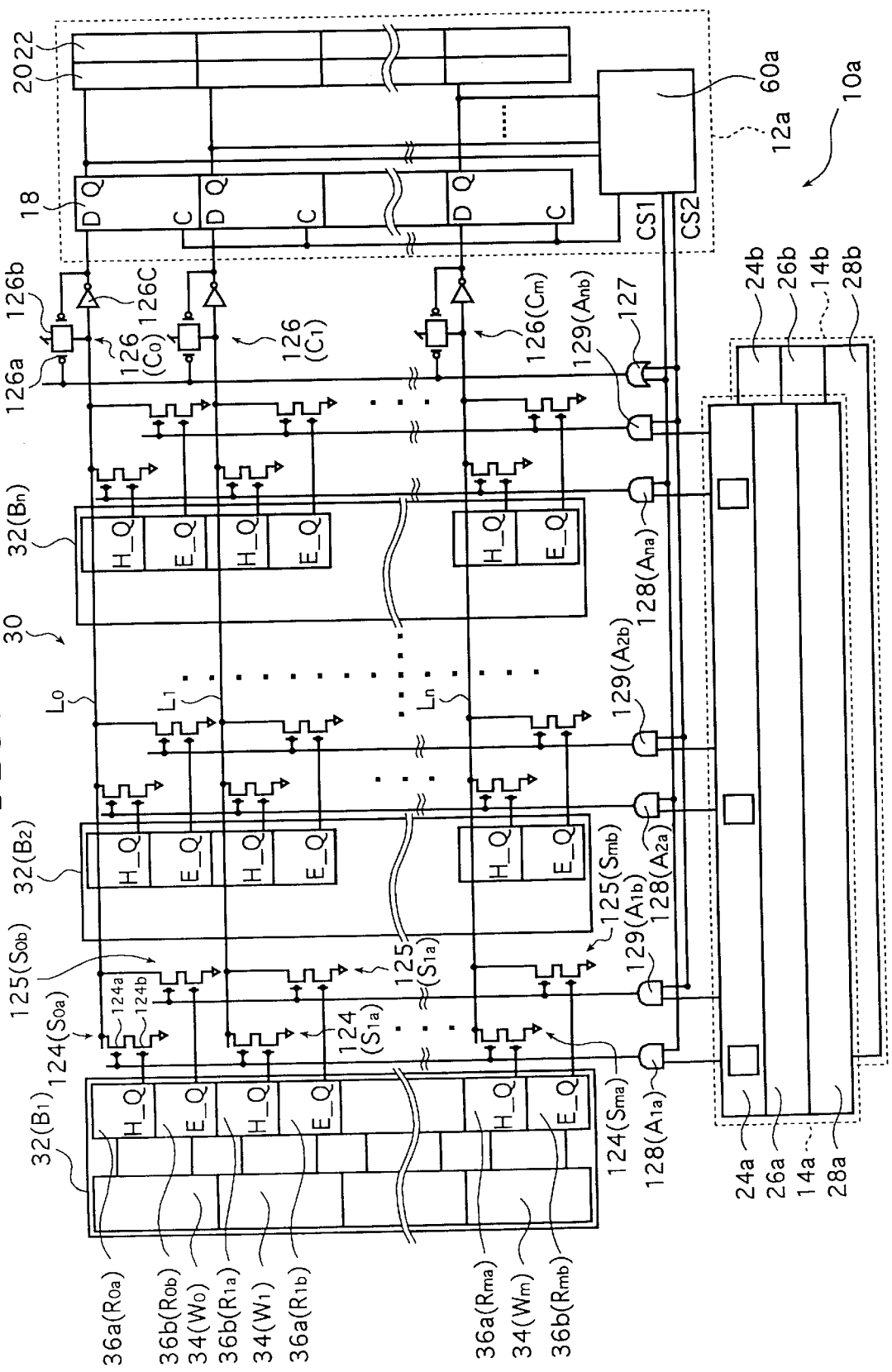
FIG. 28 is a block diagram of an encoder according to the present invention, which can be applicable to a content addressable memory.
Figure 29:
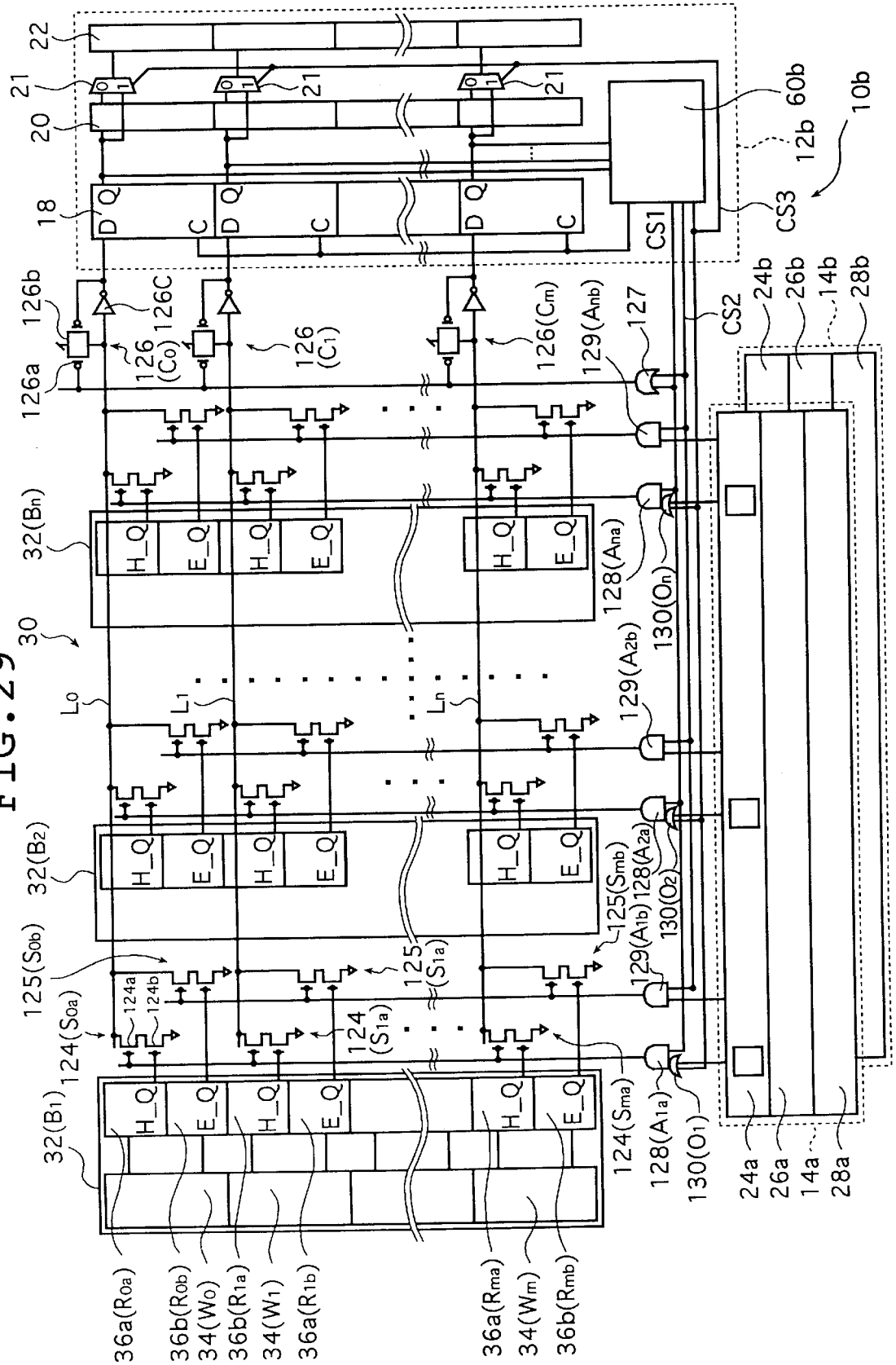
FIG. 29 is a block diagram of another encoder according to the present invention, which can be applicable to a content addressable memory.

Referring to FIGS. 28–29, there will subsequently be given a detailed description of an associative memory and an encoder which is applied to the associative memory according to the present invention with reference to an encoder and a semiconductor integrated circuit which provide a basis for the understanding of encoders according to the present invention as shown in FIGS. 1–27.

In the associative memory according to the present invention to which the encoder according to the present invention is applied, a hit flag as a result of match retrieval is stored in a register corresponding to each memory word when the match retrieval of the contents of each memory word with retrieval data is terminated. The hit flag stored in each register is held in a subencoder as a subblock hit signal of each subblock after a logical OR is computed of all the hit flags within each subblock on a subblock basis.

In the subencoder, only one subblock hit signal in an active state out of the subblock hit signals of the respective subblocks is sequentially output in the order of priorities as being in the active state and what is input to an AND circuit for selecting the hit flag of the subblock in the order of priorities and further the address of the subblock corresponding to the subblock hit signal in the active state is sequentially encoded.

In this case, an output signal of the AND circuit corresponding to only one subblock hit signal that has been output in the active state becomes active under the control of the timing control circuit of a main encoder and a switching circuit corresponding to each register of the subblock corresponding to the AND circuit is selected. Further, the hit flag corresponding to the switching circuit thus selected is supplied to a detection line and the hit flag supplied to the detection line is detected by a sense circuit and further the hit flag detected by the sense circuit is held in the main encoder by the timing control signal which is output from the timing control circuit.

In the main encoder, only one hit flag in an active state out of the hit flags thus held is sequentially output in the order of priorities as being in the active state and the address of the memory word corresponding to the hit flag in the active state is sequentially encoded.

Thus, the address of the subblock is combined with that of the memory word and the address of the memory word corresponding to the hit flag is sequentially output in the encoder according to the present invention.

In the associative memory according to the present invention to which the encoder according to the present invention is applied, the register for storing an empty flag indicating whether or not the contents of each memory word are valid as objects for match retrieval is provided as what corresponds to each memory word and as in the case where the address of the memory word corresponding to the hit flag is output, the address of the memory word corresponding to the empty flag can sequentially be output.

With the associative memory and the encoder applied to this associative memory according to the present invention, since the address of the invalid memory word corresponding to the empty flag can sequentially be output in the order of priorities, such an invalid memory word is readily controllable. Moreover, since the detection line to which the hit flag and the empty flag are output is put for common use in the associative memory and the encoder applied thereto according to the present invention, a layout area of the associative memory is reduced, so that a high-density associative memory will be able to compose.

In the associative memory and the encoder applied thereto according to the present invention, internal processing to be performed in the main priority circuit of the main encoder and the subpriority circuit of the subencoder can be omitted under such limited (use) conditions as the state of only the hit flag corresponding to only one memory word becomes active as a result of match retrieval, so that the speed of encoding the address of the memory word corresponding to the hit flag is made increasable.

A detailed description will subsequently be given of the associative memory and the encoder applied thereto according to the present invention on the basis of the preferred embodiment of the present invention with reference to the accompanying drawing.

FIG. 28 is a schematic diagram of an embodiment of an associative memory according to the present invention to which an encoder according to the present invention is applied.

As shown in FIG. 28, an associative memory block (hereinafter called the "memory block") 30 has a plurality of associative memory subblocks (hereinafter called the "subblock") 32 ($B_1, B_2, \ldots, B_n$). Further each subblock 32 has a plurality of associative memory words (hereinafter called the "memory word") 34 ($W_{0a}, W_{1a}, \ldots, W_{ma}$) a plurality of registers 36a ($R_{0a}, R_{1a}, \ldots, R_{ma}$) for holding the hit flag of each memory word 34 on a memory word 34 basis and a plurality of registers 36b ($R_{0b}, R_{1b}, \ldots, R_{mb}$) for holding the empty flag of each memory word 34 on a memory word 34 basis.

In this case, the hit flag is used for indicating the result of match retrieval of the contents of each memory word 34 and retrieval data, and the result is held in the register 36a corresponding to each memory word 34 after the match retrieval. Incidentally, it is assumed that the hit flag according to this embodiment becomes '1' (an active state) when a matching is established, for example, and '0' (an inactive state) when it is not.

Further, the empty flag indicates that whether the contents of the memory word 34 are valid as objects for retrieval or invalid as those therefor. For example, when the contents of the memory word 34 are erased or when new data is written to the memory word 34, the empty flag is held in the register 36b corresponding to each memory word 34. In this embodiment, it is also assumed that the empty flag becomes '0' (inactive state) when valid data is held in the memory word 34, for example, and '1' (an active state) when it is not, that is, the contents of the memory word 34 are erased.

Each of the subblocks 32 has, though not shown, an OR circuit for computing a logical OR of the hit flags of all the memory words 34 in each subblock 32 and outputting the result as a subblock hit signal, and an OR circuit for computing a logical OR of the empty flags of all the memory words 34 in each subblock 32 and outputting the result as a subblock empty signal. The subblock hit signal and the subblock empty signal as the outputs of these OR circuits will be held in the data latch circuits of two subencoders which will be described later respectively.

The memory block 30 is basically arranged as described above.

Subsequently, an encoder 10a has a main priority encoder (hereinafter called the "main encoder") 12a for encoding the addresses of the memory words 34, two subpriority encoders (hereinafter called the "subencoder") 14a, 14b for encoding the addresses of subblocks 32, and, switching circuits 124 ($S_{1a}, S_{2a}, \ldots, S_{na}$), 125 ($S_{1b}, S_{2b}, \ldots, S_{nb}$) for selectively outputting the hit flag or empty flag (hereinafter collectively called the "flag data") of the subblock 32 in the highest priority order, sense circuits 126 ($C_0, C_1, \ldots, C_m$), an OR circuit 127 and AND circuits (selection circuit) 128 ($A_{1a}, A_{2a}, \ldots, A_{na}$), 129 ($A_{1b}, A_{2b}, \ldots, A_{nb}$).

In the encoder 10a, the main encoder 12a has flag register circuit 18, main priority circuit 20, main encoding circuit 22 and a timing control circuit 60a.

The flag register circuit 18 holds (m+1) of flag data that are output from the subblock 32 in the highest priority order. Out of the flag data held in the flag register circuit 18, the address of the memory word 34 corresponding to the flag data in the active state is sequentially encoded. The flag data that has already been encoded is reset to the inactive state and after the address of the memory word 34 corresponding to the whole flag data in the active state is encoded, (m+1) of flag data in the subblock 32 in the next priority order are held in the flag register circuit 18. The flag register circuit 18 may be any one of those which can temporarily hold (m+1) of 1-bit data and bit by bit reset them; for example, latches, registers or the like are usable.

The main priority circuit 20 receives the (m+1) of flag data held in the flag register circuit 18 and outputs, for example, only the active-state flag data in the highest priority order as being in the active state. After outputting the active-state flag data in the highest priority order as being in the active state, the main priority circuit 20 resets to the inactive state the flag data in the flag register circuit 18 that has been output as being in the active state. In the same way, the whole active-state flag data held in the flag register circuit 18 is sequentially output by situating only one flag data being in the active state. The main priority circuit 20 may be, as shown in FIG. 2, for example, arranged so that priority circuit elements are disposed in a row or otherwise arranged so that unit circuits are disposed in a hierarchy as shown in FIGS. 5–7.

The main encoding circuit 22 is used to encode, for example, the address of the memory word 34 corresponding to only one active-state flag data in the highest priority order out of the flag data that is output from the main priority circuit 20 as shown in FIG. 2. The main encoding circuit 22 is not restricted to the type mentioned above but may be any one of those heretofore known as long as the latter is capable of encoding the address of the memory word 34 corresponding to only one active-state flag data in the highest priority order.

The timing control circuit 60a detects the number of active-state flag data that have not been encoded yet out of those held in the flag register circuit 18; for example, there is only one last active-state flag data that has not been encoded yet. Then the timing control circuit 60a outputs output signals CS1, CS2 and a timing control signal and makes the flag register circuit 18 hold (m+1) of flag data in the subblock in the next priority order. In this case, the timing control circuit 60a may be what is arranged as shown in FIGS. 10, 12, 15, 16, 18, 19, 20, 21, 23 or 26 by way of example.

In the main encoder 12a, only the active-state flag data in the highest priority order, for example, out of the (m+1) of flag data held in the flag register circuit 18 is made active and output by the main priority circuit 20. Further, the address of the memory word 34 corresponding to only one active-state flag data in the highest priority order is encoded in the main encoding circuit 22. The active-state flag data in the highest priority order that has thus been encoded is reset to the inactive state by the main priority circuit 20 and active-state flag data in the next priority order is made active-state flag data in the highest priority order. In this way, the address of memory word corresponding to (m+1) of active-state flag data held in the flag register circuit 18 is sequentially encoded. When one last active-state flag data that has not been encoded yet out of the (m+1) of flag data held in the flag register circuit 18 is detected, the output signals CS1, CS2 and the timing control signal are output and (m+1) of flag data in the subblock 32 in the next priority order are held in the flag register circuit 18, which operation as described above is repeated hereafter likewise.

The main encoder 12a is basically like what has been described above.

Further, the subencoder 14a is used for encoding the address of the subblock 32 corresponding to a hit flag and provided with a data latch circuit 24a, a subpriority circuit 26a and subencoding circuit 28a. Similarly, the subencoder 14b is used for encoding the address of the subblock 32 corresponding to an empty flag and provided with a data latch circuit 24b, a subpriority circuit 26b and a subencoding circuit 28b. Since the subencoder 14a is similar in arrangement and function to the subencoder 14b except for the difference in the subblock signal held thereby, a description will be given of the subencoder 14a as a representative example unless any reference is made otherwise.

First, the data latch circuit 24a holds n of subblock hit signals in total that are output from each subblock 32.

In this case, the subblock hit signal indicates whether or not the memory word 34 stored with contents matching with retrieval data exists among the memory words 34 in each subblock 32 as a result of match retrieval of the retrieval data and the contents of each memory word 34 in each subblock 32. According to this embodiment of the present invention, it is assumed that the subblock hit signal becomes '1' (an active state) when the memory word 34 stored with contents matching with retrieval data exists in the subblock 32, for example, and '0' (an inactive state) when it does not. The subblock hit signal is generated when a logical OR is computed of the hit flags of all the memory words 34 of each subblock 32 by an OR circuit (not shown) in each subblock 32.

The address of the subblock 32 corresponding to the subblock hit signal in the active state out of the subblock hit signals held in the data latch circuit 24a is sequentially encoded. The address of the subblock 32 corresponding to the subblock hit signal in the active state out of the subblock hit signals held in the data latch circuit 24a is sequentially encoded and the subblock hit signal that has already been encoded is reset to the inactive state.

Further, the data latch circuit 24b holds n of subblock empty signals in total that are output from each subblock 32.

In this case, the subblock empty signal indicates whether or not an invalid memory word 34 not as an object of retrieval exists among the memory words 34 in each subblock 32. According to this embodiment of the present invention, it is assumed that subblock empty signal becomes '1' (an active state) when the invalid memory word 34 not as an object for retrieval exists in the subblock 32, for example, and '0' (an inactive state) when it does not. The subblock empty signal is generated when a logical OR is computed of the empty flags of all the memory words 34 of each subblock 32 by an OR circuit (not shown) in each subblock 32.

The address of the subblock 32 corresponding to the subblock empty signal in the active state out of the subblock empty signals held in the data latch circuit 24b is sequentially encoded. The address of the subblock 32 corresponding to the subblock empty signal in the active state out of the subblock empty signals held in the data latch circuit 24b is sequentially encoded and the subblock empty signal that has already been encoded is reset to the inactive state.

Each of the data latch circuits 24a, 24b may be any one of those which can temporarily hold n of 1-bit data and bit by bit reset the data; for example, latches, registers or the like are usable.

Since the subpriority circuits 26a, 26b and the encoding circuits 28a, 28b are basically similar in arrangement and function to the main priority circuit 20 and the main encoding circuit 22 of the main encoder 12a except that the number of units constituting each of them differs from (m+1) but is n, the detailed description of them will be omitted.

In the subencoder 14a, only the active-state subblock hit signal in the highest priority order, for example, out of n of subblock hit signals held in the data latch circuit 24a is output by the subpriority circuit 26a as being in the active state and the address of the subblock 32 corresponding to only one active-state subblock hit signal in the highest priority order is encoded in the subencoding circuit 28a. The active-state subblock hit signal in the highest priority order that has been encoded is reset by the subpriority circuit 26a to the inactive state and the active-state subblock signal in the next priority order is made an active-state subblock signal in the highest priority order. In this way, the address of the subblock 32 corresponding to n of active-state subblock hit signals held in the data latch circuit 24a is sequentially encoded likewise.

The subencoders 14a, 14b are basically as described above.

Subsequently, a description will be given of the switching circuits 124, 125, the sense circuit 126, the OR circuit 127 and the AND circuits 128, 129 for selectively outputting the flag data in the subblock 32 in the highest priority order as those which most feature the present invention.

First, the switching circuit 124 is used for sending (m+1) of hit flags that are output from each register 36a of the subblock 32 in the highest priority order to a detection line L corresponding to the memory word 34 out of the detection lines L ($L_0, L_1, \ldots, L_m$) commonly installed for the same memory word 34 of each subblock 32. Each of the switching circuits 124 is installed so as to one-to-one correspond to each register 36b of each subblock 32 and has two N-type MOS transistors (hereinafter called the "NMOS") 124a, 124b connected in series. The hit flag as an output of the register 36a is input to the gate of the NMOS 124b and the source of the NMOS 124b is grounded. Further, the output signal of the AND circuit 128 is input to the gate of the NMOS 124a and the drain of the NMOS 124a is connected to the detection line corresponding to each memory word 34.

Both the NMOSs 124a, 124b of the switching circuit 124 are turned on when the hit flag is '1' and besides the output signal of the AND circuit is '1'. The charge precharged on the detection line L is discharged via the (m+1) of NMOSs 124a, 124b of switching circuits 124 with the output signal of the AND circuit being input to the gate of the NMOS 124a. On the other hand, the level of the detection line L remains precharged because at least one of the NMOSs 124a, 124b is turned off when at least the hit flag or the output signal of the AND circuit 128 is '0'. In other words, the detection line L has the inverted level of the hit flag that is input to the (m+1) of switching circuits 124 because of the (m+1) of switching circuits 124 selected by the AND circuit 128 whose output signal is '1'.

Further, the switching circuit 125 is used for sending (m+1) of empty flags that are output from each register 36a of the subblock 32 in the highest priority order to the detection line L corresponding to the memory word 34. Since the switching circuit 125 is similar in arrangement and function to the switching circuit 124, the detailed description thereof will be omitted.

Subsequently, the sense circuit 126 is used for detecting the level of the hit flag sent by the switching circuit 124 to the detection line L or the empty flag that is sent by the switching circuit 125 to the detection line L. Each of the sense circuits 126 is installed so as to one-to-one correspond to the detection line L and provided with two P-type MOS transistors (hereinafter called the "PMOS") 126a, 126b connected in parallel between a power supply and the detection line L and an inverter 126c. Further, the output signal of the OR circuit 127 is input to the gate of the PMOS 126a and the output signal of the inverter 126c is input to the gate of the PMOS 126b. Further, the detection line L is input to the inverter 126c and the output of the inverter 126c is input to the flag register circuit 18 of the main encoder 12a.

When the output signal of the OR circuit 127 is '0', the PMOS 126a of the sense circuit 126 is turned ON and all the detection lines L are precharged via the PMOS 126a. The level of the detection line L is inverted by the inverter 126c. When the output signal of the inverter 126c becomes '0', the PMOS 126b is turned on and the level of the detection line L is charged up via the PMOS 126b and besides held at '1' even after the output signal of the OR circuit 127 becomes '1'. When the detection line L is discharged by either switching circuit 124 or 125 after the output signal of the OR circuit 127 becomes '1', the output signal of the inverter 126c becomes '1' and the PMOS 126b is turned off and the charging up of the detection line L is stopped. Therefore, the charge precharged on the detection line L is discharged via either switching circuit 124 or 125 and the output signal of the inverter 126c becomes '1'. When the detection line L remains precharged without being discharged, the output signal of the inverter 126c holds the state of '0'. In other words, the output signal of the inverter 126c as the output signal of the sense circuit 126 becomes equal in level to the flag data that is input to (m+1) of switching circuits 124 or 125 selected by the AND circuit 128 whose output signal is '1'.

The OR circuit 127 is used for computing a logical OR of the output signals CS1, CS2 of the timing control circuit 60a of the main encoder 12a. The output signal of the OR circuit 127 becomes '0' when both of the output signals CS1, CS2 of the timing control circuit 60a are '0', whereby on/off of the whole PMOSs 126 of the sense circuit 126 are controlled.

The AND circuit 128 is used for computing a logical AND of the output signal CS1 of the timing control circuit 60a of the main encoder 12a and the output signal of the subpriority circuit 26a of the subencoder 14a and provided one-to-one for each subblock 32. The output signal of the AND circuit 128 becomes '1' when the output signal of the AND circuit 128 is '1' and when the output signal of the subpriority circuit 26a is also '1', so that (m+1) of switching circuits 124 corresponding to '1' are selected.

The AND circuit 129 is used for computing a logical AND of the output signal CS2 of the timing control circuit 60a of the main encoder 12a and the output signal of the subpriority circuit 26b of the subencoder 14b. Since the AND circuit 129 is similar in arrangement and function to the AND circuit 128, the detailed description thereof will be omitted.

The operation of the associative memory and the encoder applied thereto according to the present invention will subsequently be described.

When the match retrieval of the retrieval data and the contents of each memory word 34 of each subblock 32 is terminated, the hit flag is stored in each register 36a corresponding to each memory word 34. With respect to the hit flags thus stored in the register 36a, a logical OR is computed of those corresponding to the whole memory word 34 on a subblock 32 basis by an OR circuit (not shown) in each subblock 32 and held in the data latch circuit 24a of the subencoder 14a as n of subblock hit signals in total to be output from each subblock 32.

In the subencoder 14a, only one subblock hit signal with '1' as in the active state out of n of subblock hit signals held in the data latch circuit 24a is sequentially output according to the priority order and is input to the AND circuit 128, and the address of the subblock 32 corresponding to the subblock hit signal in the active state is sequentially encoded.

Then the output signal CS1 of the timing control circuit 60a of the main encoder 12a becomes '1' and only one output signal of the AND circuit 128 corresponding to the subblock hit signal that has been output as being in the active state also becomes '1', so that (m+1) of switching circuits 124 of the subblock 32 corresponding to the AND circuit 128 are selected. The inverted level of the hit flag is sent by the switching circuit 124 thus selected to the detection line L, which is inverted by the sense circuit 126 and set equal in level to the hit flag. Then (m+1) of hit flags on the detection line L are stored in the flag register circuit 18 of the main encoder 12a by the timing control signal that is output from the timing control circuit 60a.

In the main encoder 12a, only one hit flag with '1' as in the active state is sequentially output according to the priority order and the address of the memory word 34 corresponding to the hit flag in the active state is sequentially encoded.

In the associative memory and the encoder applied thereto according to the present invention, the address of the subblock 32 that is output from the subencoder 14a is combined with the address of the memory word 34 that is output from the main encoder 12a and this combination is sequentially output as the address of the memory word corresponding to each hit flag.

The associative memory and the encoder applied thereto according to the present invention operate basically as described above.

Although a description has been given of the case where the address of the memory word 34 corresponding to the hit flag is output by reference to the above-described embodiment of the present invention, the operation of updating the contents of the memory word 34 is frequently performed in order to improve the use efficiency of the memory word 34 as much as possible in a system using the associative memory through the steps of holding the contents of the plurality of memory words 34 matching with the retrieval data as a result of match retrieval, erasing the contents of the memory word 34 that fails to match therewith and further sequentially writing new data to the erased space of the memory word 34.

However, the problem is that, as described in the column of the background of the present invention, it is hardly easy to manage the address of the invalid memory word 34 whose contents have been erased because the address of a memory word 34 whose contents are to be erased occurs at random.

In order to solve the problem above, in the associative memory and the encoder applied thereto according to the present invention, there is provided the register 36b for storing the empty flag having entirely the same configuration as the register 36a for storing the hit flag. This is advantageous in that the invalid memory word 34 is readily controllable since the address of the invalid memory word 34 corresponding to the empty flag is sequentially output according to the priority order as in the case where the address of the memory word 34 corresponding to the hit flag is output. In this case, the output signals CS1 and CS2 of the timing control circuit 60a are used to determined whether the address corresponding to the hit flag or the empty flag is encoded. In other words, the address corresponding to the hit flag is encoded by means of the output signal CS1, whereas the address corresponding to the empty flag is encoded by means of the output signal CS2.

Generally, the time when the address of the memory word 34 stored with data matching with retrieval data as a result of match retrieval has to be output often differs from the time when the address of the invalid memory word 34 has to be output so as to write new data. On this basis, in the associative memory and the encoder applied thereto according to the present invention, the hit flag shares the detection line L with the empty flag as an output end, whereby the layout area of the associative memory is curtailed with the favorable effect of making it possible to build up a high-density associative memory.

With respect to the encoding of the address corresponding to the hit flag, there is a growing demand for outputting speed to be increased. In order to deal with this problem, the main priority circuit 20 and the subpriority circuit 26a can be dispensed with under the limited condition (use condition) that the hit flag corresponding to only one memory word 34 is allowed to become active as a result of, for example, match retrieval and it can be anticipated to improve the operating speed up to about twice as high as before by stopping the main priority circuit 20 and the subpriority circuit 26a from functioning when the address corresponding to the hit flag is encoded.

FIG. 29 shows a schematic diagram of another embodiment of the encoder so adapted that its operating speed is increased under the restriction of making only one hit flag corresponding to only one memory word becomes active. An encoder 10b as shown in FIG. 29 by way of example is similar to the encoder 10a shown in FIG. 28 in comparison except for the following points: a main encoder 12b has a selection circuit 21; a timing control circuit 60b outputs a output signal CS3; and an OR circuit 130 is installed between an subencoder 14a and an AND circuit 128. In consequence, like reference characters are given to the same component elements excluding the above-described three points and the detailed description thereof will be omitted.

More specifically, the encoder 10b has the main encoder 12b, the subencoders 14a, 14b, the switching circuits 124, 125, the sense circuits 126, the OR circuit 127 and the AND circuit 128, and, the OR circuits ($O_1, O_2, \ldots, O_n$).

In the encoder 10b, the main encoder 12b has the flag register circuit 18, the main priority circuit 20, the selection circuit 21, the main encoding circuit 22 and the timing control circuit 60b.

In this case, the selection circuit 21 selectively outputs any one of the flag data: the flag data held in the flag register circuit 18 or the flag data that is output from the main priority circuit 20 under the control of the output signal CS3 of the timing control circuit 60b. With reference to FIG. 29, the selection circuit 21 selectively outputs the flag data that is output from the main priority circuit 20 when the output signal CS3 is '0' and the selection circuit 21 selectively outputs the flag data held in the flag register circuit 18 by bypassing the main priority circuit 20 when the output signal CS3 is '1'. In other words, the main priority circuit 20 is bypassed when the output signal CS3 of the timing control circuit 60b is '1' and the flag data held in the flag register circuit 18 is directly input to the main encoding circuit 22.

Further, the timing control circuit 60b has basically the same function as that of the timing control circuit 60a shown in FIG. 28 except that the former generates the output signal CS3.

In a network environment to which a plurality of computers are connected, for example, each of the computers is provided with its own network address, so that the individual computer is recognized uniquely. In the case of a switching hub or the like, the network address of the individual computer and the port number of the switching hub to which the computer is connected are stored in each memory word of the associative memory, for example, and the network address of a destination computer existing in the header portion of packet data that has been output from a source computer is used for match retrieval to obtain the port number of the switching hub to which the destination computer has been connected. When the network addresses will be managed, for example, a network address peculiar to each individual computer is stored in the memory word of the associative memory, whereby the use condition in which a hit flag corresponding to only one memory word becomes active is generated as a result of match retrieval.

As described above, the output signal CS3 that is output from the timing control circuit 60b is output as '1' only when an address corresponding to only one active-state hit flag is encoded under the restriction (use condition) of making the hit flag corresponding to only one memory word becomes active as a result of match retrieval, or output as '0' in any other case.

As set forth above, when the address corresponding to only one active-state hit flag will be encoded under the restriction of making only one hit flag corresponding to only one memory word becomes active as a result of match retrieval, the hit flag held in the flag register circuit 18 of the main encoder 12b is made to bypass the main priority circuit 20 and directly fed into the main encoding circuit 22 by setting to '1' the output signal CS3 that is output from the timing control circuit 60b, whereby the address of the memory word 34 corresponding to the hit flag is encoded. Therefore, a delay for the signal processing performed by the main priority circuit 20 can be removed and the speed of encoding the address corresponding to the hit flag can also be increased. In the case of an operation where the output signal CS3 is '0', it is entire the same as that of the encoding circuit 10a according to the present invention as shown in FIG. 28.

Subsequently, the OR circuit 130 computes the logical OR of the output signal CS3 of the timing control circuit 60b of the main encoder 12b and the output signal of the subpriority circuit 26a of the subencoder 14a, and the OR circuit 130 is provided for each subblock 32. The output signal of the OR circuit 130 becomes '1' when at least one of the output signal CS3 of the timing control circuit 60b and the output signal of the subpriority circuit 26a is '1'. In other words, the output signal of the OR circuit 130 can be set to '1', irrespective of the output signal of the subpriority circuit 26a, by setting the output signal CS3 of the timing control circuit 60b to '1'.

The addition of the OR circuit 130 allows the AND circuit 128 to compute the logical AND of the output signal CS1 of the timing control circuit 60b and the output signal of the OR circuit 130. When both the output signals CS1, CS3 of the timing control circuit 60b are '1', all the output signals of the AND circuit 128 become '1', irrespective of the output signal of the subpriority circuit 26a, and the whole switch circuit 124 of the whole subblock 32 is simultaneously selected. When the output signal CS3 is '0' in this case, the operation of the AND circuit 128 is entirely the same as that of the AND circuit 128 in the encoder 10a shown in FIG. 28.

As described above, when the address corresponding to only one active-state hit flag is encoded under the restriction of making only one hit flag corresponding to only one memory word becomes active as a result of match retrieval, the output signal of the subpriority circuit 26a is nullified by setting both the output signals CS1, CS3 of the timing control circuit 60b to '1', and the whole output signals of the AND signal 128 can be set to '1'. whereby only one active-state hit flag is immediately supplied to the detection line L, thus causing the address of the memory word 34 corresponding to the hit flag to be encoded. Therefore, an internal delay for the signal processing performed by the subencoder 14a can be removed and the speed of encoding the address corresponding to the hit flag can also be increased.

A brief description will subsequently be given of the operation of an encoder 10b.

In the encoder 10b, the hit flag is stored in corresponding to each memory word 34 as a result of match retrieval.

With respect to the hit flag stored in each register 36b, a logical OR of the whole hit flag is computed as the subblock hit signal of each subblock 32 on a subblock 32 basis. Since only one subblock hit signal becomes active under the restriction of making one hit flag corresponding to only one memory word becomes active as a result of match retrieval, the address of the subblock 32 corresponding to only one active-state subblock hit signal is encoded in the subencoder 14a.

On the other hand, both the output signals CS1, CS3 of the timing control circuit 60b of the main encoder 12b are set to '1' after the hit flag is stored in each register 36a, and the whole output signals of the AND circuit 128 become '1', irrespective of the output signal of the subpriority circuit 26a of the subencoder 14a, and the whole switching circuit 124 is selected simultaneously. Thus, the hit flag is immediately fed to the detection line L, irrespective of the internal operation of the subencoder 14a, and the address of the memory word 34 corresponding to only one active-state hit flag is encoded in the main encoder 12b.

The address of the subblock that is output from the subencoder 14a is combined with the address of the memory word that is output from the main encoder 12b, so that the address of the memory word corresponding to only one active-state hit flag is output from the encoding circuit 10b.

Although a description has been given of a case where the address corresponding to only one active-state hit flag is encoded under the restriction of making only one hit flag corresponding to only one memory word becomes active as a result of match retrieval by way of example, any operation other than what has been described up to the present is entirely the same as that of the encoder 10a as shown in FIG. 28 according to the present invention.

In the encoding circuit 10b according to the present invention, the speed of encoding the address of the memory word 34 corresponding to the hit flag can be increased since the internal processing in the main priority circuit 20 of the main encoder 12b and the internal processing in the subpriority circuit 26a of the subencoder 14a both can be omitted under the restriction of making one hit flag corresponding to only one memory word becomes active as a result of match retrieval. The restriction of making one hit flag corresponding to only one memory word becomes active as a result of match retrieval is, as described above, only natural in a case where, for example, an associative memory is used for managing network addresses and the like, and it is extremely desirous for any user to desire to increase the speed of encoding the address of the memory word 34 corresponding to the hit flag that the speed of encoding the address of the memory word 34 corresponding to the hit flag can be increased under such restriction.

As for encoding the address corresponding to the empty flag, however, it is impossible to omit the main priority circuit 20 and the subpriority circuit 26b because the possibility of the presence of a plurality of invalid(empty) memory words 34 within the same device of the associative memory is quite natural. Therefore, it is needless to say necessary for the encoding operation to be performed after the processing made by the main priority circuit 20 and the subpriority circuit 26b.

Although the encoder according to the present invention has been described in detail, the present invention is not limited to the above-described embodiment thereof.

For example, though the encoders 10a, 10b of FIGS. 28, 29 according to the present invention refer to the case where the present invention has been applied to the encoder 120 shown in FIG. 24, the present invention is needless to say applicable to the encoders 10, 11 shown in FIG. 1 and FIG. 8.

According to the above-described embodiment of the invention, the output signal CS3 is used to switch the control from one case where only one memory word is hit to another where the plurality of memory words are hit when the hit flag of the memory word is encoded. In other words, there is provided the subpriority circuit 26a in the subencoder 14a so as to encode the hit flag by supporting both the functions; however, the present invention is not limited to the example mentioned above but may be limited to a case where only one hit flag is always made active, whereby a semiconductor chip offering excellent area efficiency can be designed because the subpriority circuit 26a can be dispensed with.

Although a description has been given of an example in which the address of the subblock 32 corresponding to the subblock hit signal is encoded by means of the subencoder 14a and the address of the subblock 32 corresponding to the subblock empty signal is encoded by means of the subencoder 14b in the encoders 10a, 10b as shown in FIGS. 28, 29 according to the present invention, the present invention is not limited to that example but may be applied to a case where the address of the subblock 32 corresponding to either subblock hit signal or subblock empty signal is selectively encoded, for example, by putting one common subencoder, or by putting one common data latch circuit or one common subencoding circuit with the subblock hit signal and the subblock empty signal in the subencoders 14a, 14b.

In the case of a use in which only one hit flag is made active at all times, a special main encoder for an empty flag and a special main encoder for a hit flag may be separately provided by omitting the selection circuit 21 for the purpose of higher-speed encoding. In this case, the main priority circuit 20 is not needed in the special main encoder for the hit flag where only one hit flag is always made active.

Although a description has been given of the case where the address of the memory word corresponding to the hit flag in the active state is encoded in the above-described embodiment of the present invention, moreover, the present invention is not limited to the aforementioned case but may be applied to a case where, for example, the address of a memory word corresponding to a non-active hit flag is encoded and similarly where the addresses of memory words corresponding to empty flags in an active and an inactive state are encoded likewise.

Although a description has also been given of the case where two of the registers 36a, 36b for holding flag data are provided by way of example according to the above-described embodiment of the present invention, the present invention is not limited to the embodiment thereof but may be applicable to a case where, for example, unless it is needed to encode and output the address of the memory word 34 corresponding to the hit flag, the register 36a for holding the hit flag is not necessarily provided but only the register 36b for holding the empty flag may be provided, whereby the layout area of the associative memory becomes further reducible.

In the associative memory to which the encoder according to the present invention is applied, the circuit arrangement may be static in that it has the register 36a for holding the hit flag and the register 36b for holding the empty flag or otherwise what may be dynamic without having the registers 36a, 36b.

In other words, the present invention may be modified in various manners without departing from the scope and spirit thereof by altering the number of inputs and arrangements of prefetch circuits, data latch circuits, priority circuits and encoding circuits constituting the main encoder and the subencoder as well as replacing the circuit elements employed herein with many other ones in different combination; for example, by introducing Pch-MOS transistors, Nch-MOS transistors and so forth, and by providing a nullifying bit flag circuit corresponding to, for example, the flag register circuit instead of not resetting the flag data completely encoded in the priority circuit to make it inactive but setting the bits of the nullifying bit flag circuit corresponding to the flag data completely encoded in the priority circuit so as to make inactive the flag data completely encoded in the priority circuit.

What is claimed is:

1. An associative memory having a plurality of associative memory subblocks, wherein each of the associative memory subblock comprises:

a plurality of memory words, a first-register coupled to the memory words for holding hit flags resulting from a match retrieval of retrieval data and contents of the memory words, each of the hit flags corresponding to one of the memory words, and a second register coupled to the memory words for holding empty flags indicating whether or not the contents of the memory words may be objects for the match retrieval, each of the empty flags corresponding to one of the memory words.

2. An encoder coupled to the associative memory as claimed in claim 1, comprising:

a subpriority encoder for determining a subblock priority order of an associative memory subblock corresponding to a subblock hit signal which is a logical OR of all the hit flags in the associative memory subblock or a subblock empty signal which is a logical OR of all the empty flags in the associative memory subblock;

a first selection circuit for selecting the associative memory subblock corresponding to the subblock hit signal or the subblock empty signal according to the subblock priority order determined by the subpriority encoder;

a switching circuit for supplying selected hit flags or selected empty flags that are output from the associative memory subblock selected by the first selection circuit to detection lines, the switching circuit supplying a corresponding hit flag of the selected hit flags or a corresponding empty flag of the selected empty flags to a corresponding detection line of the detection lines;

a sense circuit for detecting the selected hit flags or the selected empty flags supplied to the detection lines; and a main priority encoder for sequentially encoding addresses of memory words corresponding to the selected hit flags or the selected empty flags detected by the sense circuit according to a priority order.

3. An encoder as claimed in claim 2, wherein the corresponding hit flag and the corresponding empty flag share the corresponding detection line with each other for common use.

4. An encoder as claimed in claim 2, the main priority encoder comprising:
   a flag register circuit for holding the hit flags or the empty flags that have been detected by the sense circuit;
   a main priority circuit for sequentially making active the hit or the empty flags according to the priority order of the hit or the empty flags in the flag register circuit, and sequentially outputting active-state hit flags or active-state empty flags;
   a main encoding circuit for sequentially encoding addresses of memory words corresponding to the active-state hit or the active-state empty flags sequentially output from the main priority circuit;
   reset means for sequentially resetting in the flag register circuit a hit flag or an empty flag after encoding of an address of a memory word corresponding to the hit flag or the empty flag held in the flag register circuit is terminated; and
   timing control means for determining beforehand a timing for completing an encoding of addresses of memory words corresponding to hit flags or empty flags of an associative memory subblock of a current subblock priority held in the flag register circuit and making the flag register circuit hold hit flags or empty flags of a next subblock priority in the subblock priority order which is detected by the sense circuit.

5. An encoder as claimed in claim 4, the main priority encoder further comprising:
   a second selection circuit for selectively supplying either one of the hit flags held in the flag register circuit or a hit flag that is output from the main priority circuit to the main encoding circuit, wherein
   one of the hit flags is directly input from the flag register circuit to the main encoding circuit not via the main priority circuit and encoded therein; and the empty flags are input from the flag register circuit via the main priority circuit to the main encoding circuit and encoded therein.

6. An encoder as claimed in claim 5, the main priority encoder further comprising:
   selection means for determining an encoding of the hit flag by directly inputting one of the hit flags from the flag register circuit not via the main priority circuit to the main encoding circuit or encoding the hit flag by inputting the hit flag from the flag register circuit via the main priority circuit to the main encoding circuit.

7. An encoder as claimed in claim 2, the subpriority encoder comprising:
   a data latch circuit for holding subblock hit signals or subblock empty signals that are output from associative memory subblocks;
   a subpriority circuit for making only one of the subblock hit signals or one of the subblock empty signals active according to the subblock priority order out of the subblock hit signals or the subblock empty signals held in the data latch circuit and outputting an active-state subblock hit signal or an active-state subblock empty signal; and
   a subencoding circuit for sequentially encoding an address of an associative memory subblock corresponding to the active-state subblock hit signal or the active-state subblock empty signal sequentially output from the subpriority circuit.

8. An encoder as claimed in claim 2, the subpriority encoder comprising:
   a data latch circuit for holding one of the active-state subblock hit signals that is output from the associative memory subblocks; and
   a subencoding circuit for encoding an address of an associative memory subblock corresponding to the one of the active-state subblock hit signals that is output from the data latch circuit.

9. An associative memory as claimed in claim 1, further comprising:
   a plurality of detection lines, each of the detection lines being provided for one memory word of the memory words of each of the associative memory subblocks, wherein either a hit flag corresponding to the memory word or an empty flag corresponding to the memory word is commonly supplied to one of the detection lines; and
   a switching circuit for supplying to each of the detection lines either the hit flag or the empty flag corresponding to the memory word.

10. An encoder coupled to the associative memory as claimed in claim 1, comprising:
    a subpriority encoder for determining a subblock priority order of an associative memory subblock corresponding to a subblock hit signal which is a logical OR of all the hit flags in each associative memory subblock or a subblock empty signal which is a logical OR of all the empty flags in each associative memory subblock;
    a selection circuit for selecting the associative memory subblock corresponding to the subblock hit signal or the subblock empty signal according to the subblock priority order determined by the subpriority encoder;
    a switching circuit for supplying selected hit flags or selected empty flags that are output from the associative memory subblock selected by the selection circuit to detection lines, the switching circuit supplying a corresponding, hit flag of the selected hit flags or a corresponding empty flag of the selected empty flags to a corresponding detection line of the detection lines; and
    a main priority encoder for sequentially encoding addresses of memory words corresponding to the selected hit flags or the selected empty flags supplied onto the detection lines according to a priority order.

11. An encoder as claimed in claim 10, wherein the corresponding hit flag and the corresponding empty flag share the corresponding detection line with each other for common use.

12. An encoder as claimed in claim 10, the subpriority encoder comprising:
    a data latch circuit for holding subblock hit signals or subblock empty signals that are output from associative memory subblocks;
    a subpriority circuit for making one of the subblock hit signals or one of the subblock empty signals active according to the subblock priority order out of the subblock hit signals or the subblock empty signals held in the data latch circuit and outputting an active-state subblock hit signal or an active-state subblock empty signal; and a subencoding circuit for sequentially encoding an address of an associative memory subblock corresponding to the active-state subblock hit signal or the active-state subblock empty signal sequentially output from the subpriority circuit.

13. An encoder as claimed in claim 10, the subpriority encoder comprising:

a data latch circuit for holding one of the subblock hit signals that is output from a corresponding associative memory subblock; and a subencoding circuit for encoding an address of the corresponding associative memory subblock.

14. An encoder coupled to the associative memory as claimed in claim 1, comprising:

a sub encoder for selecting an associative memory subblock of the plurality of associative memory subblocks and for encoding an address of the associative memory subblock corresponding to either a subblock hit signal which is a logical OR of all the hit flags in each of the associative memory subblocks or a subblock empty signal which is a logical OR of all the empty flags in each of the associative memory subblocks;

a switching circuit for supplying either a hit flag or an empty flag, which is output to a corresponding detection line from the associative memory subblock selected by the sub encoder; and a main encoder for encoding an address of a memory word that corresponds to either the hit flag or the empty flag which is output to the corresponding detection line.

15. An encoder as claimed in claim 14, wherein the main encoder encodes an address of a memory word corresponding to one active-state hit flag, selects one of active-state empty flags according to a priority order, and encodes an address of a memory word corresponding to the selected one of the active-state empty flags sequentially.

16. An encoder as claimed in claim 14, wherein the main encoder has a priority circuit which selects one of active-state empty flags according to a priority order, and outputs the selected one of the active-state empty flags sequentially.

17. An associative memory having a plurality of associative memory subblocks, wherein each of the associative memory subblock comprises:

a plurality of memory words; and a register coupled to the memory words for holding empty flags indicating whether or not contents of the memory words may be objects for match retrieval, each of the empty flags corresponding to one of the memory words.

18. An encoder coupled to the associative memory as claimed in claim 17, comprising:

a subpriority encoder for determining a subblock priority order of an associative memory subblock corresponding to a subblock empty signal which is a logical OR of all the empty flags in the associative memory subblock;

a first selection circuit for selecting the associative memory subblock corresponding to the subblock empty signal according to the subblock priority order determined by the subpriority encoder;

a switching circuit for supplying selected empty flags that are output from the associative memory subblock selected by the first selection circuit to detection lines;

a sense circuit for detecting the empty flags supplied to the detection lines; and a main priority encoder for sequentially encoding addresses of memory words corresponding to the empty flags detected by the sense circuit according to a priority order.

19. An encoder as claimed in claim 18, the main priority encoder comprising:

a flag register circuit for holding the empty flags that have been detected by the sense circuit;

a main priority circuit for sequentially making active the empty flags according to the priority order of the empty flags held in the flag register circuit and sequentially outputting active-state empty flags;

a main encoding circuit for sequentially encoding addresses of memory words corresponding to the active-state empty flags sequentially output from the main priority circuit;

reset means for sequentially resetting in the flag register circuit an empty flag after encoding of an address of a memory word corresponding to the empty flag held in the flag register circuit is terminated; and timing control means for determining beforehand a timing for completing an encoding of addresses of memory words corresponding to empty flags of an associative memory subblock of a current subblock priority held in the flag register circuit and making the flag register circuit hold empty flags of a next subblock priority which are detected by the sense circuit.

20. An encoder coupled to the associative memory as claimed in claim 17, comprising:

a subpriority encoder for determining a subblock priority order of an associative memory subblock corresponding to a subblock empty signal which is a logical OR of all the empty flags in the associative memory subblock;

a selection circuit for selecting the associative memory subblock corresponding to the subblock empty signal according to the subblock priority order determined by the subpriority encoder;

a switching circuit for supplying selected empty flags that are output from the associative memory subblock selected by the selection circuit to detection lines; and a main priority encoder for sequentially encoding addresses of memory words corresponding to the selected empty flags supplied onto the detection lines according to a priority order.

* * * * *